(12) United States Patent
Koyanagi

(10) Patent No.: US 11,145,625 B2
(45) Date of Patent: Oct. 12, 2021

(54) SEMICONDUCTOR MEMORY DEVICE

(71) Applicant: TOSHIBA MEMORY CORPORATION, Tokyo (JP)

(72) Inventor: Masaru Koyanagi, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/556,116

(22) Filed: Aug. 29, 2019

(65) Prior Publication Data
US 2019/0385984 A1 Dec. 19, 2019

Related U.S. Application Data

(63) Continuation of application No. PCT/JP2018/001639, filed on Jan. 19, 2018.

(30) Foreign Application Priority Data

Mar. 15, 2017 (JP) .............................. JP2017-049967

(51) Int. Cl.
*H01L 25/065* (2006.01)
*G11C 16/24* (2006.01)
(Continued)

(52) U.S. Cl.
CPC .......... *H01L 25/0657* (2013.01); *G11C 16/24* (2013.01); *H01L 21/76898* (2013.01);
(Continued)

(58) Field of Classification Search
CPC ........... H01L 25/0657; H01L 21/76898; H01L 21/82; H01L 23/08; H01L 23/5226;
(Continued)

(56) References Cited

U.S. PATENT DOCUMENTS 5,757,080 A 5/1998 Sota
7,259,451 B2 8/2007 Seng et al.
(Continued)

FOREIGN PATENT DOCUMENTS

JP 3129928 B2 1/2001
JP 3668165 B2 7/2005
(Continued)

OTHER PUBLICATIONS

International Search Report (ISR) dated Apr. 3, 2018 issued in International Application No. PCT/JP2018/001639.
(Continued)

*Primary Examiner* — Nathan W Ha
(74) *Attorney, Agent, or Firm* — Holtz, Holtz & Volek PC

(57) ABSTRACT

A semiconductor memory device includes a first and second substrates; and a first and second element layers respectively provided on an upper surface of the first and the second substrates. The first and second substrates respectively include a first and second vias. The first and second element layers respectively includes a first and second pads respectively electrically coupled to the first and second vias, and respectively provided on an upper surface of the first and second element layers. The upper surface of the second element layer is arranged so as to be opposed to the upper surface of the first element layer. The first and second pads are electrically coupled and symmetrically arranged with respect to a surface where the first and second element layers are opposed to each other.

22 Claims, 57 Drawing Sheets

(51) Int. Cl.

| | | |
|---|---|---|
| H01L 21/768 | (2006.01) | |
| H01L 21/82 | (2006.01) | |
| H01L 23/08 | (2006.01) | |
| H01L 23/522 | (2006.01) | |
| H01L 23/528 | (2006.01) | |
| H01L 23/00 | (2006.01) | |
| H01L 25/00 | (2006.01) | |
| H01L 27/02 | (2006.01) | |
| H01L 27/11521 | (2017.01) | |
| H01L 27/11526 | (2017.01) | |
| H01L 27/11568 | (2017.01) | |
| H01L 27/11573 | (2017.01) | |
| G11C 16/08 | (2006.01) | |
| G11C 16/10 | (2006.01) | |
| G11C 16/26 | (2006.01) | |

(52) U.S. Cl.
CPC ............ *H01L 21/82* (2013.01); *H01L 23/08* (2013.01); *H01L 23/528* (2013.01); *H01L 23/5226* (2013.01); *H01L 24/03* (2013.01); *H01L 24/16* (2013.01); *H01L 24/94* (2013.01); *H01L 25/50* (2013.01); *H01L 27/0207* (2013.01); *H01L 27/11521* (2013.01); *H01L 27/11526* (2013.01); *H01L 27/11568* (2013.01); *H01L 27/11573* (2013.01); *G11C 16/08* (2013.01); *G11C 16/10* (2013.01); *G11C 16/26* (2013.01); *H01L 2224/0557* (2013.01); *H01L 2224/08145* (2013.01); *H01L 2224/13025* (2013.01); *H01L 2224/16148* (2013.01); *H01L 2224/80001* (2013.01); *H01L 2225/06513* (2013.01); *H01L 2225/06541* (2013.01); *H01L 2225/06565* (2013.01); *H01L 2924/1431* (2013.01); *H01L 2924/14511* (2013.01)

(58) Field of Classification Search
CPC ......... H01L 24/03; H01L 24/16; H01L 24/94; H01L 25/50; H01L 27/0207
See application file for complete search history.

(56) References Cited

U.S. PATENT DOCUMENTS

| | | | |
|---|---|---|---|
| 2009/0001602 A1 | 1/2009 | Chung | |
| 2010/0059898 A1* | 3/2010 | Keeth ............... H01L 23/66 | |
| | | | 257/777 |
| 2010/0246152 A1 | 9/2010 | Lin et al. | |
| 2011/0141828 A1 | 6/2011 | Yoko | |
| 2011/0248396 A1 | 10/2011 | Liu et al. | |
| 2013/0052794 A1* | 2/2013 | Bang ................ H01L 23/481 | |
| | | | 438/424 |
| 2013/0241025 A1* | 9/2013 | Pagani .............. H05K 1/181 | |
| | | | 257/499 |
| 2014/0042298 A1 | 2/2014 | Wan et al. | |
| 2014/0062587 A1* | 3/2014 | Koyanagi ........... H01L 24/48 | |
| | | | 327/595 |
| 2015/0084689 A1* | 3/2015 | Lee .................... G11C 29/702 | |
| | | | 327/565 |
| 2015/0262877 A1 | 9/2015 | Kurita et al. | |
| 2015/0262989 A1* | 9/2015 | Kawasaki ........... H01L 24/19 | |
| | | | 257/737 |
| 2016/0155724 A1 | 6/2016 | Kim et al. | |
| 2017/0033085 A1* | 2/2017 | Shikibu ............ H01L 23/49541 | |
| 2017/0040296 A1* | 2/2017 | Das ................. H01L 23/53238 | |
| 2017/0077066 A1* | 3/2017 | Hamada ............... H03K 5/24 | |
| 2017/0092680 A1* | 3/2017 | Kwon ............... H01L 23/5226 | |
| 2017/0194273 A1* | 7/2017 | Chen ................. H01L 23/481 | |
| 2018/0053743 A1* | 2/2018 | Melville ........... H01L 25/0652 | |
| 2019/0043836 A1* | 2/2019 | Fastow ............. H01L 25/0657 | |

FOREIGN PATENT DOCUMENTS

| | | |
|---|---|---|
| JP | 2006332342 A | 12/2006 |
| JP | 2009010312 A | 1/2009 |
| JP | 2012522398 A | 9/2012 |
| JP | 2015029138 A | 2/2015 |
| JP | 2015176958 A | 10/2015 |
| JP | 2015188052 A | 10/2015 |
| JP | 2016004860 A | 1/2016 |

OTHER PUBLICATIONS

Written Opinion dated Apr. 3, 2018 issued in International Application No. PCT/JP2018/001639.

* cited by examiner

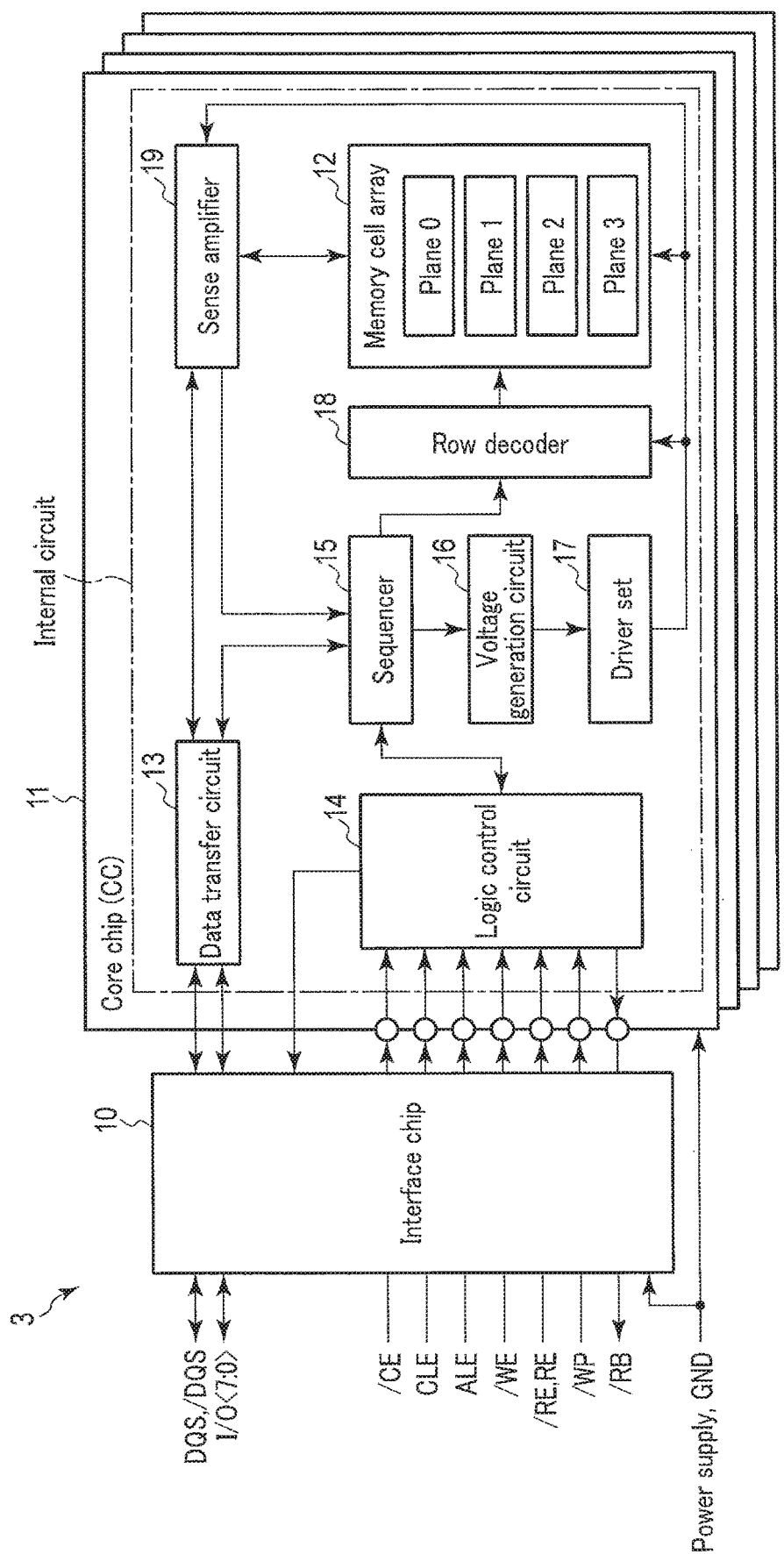
F I G. 2

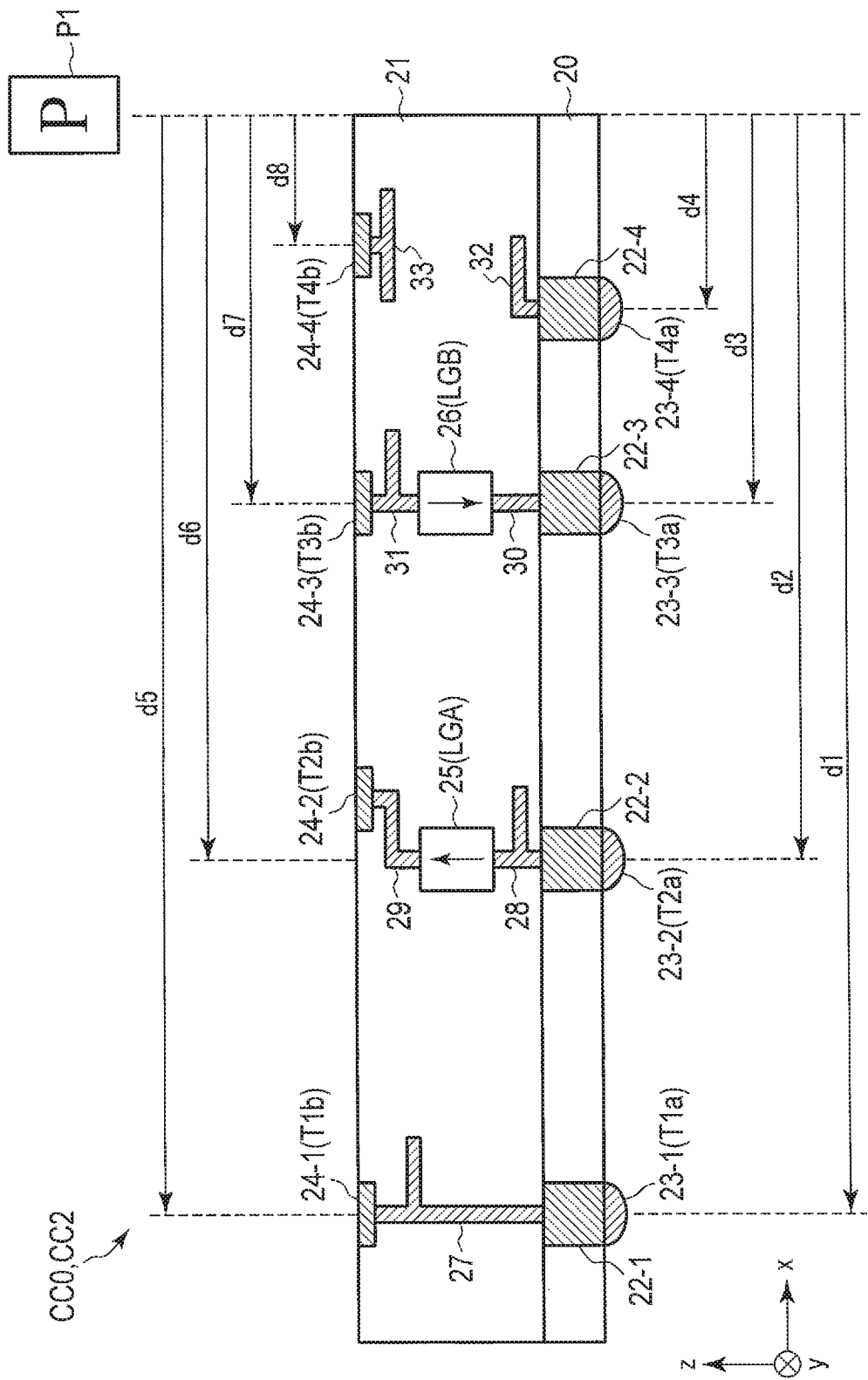
F I G. 5

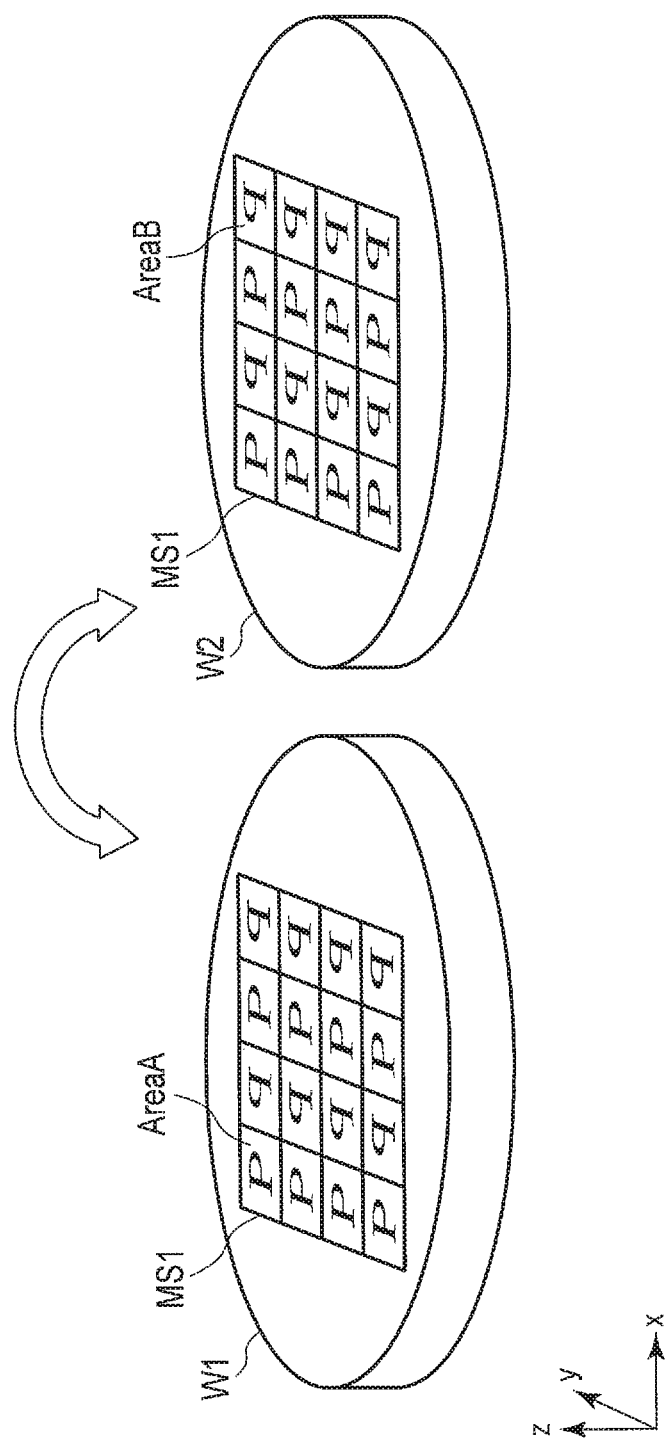
F I G. 12

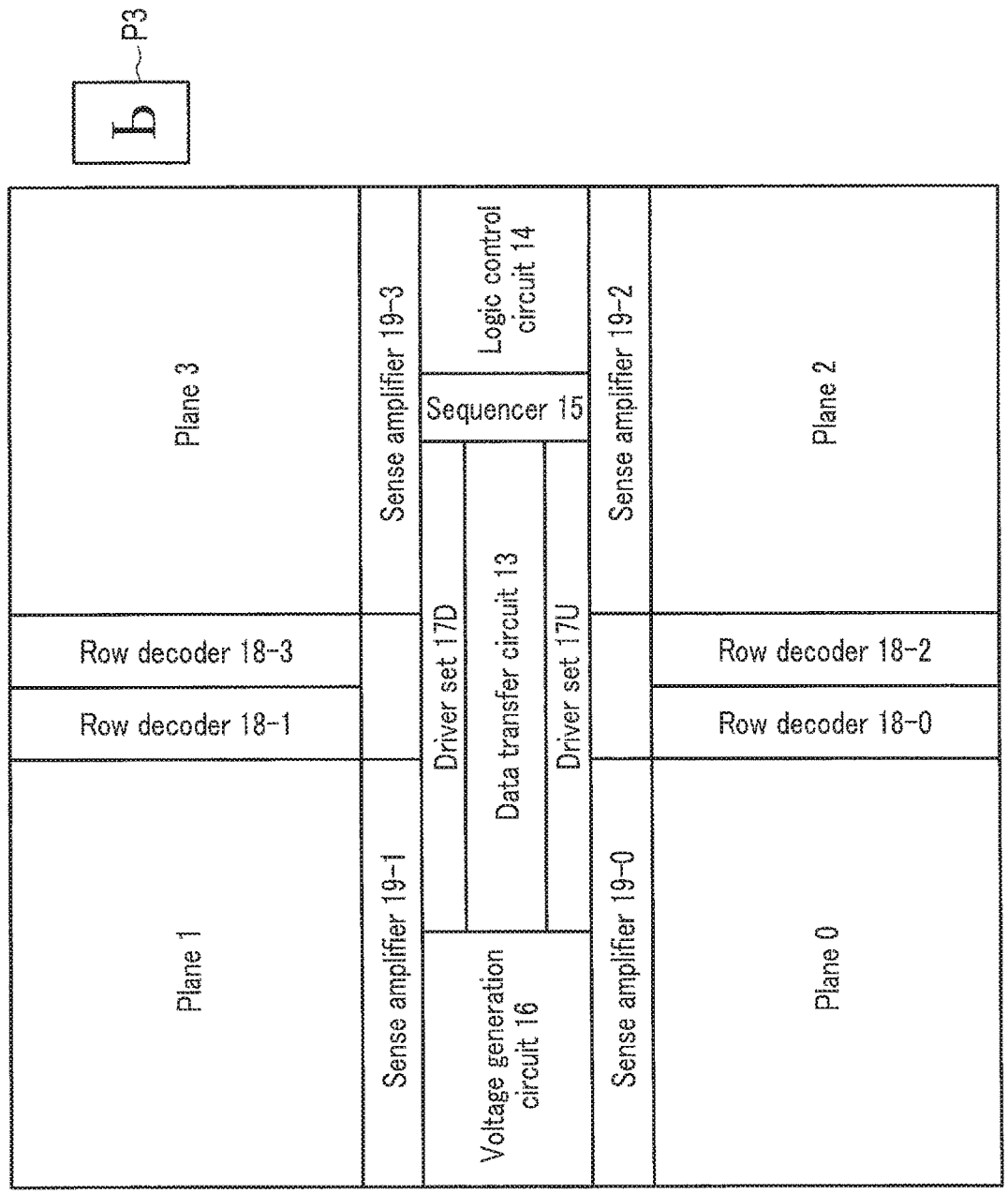
F I G. 14

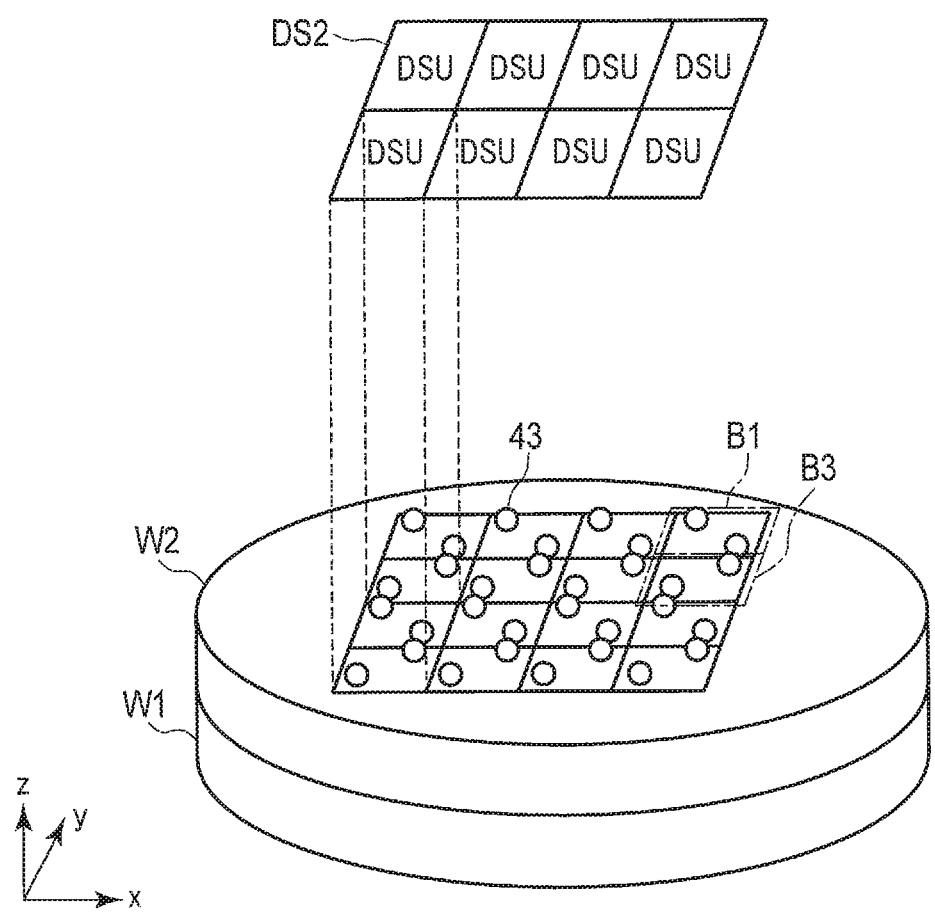
F I G. 17

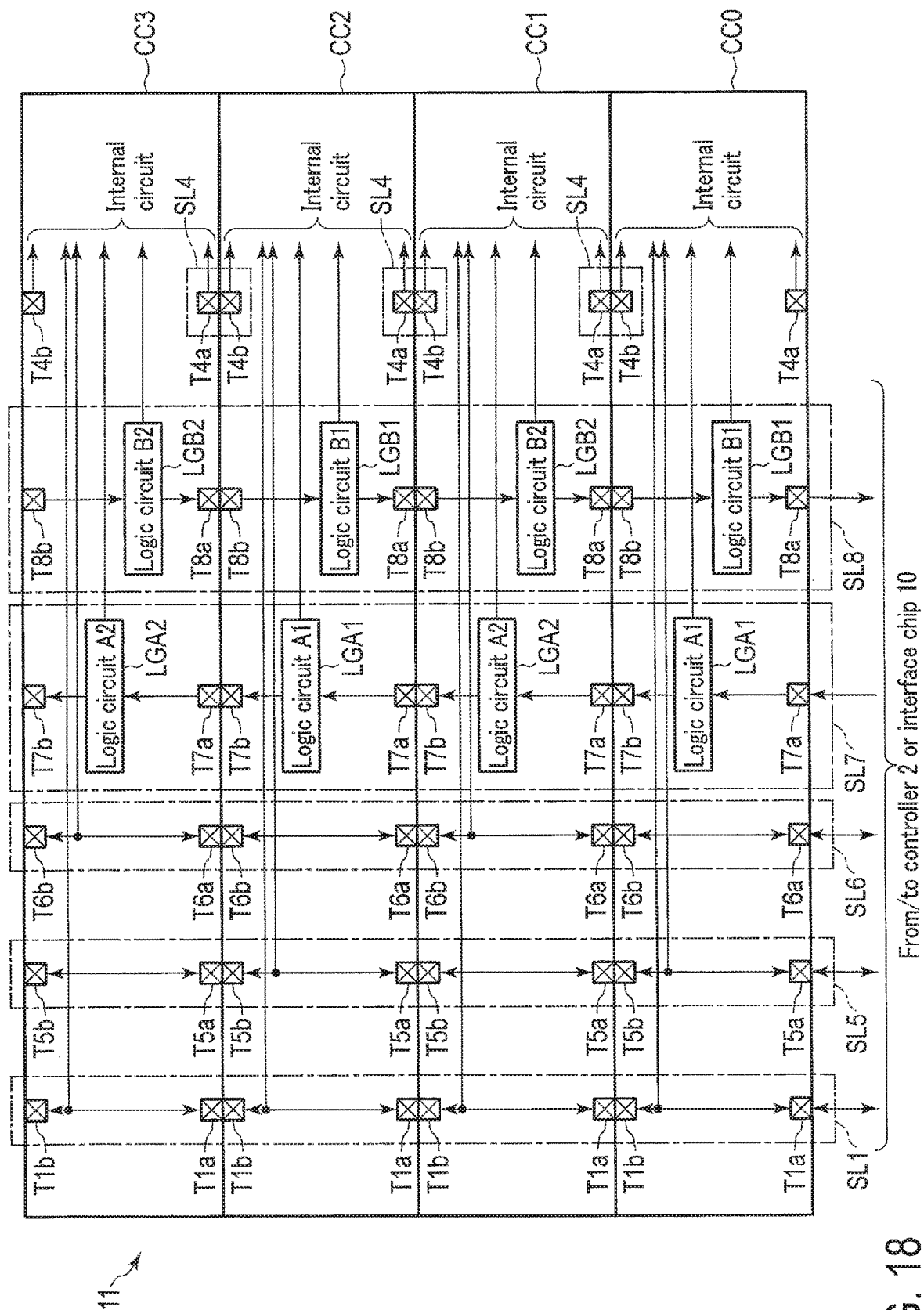
F I G. 18

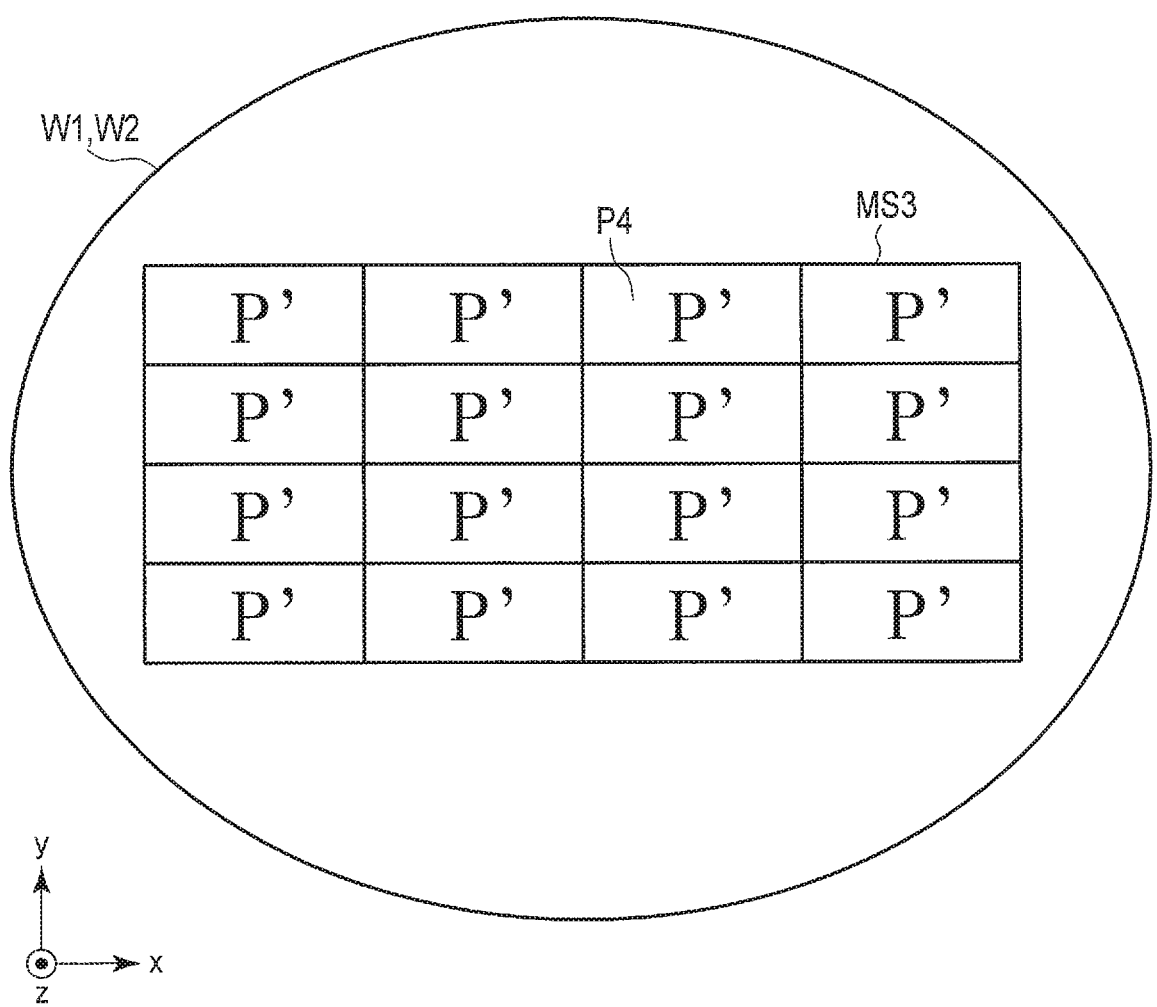
F I G. 22

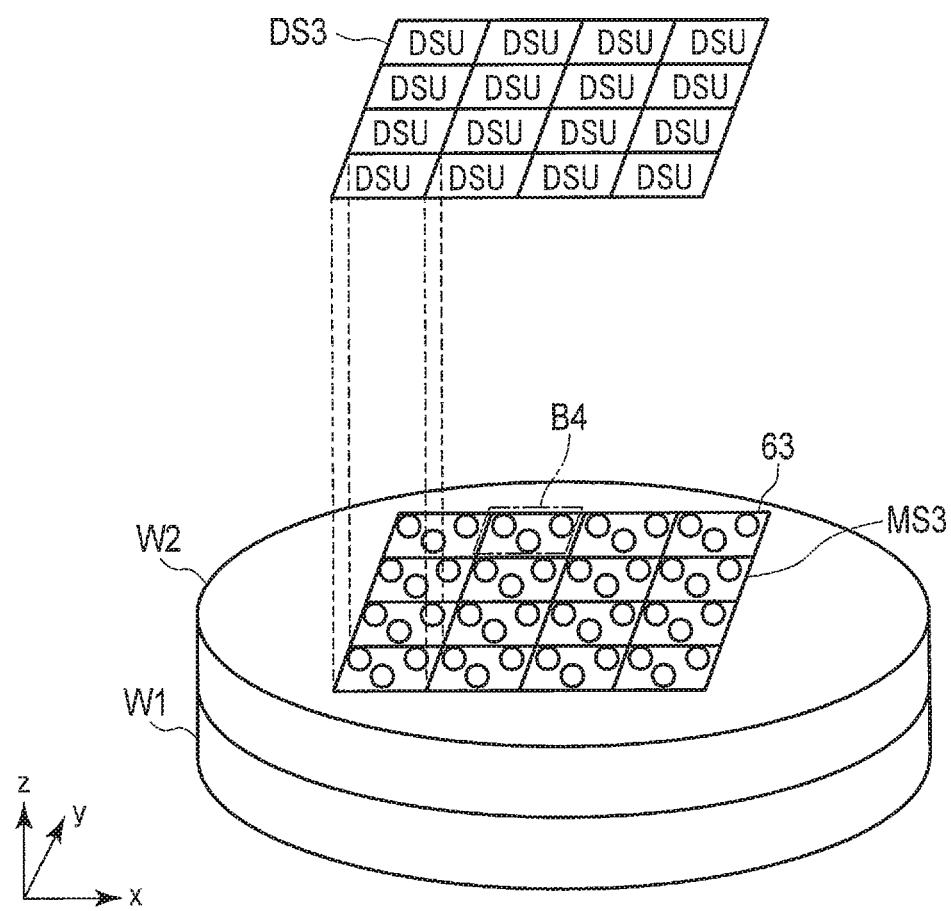
F I G. 23

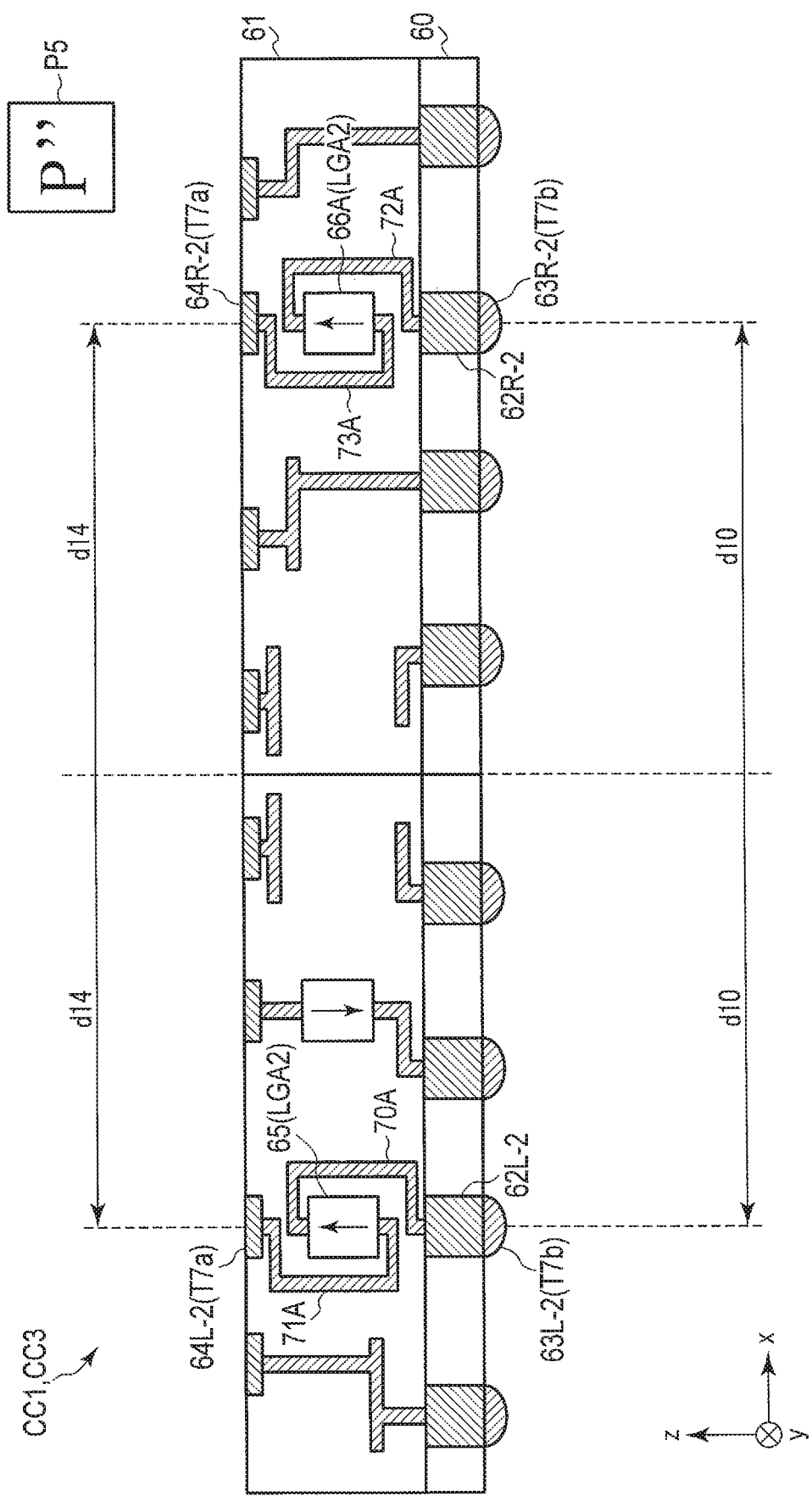
F I G. 25

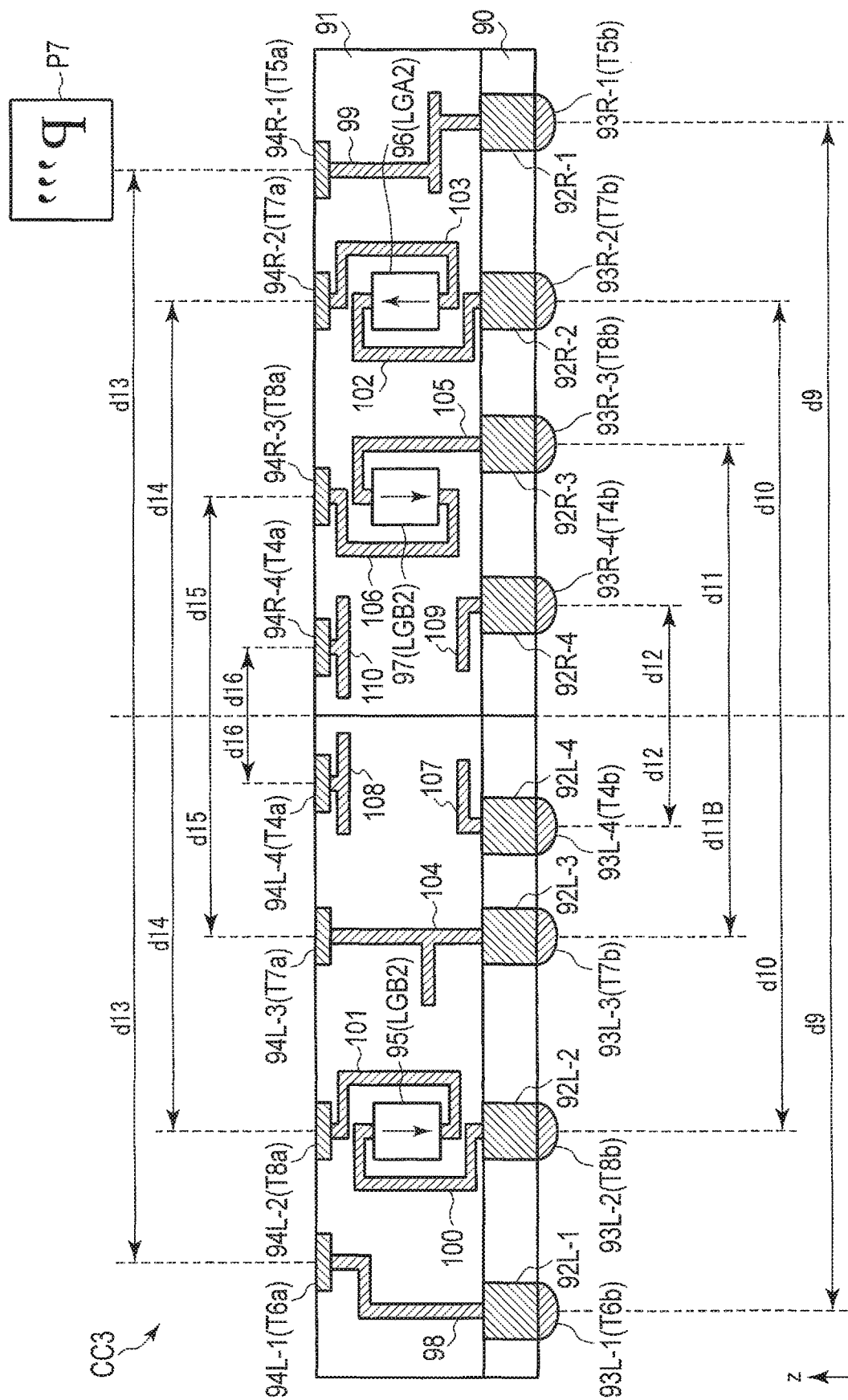
F I G. 32

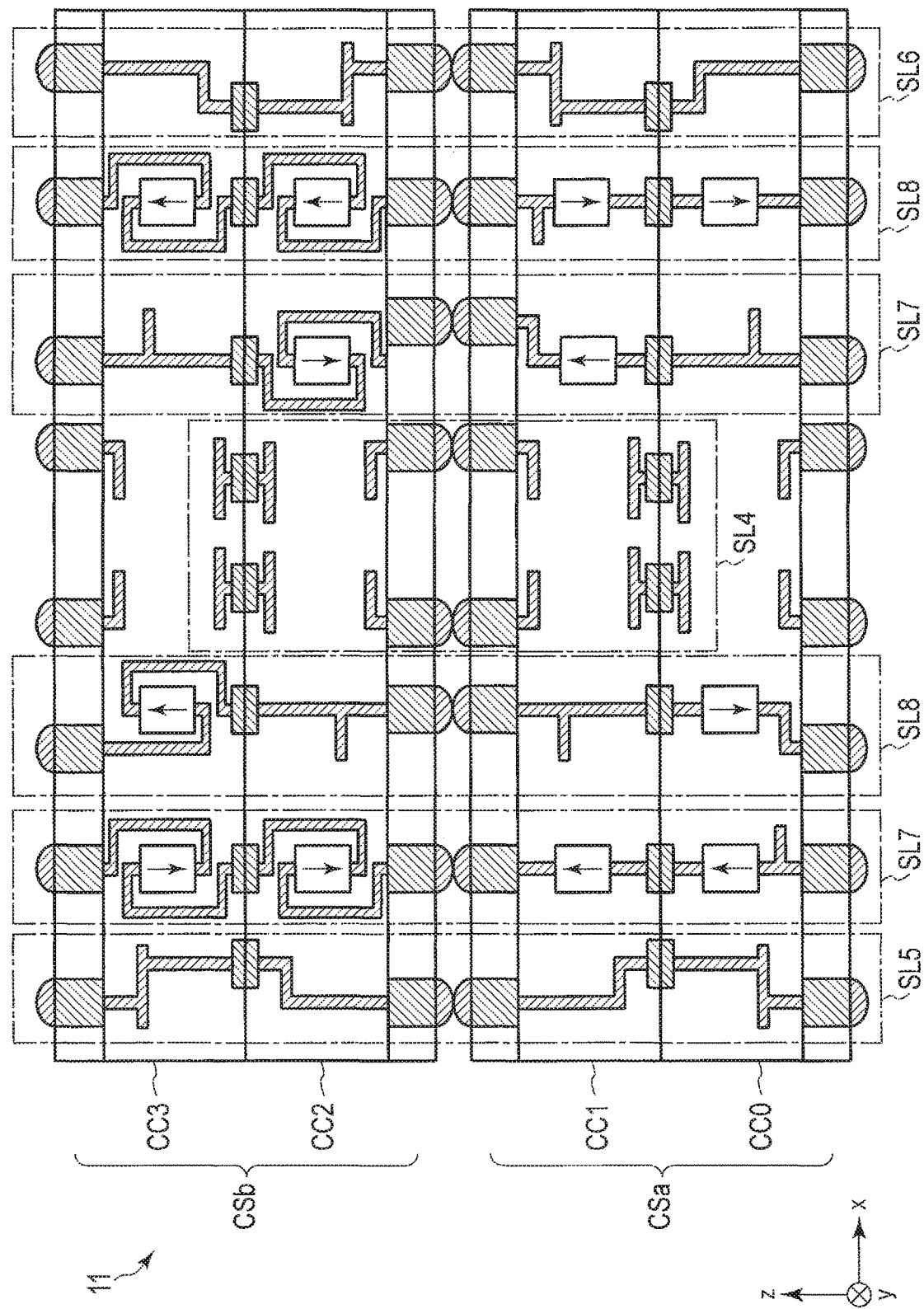
F I G. 33

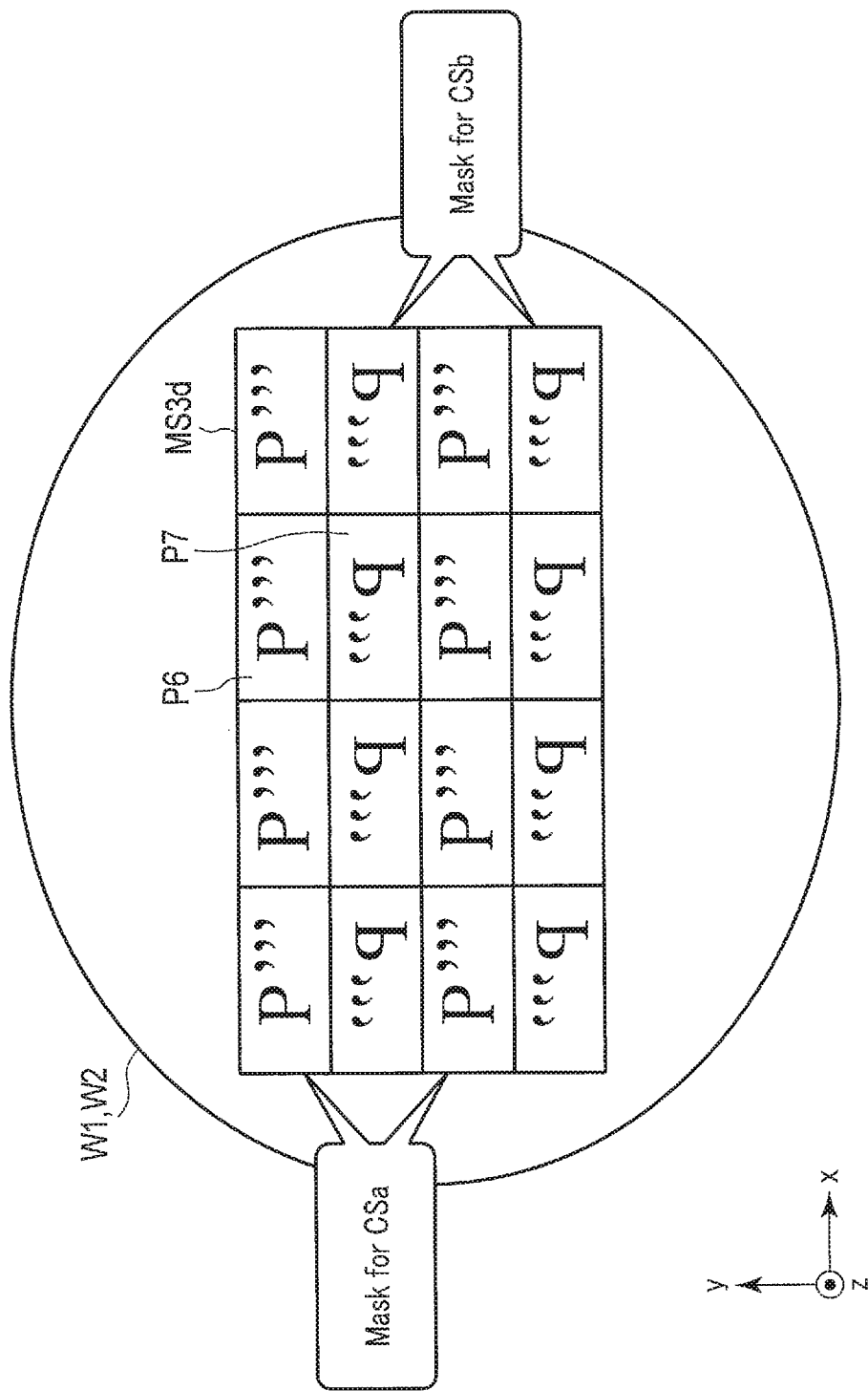
F I G. 34

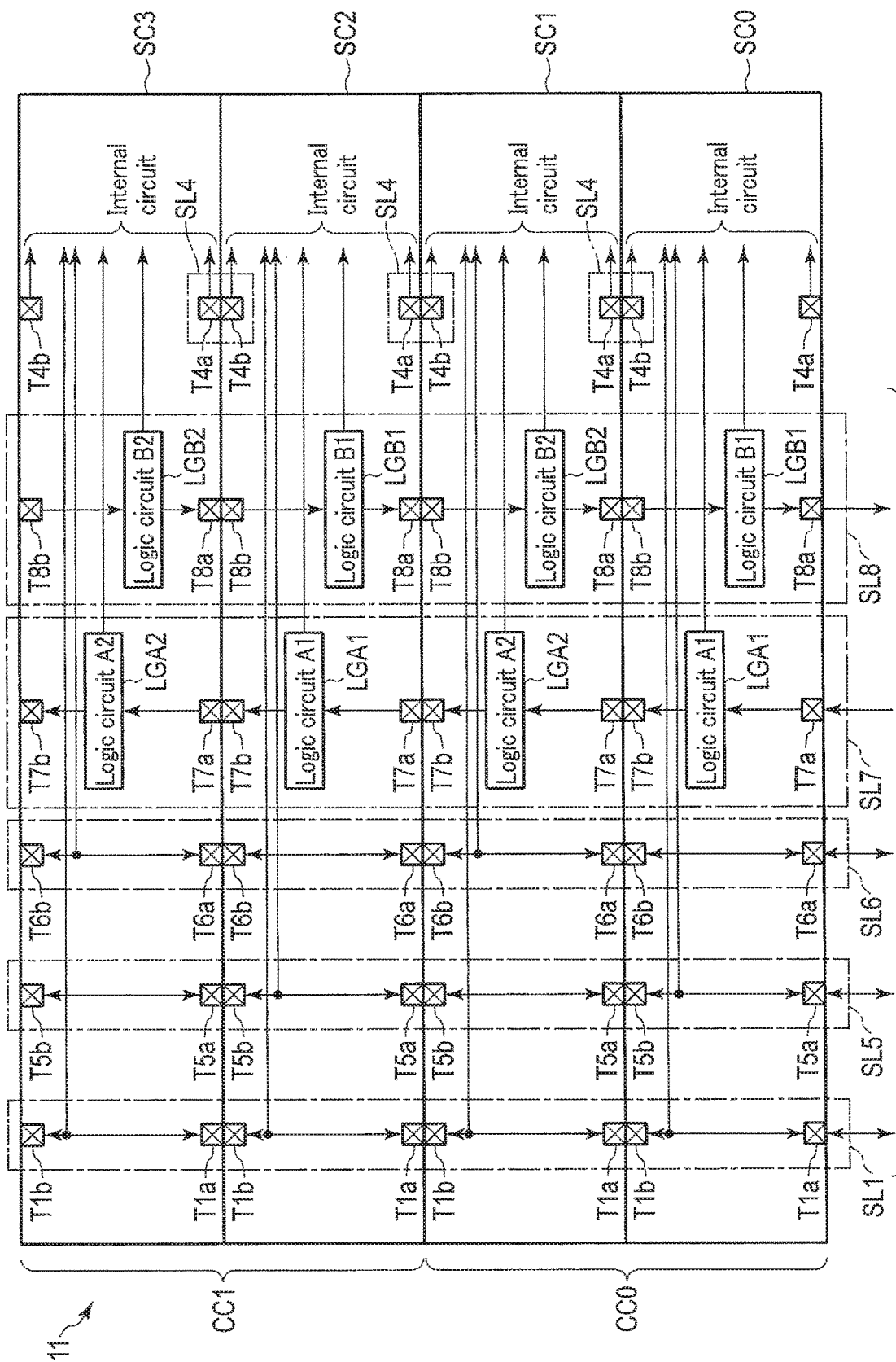
F I G. 36

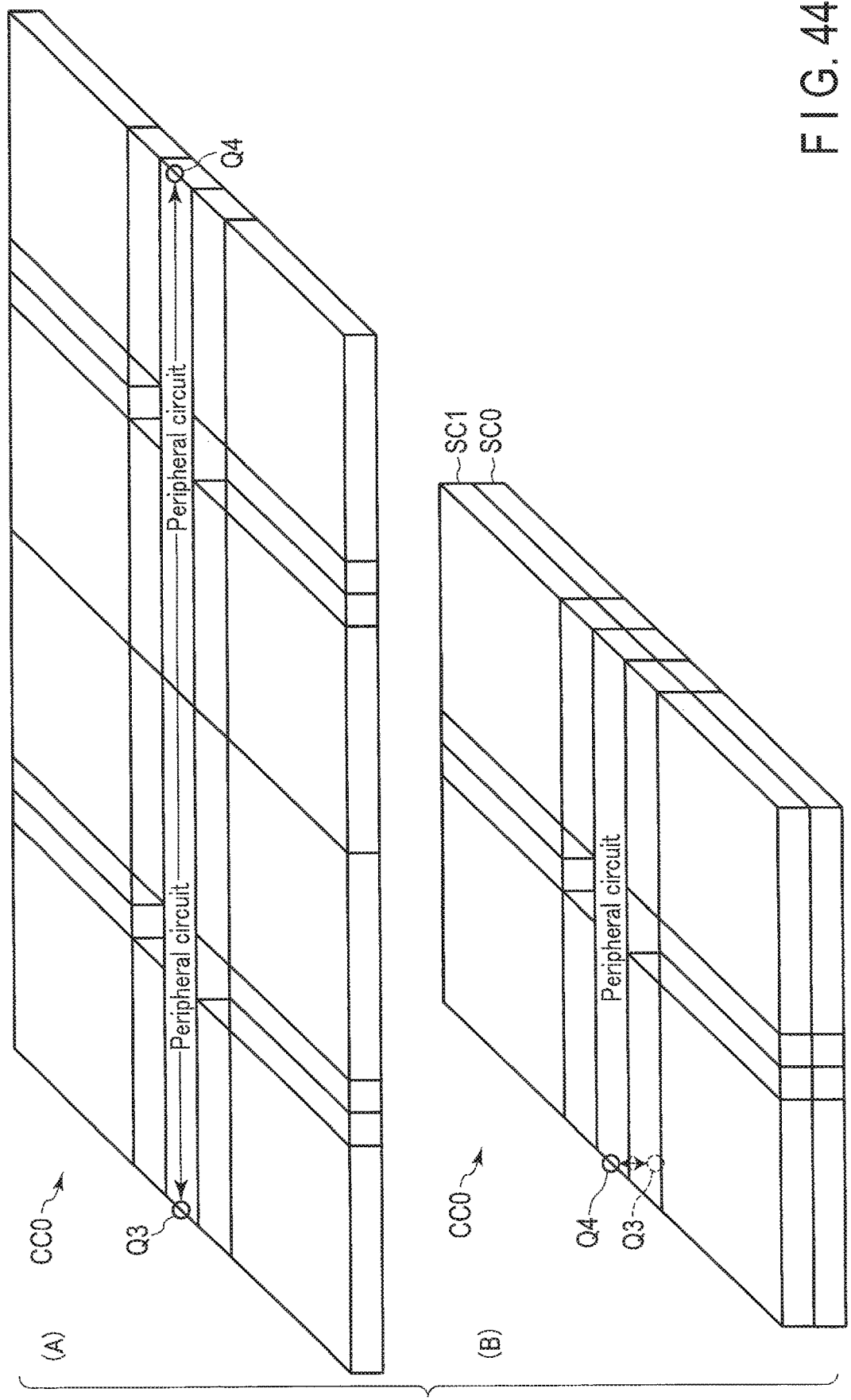
F I G. 44

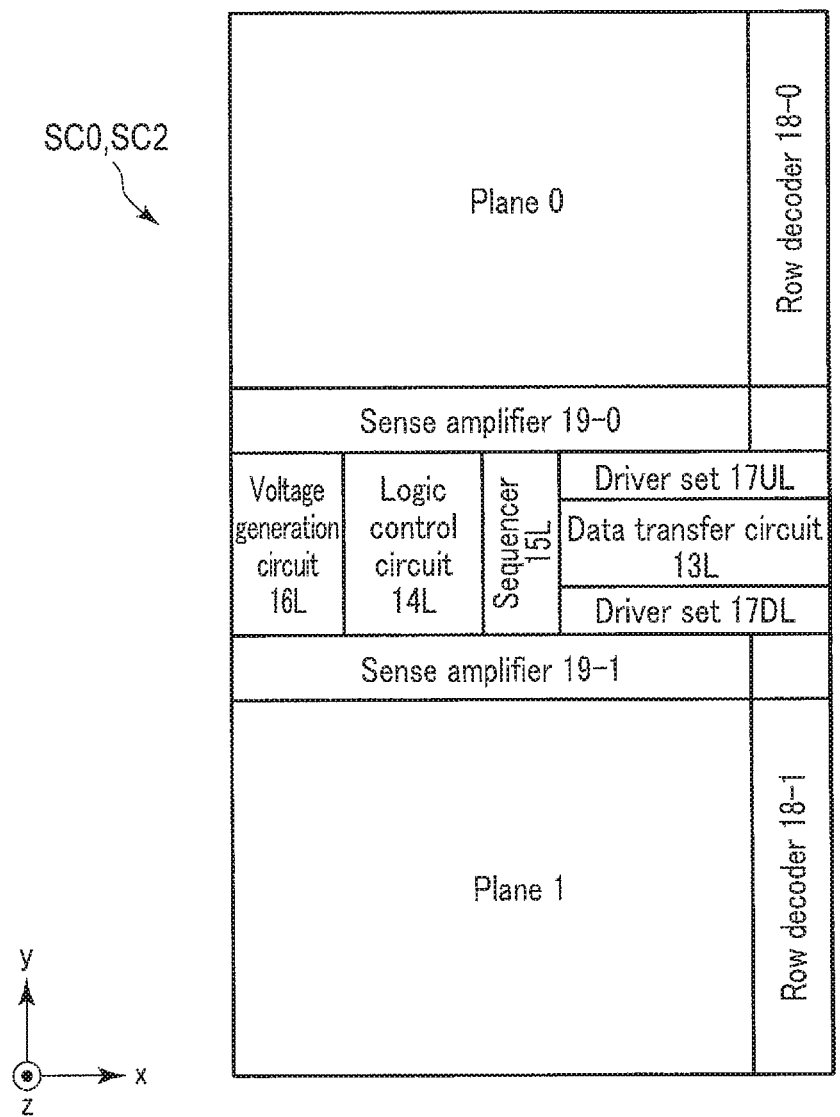
F I G. 50

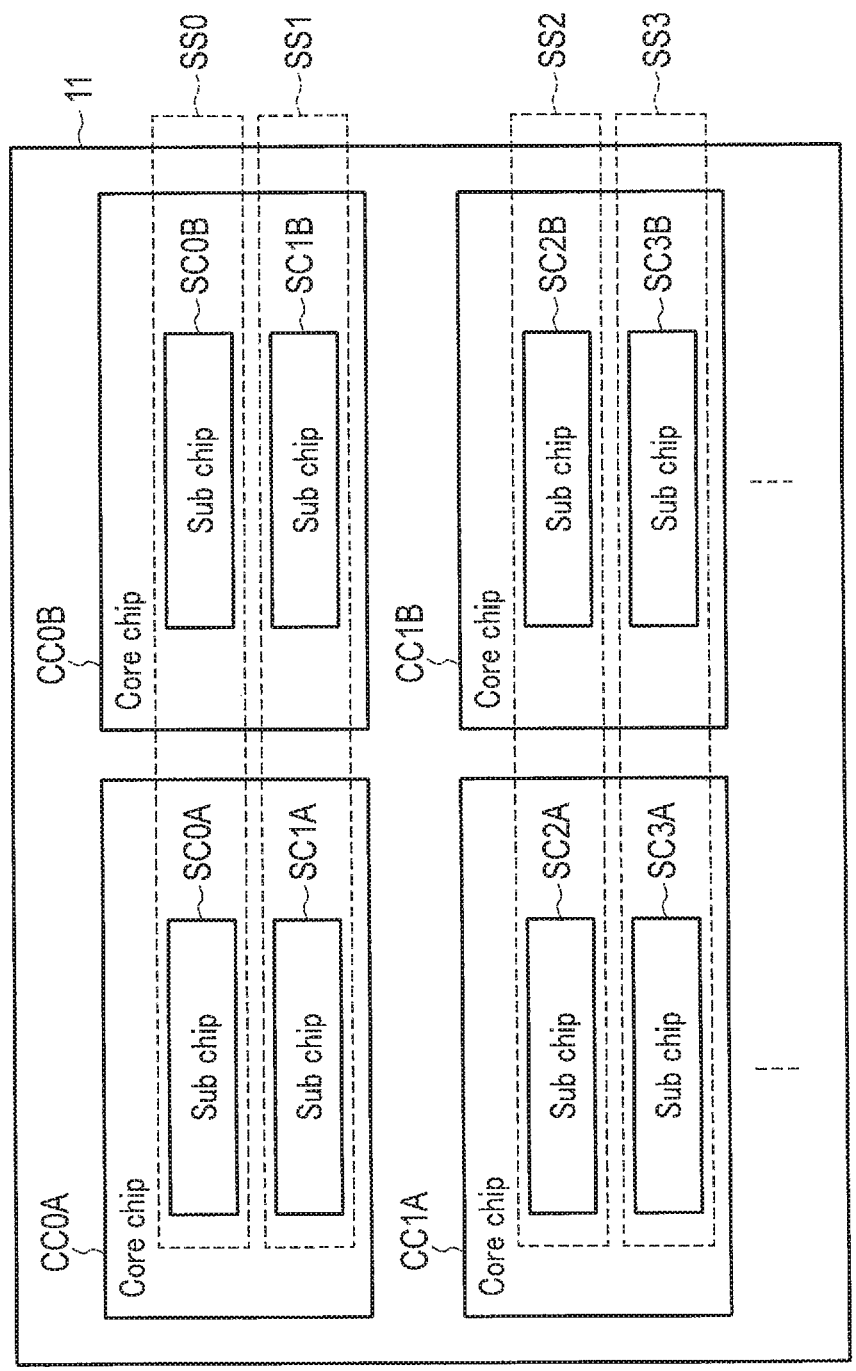
F I G. 52

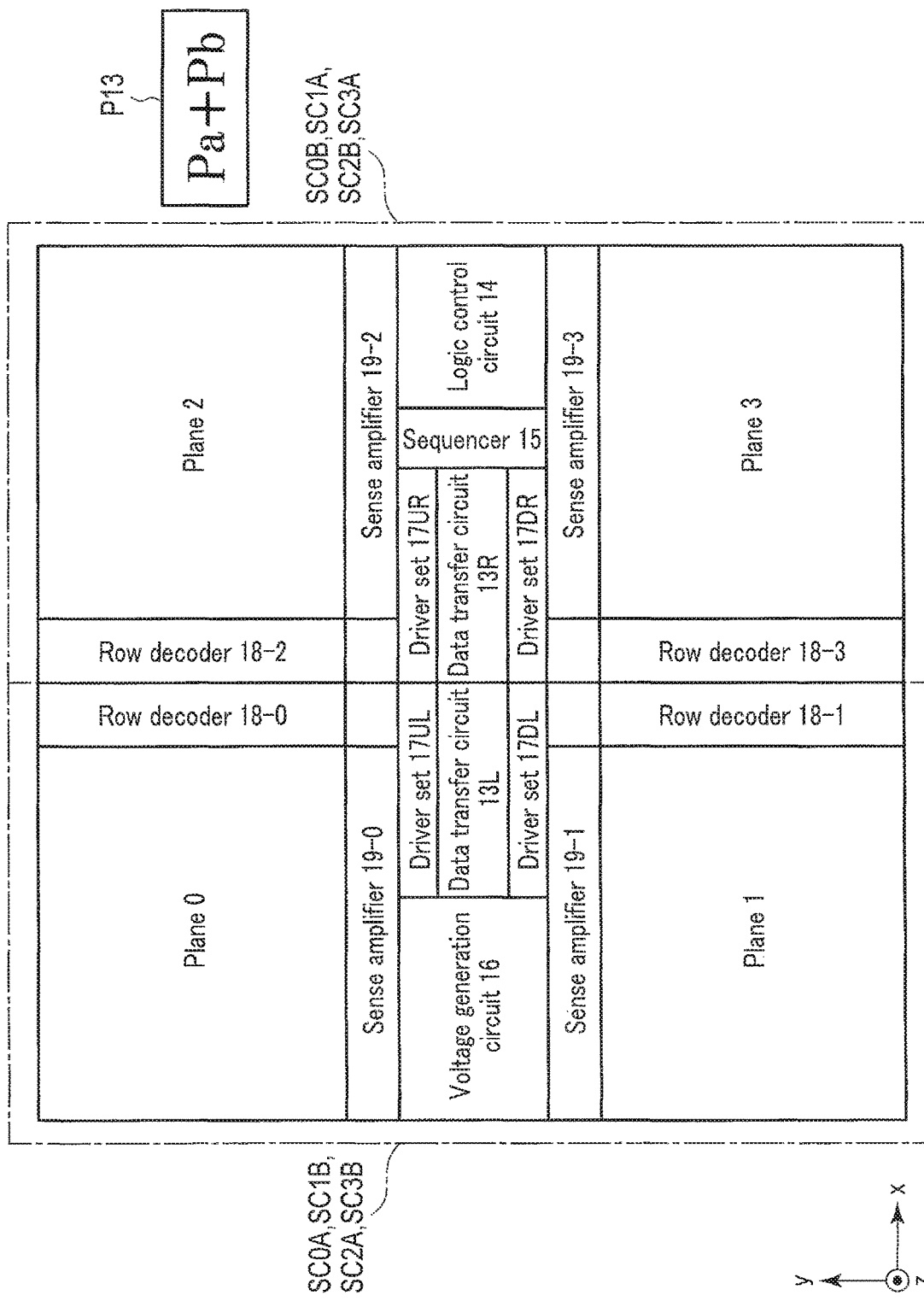
F I G. 53

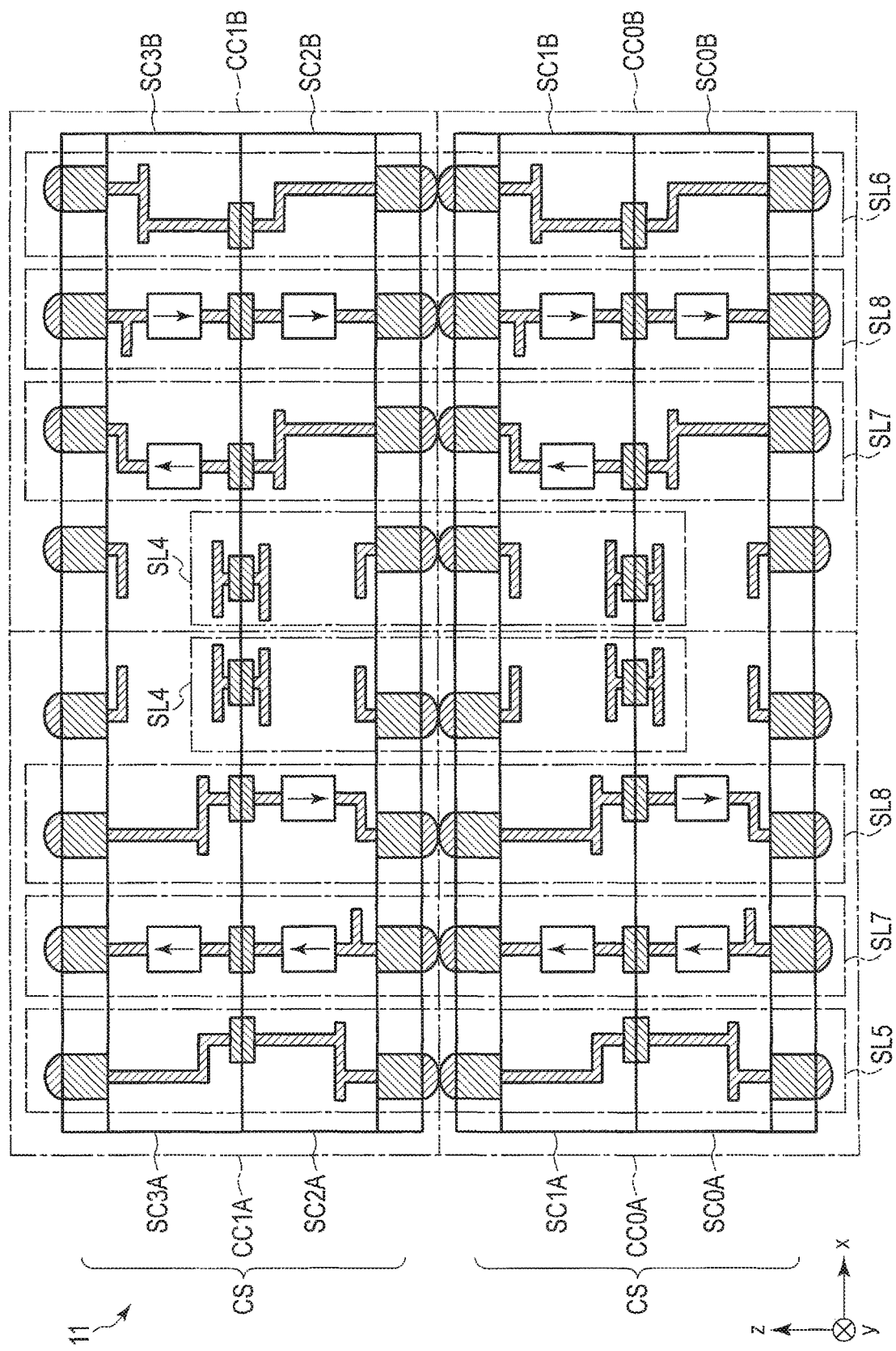
F I G. 54

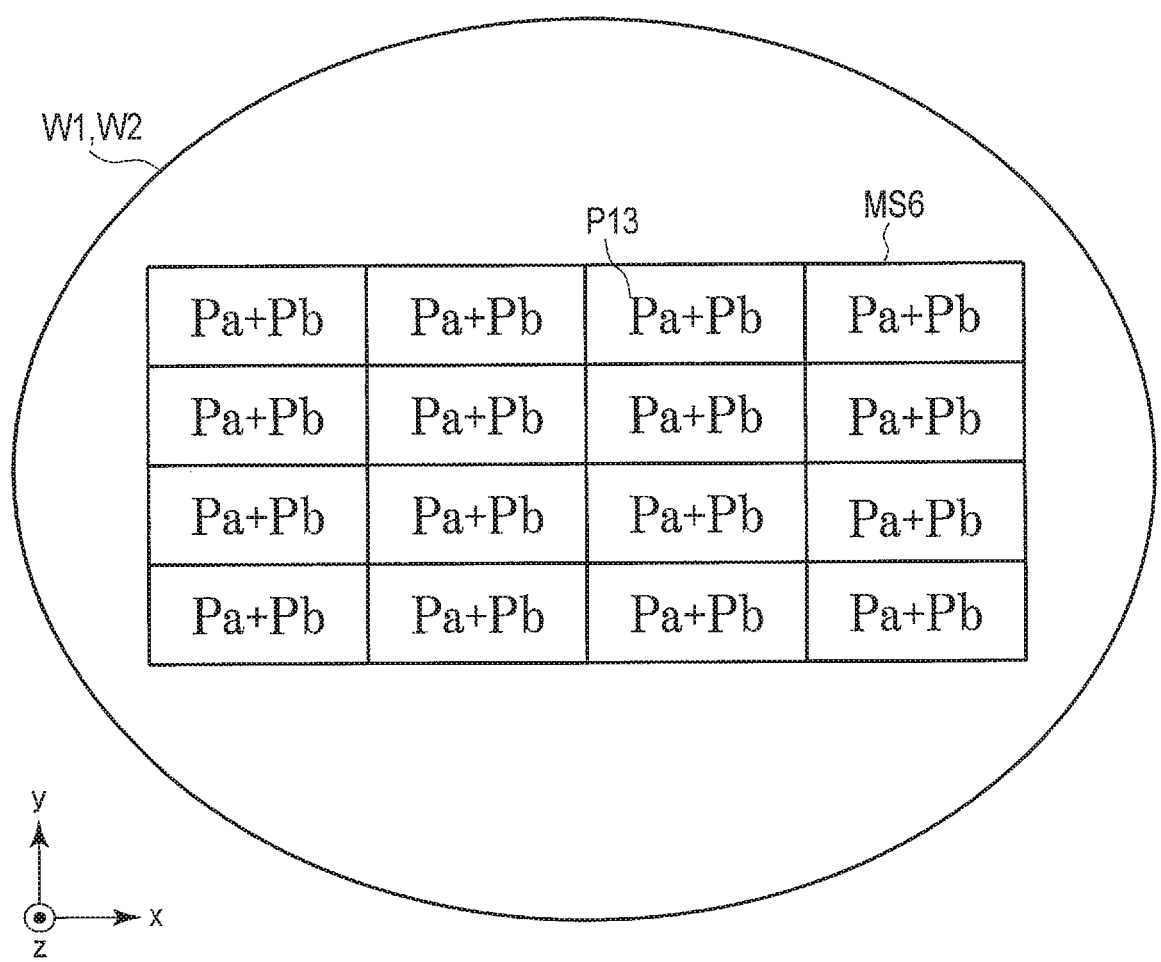
F I G. 55

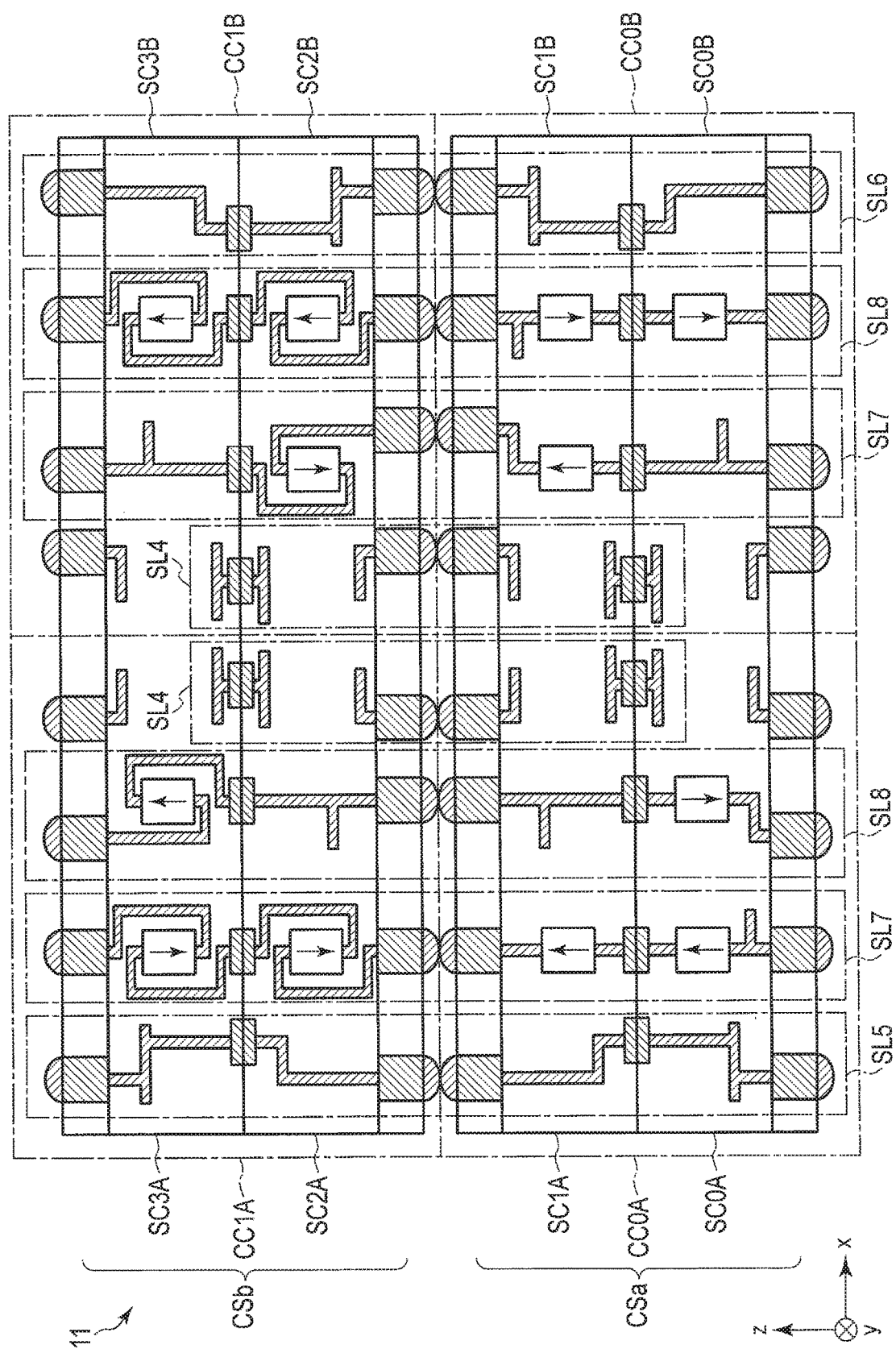
F I G. 56

SEMICONDUCTOR MEMORY DEVICE

CROSS-REFERENCE TO RELATED APPLICATIONS

This application is a Continuation Application of PCT Application No. PCT/JP2018/001639, filed Jan. 19, 2018 and based upon and claiming the benefit of priority from Japanese Patent Application No. 2017-049967, filed Mar. 15, 2017, the entire contents of all of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 2 is a block diagram illustrating a configuration of a semiconductor memory device according to the first embodiment.

FIG. 5 is a cross-sectional view illustrating a configuration of a core chip of the semiconductor memory device according to the first embodiment.

FIG. 12 is a schematic diagram illustrating the manufacturing method for the semiconductor memory device according to the first embodiment.

FIG. 14 is a top view illustrating a configuration of a core chip of a semiconductor memory device according to a modification of the first embodiment.

FIG. 17 is a schematic diagram illustrating the manufacturing method for the semiconductor memory device according to the modification of the first embodiment.

FIG. 18 is a circuit diagram illustrating a core chip group of a semiconductor memory device according to a second embodiment.

FIG. 22 is a schematic diagram illustrating a manufacturing method for the semiconductor memory device according to the second embodiment.

FIG. 23 is a schematic diagram illustrating the manufacturing method for the semiconductor memory device according to the second embodiment.

FIG. 25 is a cross-sectional view illustrating a configuration of a core chip of the semiconductor memory device according to the first modification of the second embodiment.

FIG. 32 is a cross-sectional view illustrating configuration of a core chip of the semiconductor memory device according to the third embodiment.

FIG. 33 is a cross-sectional view illustrating a core chip group of the semiconductor memory device according to the third embodiment.

FIG. 34 is a schematic diagram illustrating a manufacturing method for the semiconductor memory device according to the third embodiment.

FIG. 36 is a circuit diagram illustrating the core chip group of the semiconductor memory device according to the fourth embodiment.

FIG. 44 is a schematic diagram illustrating advantageous effects of the semiconductor memory device according to the fourth embodiment.

FIG. 50 is a top view illustrating a configuration of a core chip of a semiconductor memory device according to a third modification of the fourth embodiment.

FIG. 52 is a block diagram illustrating a core chip group of a semiconductor memory device according to a fifth embodiment.

FIG. 53 is a top view illustrating a configuration of a core chip of the semiconductor memory device according to the fifth embodiment.

FIG. 54 is a cross-sectional view illustrating a core chip group of the semiconductor memory device according to the fifth embodiment.

FIG. 55 is a schematic diagram illustrating the manufacturing method for the semiconductor memory device according to the fifth embodiment.

FIG. 56 is a cross-sectional view illustrating a core chip group of a semiconductor memory device according to a first modification of the fifth embodiment.

DETAILED DESCRIPTION

In general, according to one embodiment, a semiconductor memory device includes: a first substrate; a first element layer provided on an upper surface of the first substrate; a second substrate; and a second element layer provided on an upper surface of the second substrate. The first substrate includes a first via. The first element layer includes a first pad electrically coupled to the first via, and provided on an upper surface of the first element layer. The second substrate includes a second via. The second element layer includes a second pad electrically coupled to the second via, and provided on an upper surface of the second element layer. The upper surface of the second element layer is arranged so as to be opposed to the upper surface of the first element layer. The first and second pads are symmetrically arranged with respect to a surface where the first element layer and the second element layer are opposed to each other, and the first and second pads are electrically coupled.

Hereinafter, embodiments will be described with reference to the drawings. In the description below, structural elements having the same functions and configurations will be assigned with common reference symbols. To distinguish a plurality of structural elements having a common reference symbol from each other, an additional symbol is added after the common reference symbol. If there is no need of mutually distinguishing a plurality of structural elements, the plurality of structural elements are assigned with only a common reference symbols without an additional symbol.

1. First Embodiment

A semiconductor memory device according to the first embodiment is described.

1.1 Configuration

First, the configuration of the semiconductor memory device according to the first embodiment is described.

1.1.1 Overall Configuration of Memory System

Figure 1:
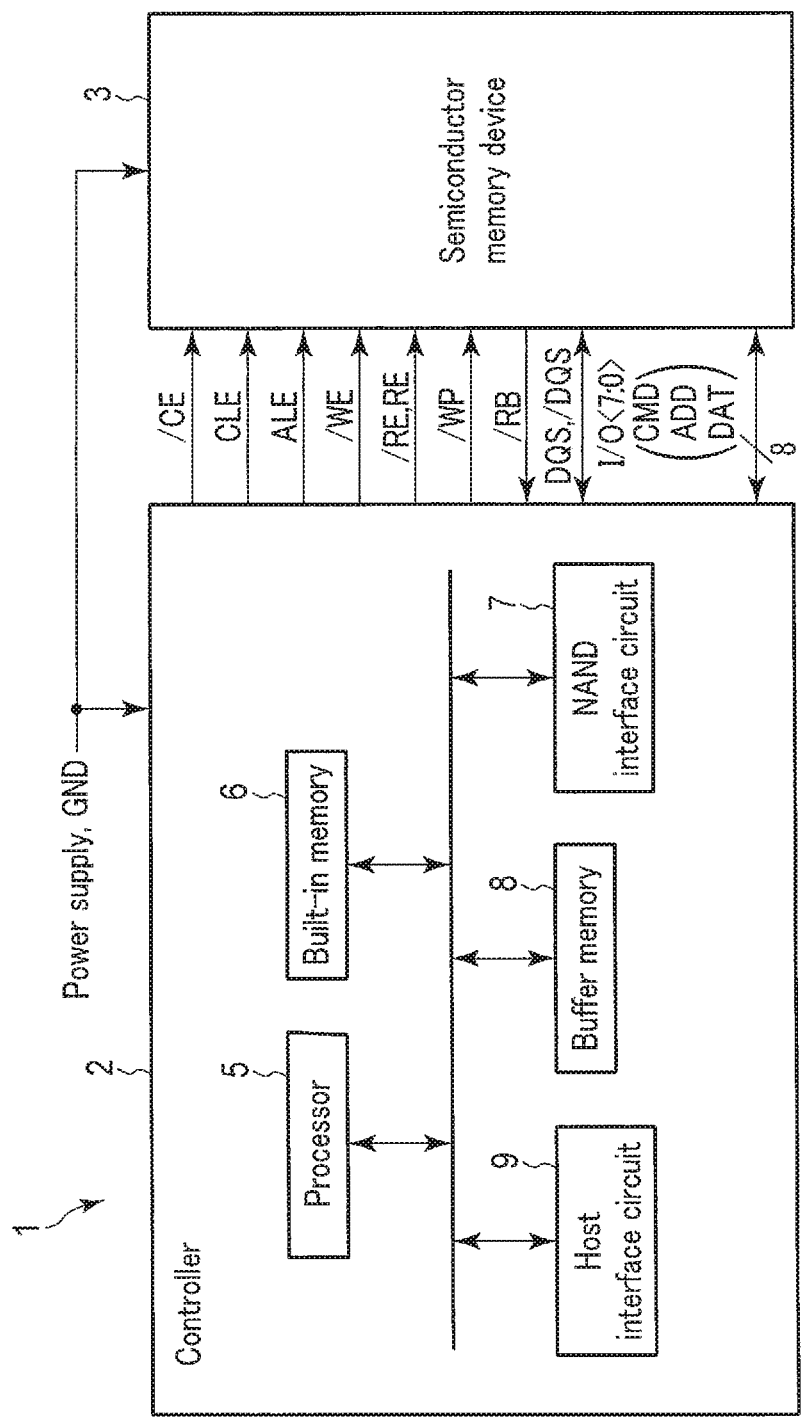
FIG. 1 is a block diagram illustrating a configuration of a memory system according to a first embodiment.

A configuration example of a memory system according to the first embodiment is described with reference to FIG. 1. FIG. 1 is a block diagram showing the configuration example of the memory system according to the first embodiment. The memory system 1 is provided on an external substrate system (not shown), for example. The memory system 1 operates by a power supply voltage and a ground voltage GND supplied from the substrate system, and performs communications with an external host device (not shown). The memory system 1 retains data from the host device (not shown), and reads and outputs the data to the host device.

As shown in FIG. 1, the memory system 1 has a controller 2 and a semiconductor memory device (NAND-type flash memory) 3. The controller 2 receives an instruction from the host device, and controls the semiconductor memory device 3 based on the received instruction. Specifically, the controller 2 writes data into the semiconductor memory device 3 which it is instructed to write by the host device, reads the data from the semiconductor memory device 3 which it is instructed to read by the host device, and transmits the data to the host device. The controller 2 is coupled to the semiconductor memory device 3 via a NAND bus. The semiconductor memory device 3 has a plurality of memory cells, and stores data in a non-volatile manner.

The NAND bus transmits/receives signals CE/, CLE, ALE, /WE, /RE, RE, /WP, /RB, DQS, /DQS, and I/O<7:0> in accordance with a NAND interface. The signal /CE is a signal to enable the semiconductor memory device 3. The signals CLE and ALE notify the semiconductor memory device 3 that the signal I/O<7:0>, that flows in the semiconductor memory device 3 in parallel with the signal CLE or ALE, is a command CMD or an address ADD respectively. The signal /WE instructs the semiconductor memory device 3 to retrieve the signal I/O<7:0> sent to the semiconductor memory device 3 in parallel with the signal /WE. The signals /RE and RE instruct the semiconductor memory device 3 to output the signal I/O<7:0>. The signal /WP prohibits the semiconductor memory device 3 from writing and erasing data. The signal /RB indicates that the semiconductor memory device 3 is either in a ready state (a state of accepting external instructions) or a busy state (a state of not accepting external instructions). The signal I/O<7:0> is an 8-bit signal, for example. The signals DQS and /DQS are reference signals that serve as indicators of timing for inputting/outputting the signal I/O<7:0> to/from the semiconductor memory device 3. The signal I/O<7:0> is what is actually sent/received between the semiconductor memory device 3 and the controller 2, and includes a command CMD, an address ADD, data DAT, and a status STS. The data DAT includes write data and read data.

1.1.2 Configuration of Controller

The controller of the memory system according to the first embodiment will be explained with reference to FIG. 1. The controller 2 has a processor (central processing unit, CPU) 5, a built-in memory (random access memory, RAM) 6, a NAND interface circuit 7, a buffer memory 8, and a host interface circuit 9.

The processor 5 controls the operation of the entire controller 2. The processor 5 issues, to the semiconductor memory device 3, a write instruction based on a NAND interface in response to a data write instruction received from the host device, etc. This operation is the same when reading or erasing is performed.

The built-in memory 6 is, for example, a semiconductor memory, such as a DRAM (dynamic RAM), and is used as a work area of the processor 5. The built-in memory 6 retains firmware for managing the semiconductor memory device 3, and various management tables, etc.

The NAND interface circuit 7 is coupled to the semiconductor memory device 3 via a NAND bus, and controls communications with the semiconductor memory device 3. The NAND interface circuit 7 sends a command CMD, an address ADD, and write data to the semiconductor memory device 3 in accordance with an instruction of the processor 5. The NAND interface circuit 7 receives read data from the semiconductor memory device 3.

The buffer memory 8 temporarily retains read data received by the controller 2 from the semiconductor memory device 3 and the host device.

The host interface circuit 9 is coupled to the host device, and controls communications with said host device. The host interface circuit 9 transfers, for example, an instruction and data received from the host device to the processor 5 and the buffer memory 8, respectively.

1.1.3 Configuration of Semiconductor Memory Device

Next, a configuration example of the semiconductor memory device according to the first embodiment is described with reference to FIG. 2. FIG. 2 is a block diagram showing the configuration example of the semiconductor memory device according to the first embodiment.

The semiconductor memory device 3 has an interface chip 10 and a core chip group 11 which are operated by a power supply voltage and a ground voltage GND supplied from the substrate system, for example. The core chip group 11 has, for example, four core chips CC (CC0, CC1, CC2, and CC3). The number of core chips CC is not limited to four, and can be of any number. Herein, "core chip CC" is a unit of a semiconductor integrated circuit that may function as a single NAND flash memory in conjunction with the interface chip 10.

The interface chip 10 has a function as an interface between the controller 2 and the core chip group 11 for the signals /CE, CLE, ALE, /WE, /RE, RE, /WP, /RB, DQS, /DQS, and I/O<7:0>. The interface chip 10 transfers, for example, a command CMD and an address ADD in the I/O<7:0>, along with the signals DQS and /DQS, to the core chip group 11. Furthermore, the interface chip 10 sends and receives, for example, write data and read data in the signal I/O<7:0>, along with the signals DQS and /DQS, to and from the core chip group 11.

Each core chip CC has a memory cell array 12, a data transfer circuit 13, a logic control circuit 14, a sequencer 15, a voltage generation circuit 16, a driver set 17, a row decoder 18, and a sense amplifier 19. In the descriptions hereinafter, various circuits provided in each core chip, including the memory cell array 12, the data transfer circuit 13, the logic control circuit 14, the sequencer 15, the voltage generation circuit 16, the driver set 17, the row decoder 18, and the sense amplifier 19, will be collectively referred to as the "internal circuit".

The memory cell array 12 has four planes (plane 0, plane 1, plane 2, and plane 3), for example. Each plane has a plurality of non-volatile memory cell transistors (not shown) respectively associated with word lines and bit lines. In each plane, a write operation and a read operation can be performed simultaneously during a single write operation or read operation, for example. The number of planes in the memory cell array 12 is not limited to four, and can be one, two, or eight, for example.

The data transfer circuit 13 transfers a command CMD and an address ADD to the sequencer 15. The data transfer circuit 13 sends and receives write data and read data to and from the sense amplifier 19.

The logic control circuit 14 receives signals corresponding to the signals /CE, CLE, ALE, /WE, /RE, RE, and /WP via the interface chip 10. Said logic control circuit 14 transfers the signal /RE to the controller 2 via the interface chip 10 so as to externally notify the status of a core chip.

The sequencer 15 receives the command CMD, and controls an entire core chip in accordance with a sequence based on the received command CMD.

The voltage generation circuit 16 generates voltages necessary for various operations, such as data write, read, and erase, based on an instruction from the sequencer 15. The voltage generation circuit 16 supplies a generated voltage to the row decoder 18 and the sense amplifier 19.

The row decoder 18 receives a row address in the address ADD from the sequencer 15, and selects a portion of each plane based on the row address. A voltage is transferred from the voltage generation circuit 16 to the selected portion of each plane via the row decoder 18.

When data is read, the sense amplifier 19 senses read data that is output to a bit line from a memory cell transistor, and transfers the said read data to the data transfer circuit 13. When data is written, the sense amplifier 19 transfers write data to be written via a bit line to a memory cell transistor. The sense amplifier 19 receives from the sequencer 15 a column address in an address ADD, and outputs the data of a column based on said column address.

In the example shown in FIG. 2, the interface chip 10 and the core chip group 11 are provided as separate chips; however, the present embodiment is not limited to this configuration. For example, the core chip group 11 may include a circuit having a function similar to that of the interface chip 10. In such a case, the core chip group 11 may communicate various signals with the controller 2 without involving the interface chip 10.

1.1.4 Configuration of Core Chip Group

Next, the configuration of the core chip group of the semiconductor memory device according to the first embodiment is described.

1.1.4.1 Coupling Between Core Chips

Figure 3:
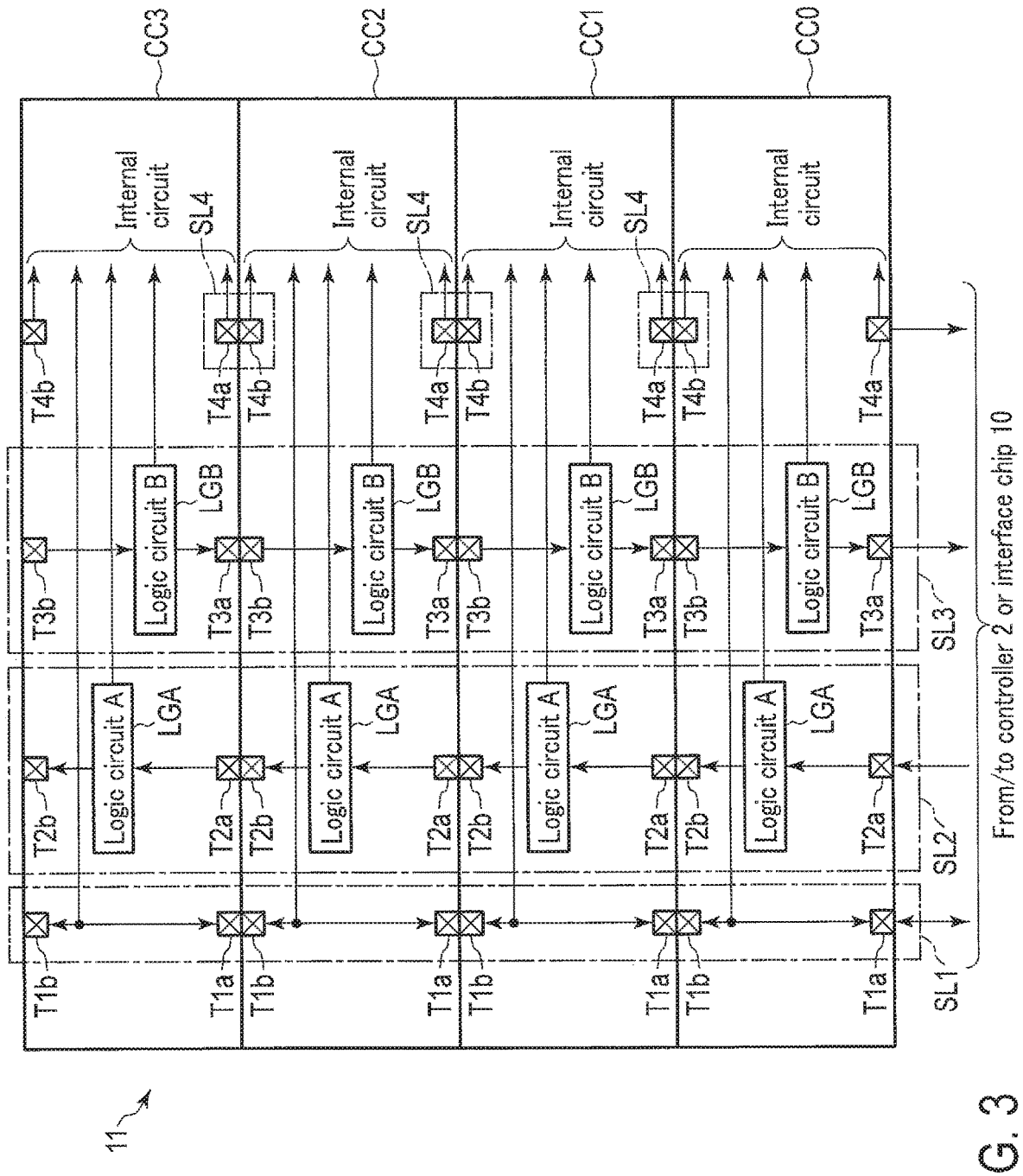
FIG. 3 is a circuit diagram illustrating a core chip group of the semiconductor memory device according to the first embodiment.

First, a coupling between the core chips of the semiconductor memory device according to the first embodiment is described with reference to FIG. 3. FIG. 3 is a circuit diagram explaining an example of a coupling between the core chips of the semiconductor memory device according to the first embodiment.

As shown in FIG. 3, the core chip group 11 is configured with, for example, serially-coupled core chips CC0 through CC3. Specifically, each of core chips CC0 through CC3 includes terminals T1a, T2a, T3a, T4a, and terminals T1b, T2b, T3b, T4b. Each of core chips CC0 through CC3 further includes logic circuits LGA and LGB.

Terminals T1a through T4a of core chip CC0 are coupled to the interface chip 10 or the controller 2, which is externally provided. Terminals T1b through T4b of core chip CC0 are coupled to terminals T1a through T4a of core chip CC1, respectively. Terminals T1b through T4b of core chip CC1 are coupled to terminals T1a through T4a of core chip CC2, respectively. Terminals T1b through T4b of core chip CC2 are coupled to terminals T1a through T4a of core chip CC3, respectively.

In each core chip CC, terminals T1a, T2a, and T3a are coupled to terminals T1b, T2b, and T3b respectively, via interconnects provided inside of the core chip CC. In each core chip CC, the logic circuit LGA is provided on the interconnect between terminals T2a and T2b, and the logic circuit LGB is provided on the interconnect between terminals T3a and T3b. The logic circuit LGA includes an input terminal coupled to terminal T2a, and an output terminal coupled to terminal T2b. The logic circuit LGB includes an input terminal coupled to terminal T3b, and an output terminal coupled to terminal T3a.

The coupling between the core chips configured as described above allows terminal T1a of core chip CC0 through terminal T1b of core chip CC3 to function as signal path SL1 capable of sending/receiving signals between core chips CC0 through CC3. Terminals T2a of core chip CC0 through T2b of core chip CC3 function as a signal path SL2 capable of sending, to core chip CC(n+1), signals subjected to computation by the logic circuit LGA of core chip CCn (n is 0≤n≤2). Terminals T3a of core chip CC0 through T3b of core chip CC3 function as a signal path SL3 capable of sending, to core chip CCn, signals which are subjected to computation by the logic circuit LGB of core chip CC(n+1). Terminals T4a of core chip CCn through T4b of core chip CC(n+1) function as a signal path SL4 capable of sending/receiving signals between core chips CCn and CC(n+1). Terminals T1a through T4a of core chip CC0 can send and receive various signals to and from the interface chip 10 or the controller 2.

The signals communicated between the terminals T in each core chip CC are coupled to the internal circuit of said core chip CC. The internal circuit of each core chip CC can thereby receive signals flowing in signal paths SL1 through SL4, or send signals to signal paths SL1 through SL4. In the example shown in FIG. 3, terminals T1a through T4a, terminals T1b through T4b, and logic circuits LGA and LGB are shown separately from the internal circuit; however, the configuration of the present embodiment is not limited to this example. For example, terminals T1a through T4a, terminals T1b through T4b, and logic circuits LGA and LGB may be included in the internal circuit.

Any logic circuit may be adopted as the logic circuits LGA and LGB as appropriate, as long as the circuit is a circuit element having non-interchangeable input and output. In the logic circuits LGA and LGB, various logic operations, such as a NOT operation, an OR operation, an AND operation, a NAND operation, a NOR operation, and an XOR operation, are applicable.

FIG. 3 shows the example in which terminals T1b through T4b are provided in core chip CC3; however, the present embodiment is not limited to this example. For example, if core chip CC3 is not coupled to any core chip CC other than core chip CC2, the terminals T1b through T4b are unnecessary. In the description hereinafter, for descriptive purposes, there may be a terminal not coupled to other core chips CC, like core chip CC3 in FIG. 3. However, as described above, such a terminal is not necessarily provided.

1.1.4.2 Configuration of Core Chips

Next, the configuration of the core chips of the semiconductor memory device according to the first embodiment is described.

The circuit configuration of each core chip shown in FIG. 3 includes a semiconductor integrated circuit provided in a semiconductor substrate and an element layer thereon, for example. Specific design of the semiconductor integrated circuit is determined by an arrangement of the internal circuit elements (which may also be referred to as "layout pattern"), and an arrangement of interconnects between the internal circuit elements (which may also be referred to as "interconnect pattern"), for example. More specifically, the layout pattern determines an arrangement of the following elements in the core chip on the semiconductor substrate: the memory cell array 12; the data transfer circuit 13; the logic control circuit 14; the sequencer 15; the voltage generation circuit 16; the driver set 17; the row decoder 18; the sense amplifier 19; terminals T1a through T4a; terminals T1b through T4b; and logic circuits LGA and LGB. For example, the interconnect pattern determines an input-output relationship of the internal circuit which is arranged according to the layout pattern. Information of the entire design of a core chip CC, including the layout pattern and the interconnect pattern, may be referred to as a "chip design". In the description hereinafter, let us suppose that the area of the layout pattern and the interconnect pattern corresponds to a chip that is cut from a wafer in the dicing process.

Figure 4:
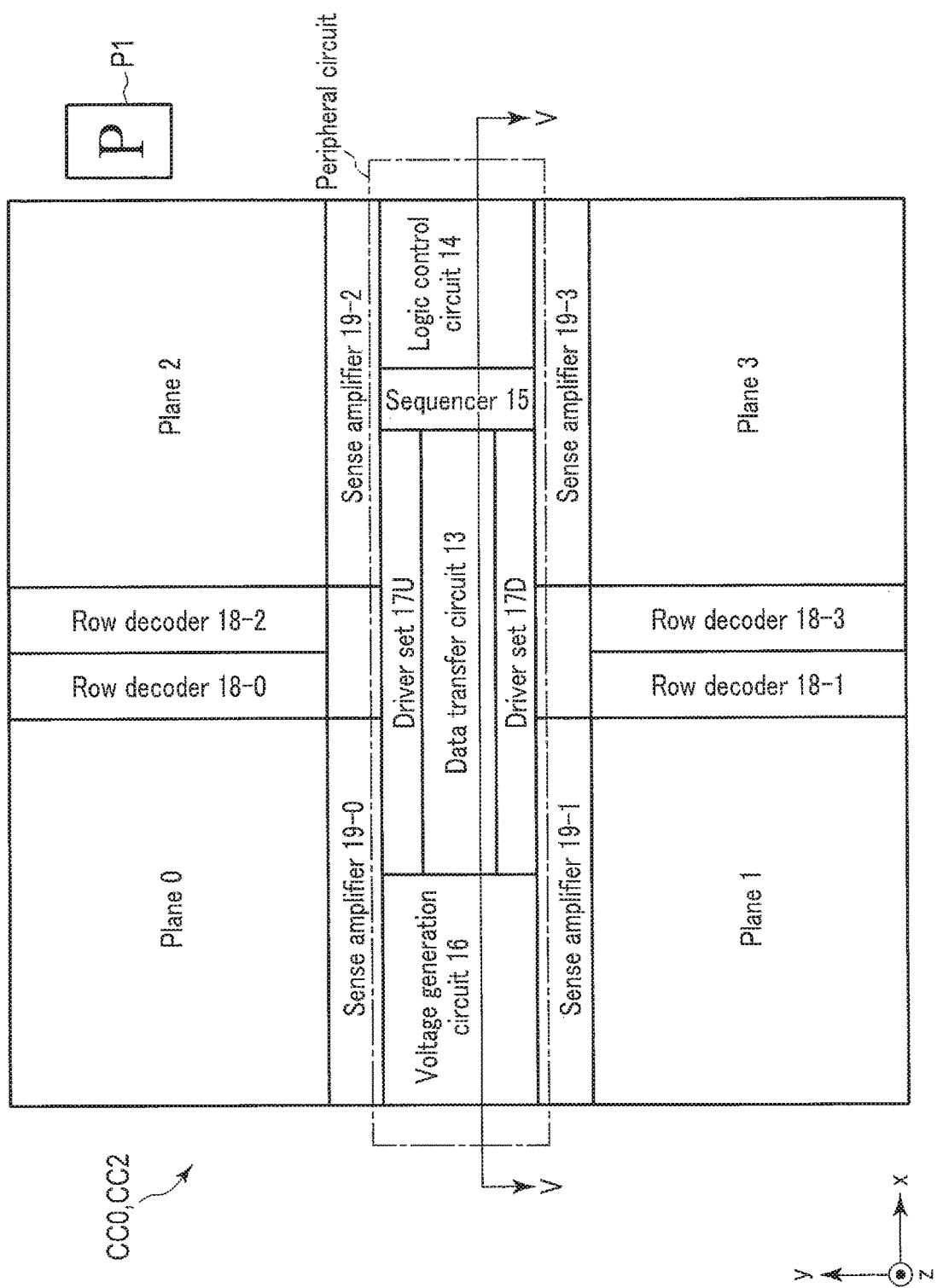
FIG. 4 is a top view illustrating a configuration of a core chip of the semiconductor memory device according to the first embodiment.
Figure 6:
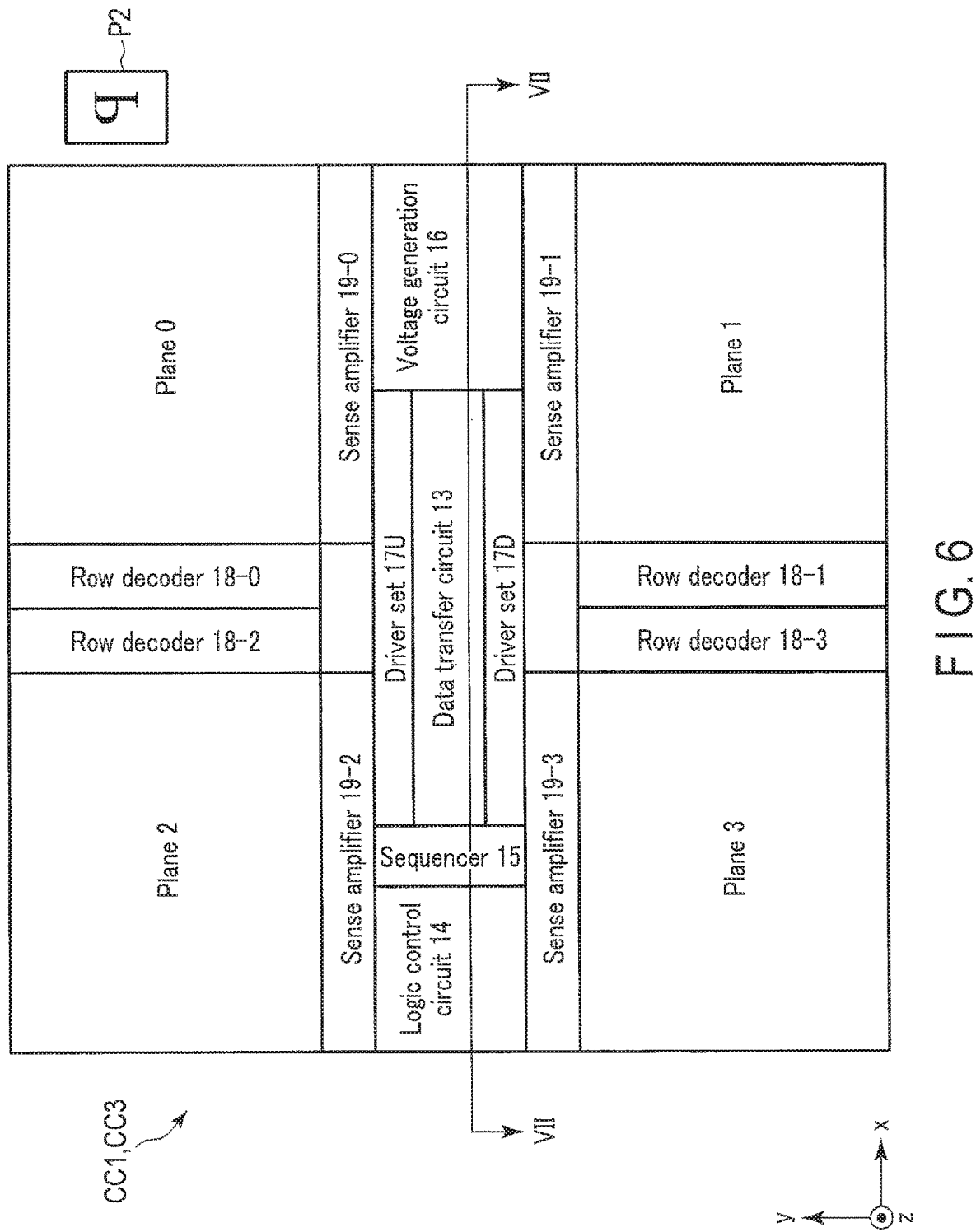
FIG. 6 is a top view illustrating a configuration of a core chip of the semiconductor memory device according to the first embodiment.
Figure 7:
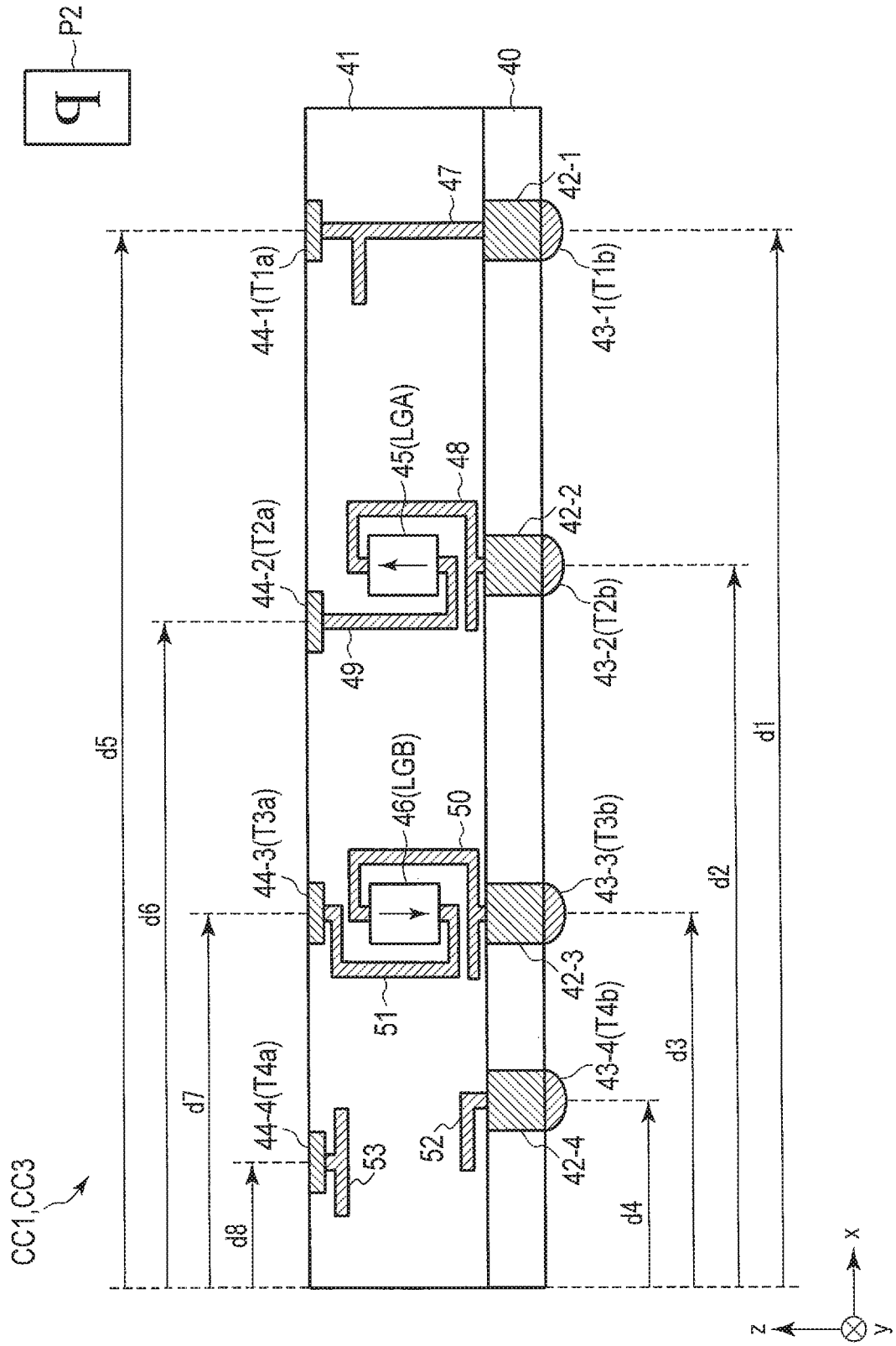
FIG. 7 is a cross-sectional view illustrating a configuration of a core chip of the semiconductor memory device according to the first embodiment.

FIGS. 4 and 6 are top views for explaining the layout pattern of the core chips of the semiconductor memory device according to the first embodiment. FIGS. 5 and 7 are cross-sectional views for explaining the layout pattern and the interconnect pattern of the core chips of the semiconductor memory device according to the first embodiment. FIGS. 5 and 7 show cross-sectional views taken in line V-V shown in FIG. 4 and line VII-VII shown in FIG. 6, respectively. FIG. 4 and FIG. 5 show the configuration common in core chips CC0 and CC2, and FIG. 6 and FIG. 7 show the configuration common in core chips CC1 and CC3.

In the description hereinafter, of the semiconductor substrate, the surface on which the internal circuit is provided is defined as an "upper surface", and the surface facing the upper surface is defined as a "lower surface". In contrast, among the layers constituting the internal circuit on the semiconductor substrate, the surface on the semiconductor substrate side is defined as a "lower surface", and the surface facing the lower surface is defined as an "upper surface". In the core chip, the surface on the semiconductor substrate side is defined as a "lower surface", and the surface on the internal circuit side is defined as an "upper surface". The plane in parallel to the upper and lower surfaces of the semiconductor substrate is defined as an x-y plane, and the direction orthogonal to the x-y plane is defined as a z-axis direction. Let us suppose the x-axis direction and the y-axis direction are orthogonal to each other within the x-y plane.

First, the configuration of core chips CC0 and CC2 is described.

As shown in FIG. 4, the layout pattern of core chips CC0 and CC2 is arranged in a rectangular region having two sides in the x-axis direction and two sides in the y-axis direction in the x-y plane. Plane 0 through plane 3 are provided in four corners of the rectangular region: top-left corner, bottom-left corner, top-right corner, and bottom-right corner in FIG. 4, respectively. The row decoder 18 and the sense amplifier 19 are arranged so as to be allocated between the portions corresponding to plane 0 through plane 3. In the descriptions hereinafter, the row decoders 18 and the sense amplifiers 18 respectively corresponding to plane 0 through plane 3 will be referred to as "row decoders 18-0 through 18-3" and "sense amplifiers 19-0 through 19-3", respectively. One y-axis direction side of each row decoder 18-0 through 18-3 is in contact with, for example, one y-axis direction side of each plane 0 through plane 3, respectively. The other y-axis direction sides of the row decoders 18-0 and 18-1 are in contact with the other y-axis direction sides of the row decoders 18-2 and 18-3, respectively. The sense amplifiers 19-0 through 19-3 are in contact with the x-axis direction sides of plane 0 through plane 3, respectively.

The data transfer circuit 13, the logic control circuit 14, the sequencer 15, the voltage generation circuit 16, and the driver set 17 are arranged in a region surrounded by the sense amplifiers 19-0 through 19-3 in the y-axis direction. In the description hereinafter, the data transfer circuit 13, the logic control circuit 14, the sequencer 15, the voltage generation circuit 16, and the driver set 17 will be referred to as a "peripheral circuit", in contrast to the memory cell array 12, the row decoder 18, and the sense amplifier 19. The data transfer circuit 13 is provided at a center of the rectangular region, and the driver set 17 is divided into a portion corresponding to plane 0 and plane 2, and a portion corresponding to plane 1 and plane 3. In the descriptions hereinafter, the portion of the driver set 17 corresponding to plane 0 and plane 2, and the portion of the driver set 17 corresponding to plane 1 and plane 3 are referred to as "driver sets 17U and 17D", respectively. The driver sets 17U and 17D are in contact with the x-axis direction side of the data transfer circuit 13.

The voltage generation circuit 16 is arranged, for example, on the "plane 0 and plane 1" side with respect to the data transfer circuit 13 and the driver set 17. The logic control circuit 14 and the sequencer 15 are arranged, for example, on the "plane 2 and plane 3" side with respect to the data transfer circuit 13 and the driver set 17.

The layout pattern of core chips CC0 and CC2 with the above-described arrangement is associated with symbol P1 shown in FIG. 4, for example.

As shown in FIG. 5, the element layer 21 is provided on the upper surface of the semiconductor substrate 20 in accordance with the layout pattern associated with symbol P1, and the interconnect pattern associated with said layout pattern. In FIG. 5, the elements of the internal circuit, except for terminals T1a through T4a and terminals T1b through T4b, and logic circuits LGA and LGB, are omitted for the purpose of brevity.

In the semiconductor substrate 20, a plurality of vias 22 (22-1, 22-2, 22-3, 22-4) functioning as a TSV (through silicon via) are arranged. A plurality of bumps 23 (23-1, 23-2, 23-3, and 23-4) functioning as terminals T1a through T4a are arranged in the portions where vias 22-1 through 22-4 are exposed on the lower surface of the semiconductor substrate 20. On the upper surface of the element layer 21, a plurality of pads 24 (24-1, 24-2, 24-3, 24-4) functioning as terminals T1b through T4b are arranged. The upper surface of the pad 24 is exposed on the upper surface of the element layer 21. Within the element layer 21, the logic element layers 25 and 26 functioning as the logic circuits LGA and LGB, and the interconnect layers 27 through 33 are arranged.

The interconnect layer 27 includes a first end provided on an upper end of the via 22-1, and a second end provided on a lower end of the pad 24-1. The interconnect layer 27 is coupled to the internal circuit, for example.

The interconnect layer 28 includes a first end provided on an upper end of the via 22-2, and a second end provided on a lower end of the logic element layer 25. The interconnect layer 28 is coupled to the internal circuit, for example. The interconnect layer 29 includes a first end provided on an upper end of the logic element layer 25, and a second end provided on a lower end of the pad 24-2. The logic element layer 25 includes the lower end having a function as an input terminal, and the upper end having a function as an output terminal. In other words, the logic element layer 25 functions as the logic circuit LGA that outputs signals input from the bump 23-2 to the pad 24-2.

The interconnect layer 30 includes a first end provided on an upper end of the via 22-3, and a second end provided on a lower end of the logic element layer 26. The interconnect layer 31 includes a first end provided on an upper end of the logic element layer 26, and a second end provided on a lower end of the pad 24-3. The interconnect layer 31 is coupled to the internal circuit, for example. The logic element layer 26 has the lower end having a function as an output terminal, and the upper end having a function as an input terminal. In other words, the logic element layer 26 functions as the logic circuit LGB that outputs signals input from the pad 24-3 to the bump 23-3.

The interconnect layer 32 includes a first end provided on an upper end of the via 22-4, and is coupled to the internal circuit, for example. The interconnect layer 33 includes a first end provided on a lower end of the pad 24-4, and is coupled to the internal circuit, for example.

In the example shown in FIG. 5, the bump 23-1 and the pad 24-1 are respectively arranged at the positions located at distance d1 and d5 from the edge on the positive x-axis direction (right end) of the semiconductor substrate 20. The bump 23-2 and the pad 24-2 are respectively arranged at the positions located at distance d2 and d6 from the right end of the semiconductor substrate 20. The bump 23-3 and the pad 24-3 are respectively arranged at the positions located at distance d3 and d7 from the right end of the semiconductor substrate 20. The bump 23-4 and the pad 24-4 are respectively arranged at the positions located at distance d4 and d8 from the right end of the semiconductor substrate 20. The distances for each ensuing bracketed pair, (d1, d5), (d2, d6), (d3, d7), and (d4, d8) may be either the same or different.

Next, the configuration of core chips CC1 and CC3 is described.

As shown in FIG. 6, the layout pattern of core chips CC1 and CC3 is provided in the same rectangular region as in core chips CC0 and CC2. Furthermore, the layout patterns of core chips CC1 and CC3, and CC0 and CC2, are designed to be mirror-symmetric with respect to the plane where the upper surfaces of the core chips are opposed to each other. Specifically, the layout patterns of core chips CC1 and CC3, and CC0 and CC2, are mirror-symmetric with respect to the y-z plane. More specifically, planes 0 through 3 are arranged in four corners of the rectangular region: top-right corner, bottom-right corner, top-left corner, and bottom-left corner in FIG. 6, respectively. The other various circuits are arranged in a manner similar to the arrangement of the circuits in core chips CC0 and CC2.

The layout pattern of core chips CC1 and CC3 arranged as described above is associated with symbol P2, which is obtained by converting symbol P1 shown in FIG. 4 in a mirror-symmetric manner with respect to the y-z plane, as shown in FIG. 6, for example. In other words, the layout pattern of core chips CC1 and CC3 matches the layout pattern of core chips CC0 and CC2 by the performance of the same conversion as the conversion from symbol P2 to symbol P1.

As shown in FIG. 7, the element layer 41 is provided on the upper surface of the semiconductor substrate 40 in accordance with the layout pattern associated with symbol P2, and the interconnect pattern associated with said layout pattern. In FIG. 7, the elements of the internal circuit, except for terminals T1a through T4a and terminals T1b through T4b, and logic circuits LGA and LGB, are omitted for the purpose of brevity.

In the semiconductor substrate 40, a plurality of vias (42-1, 42-2, 42-3, 42-4) functioning as TSVs are arranged. A plurality of bumps 43 (43-1, 43-2, 43-3, and 43-4) functioning as terminals T1b through T4b are arranged in the portions where vias 42-1 through 42-4 are exposed on the lower surface of the semiconductor substrate 40. On the upper surface of the element layer 41, a plurality of pads (44-1, 44-2, 44-3, 44-4) functioning as terminals T1a through T4a are arranged. The upper surface of the pad 44 is exposed on the upper surface of the element layer 41. Within the element layer 41, the logic element layers 45 and 46 functioning as the logic circuits LGA and LGB, and the interconnect layers 47 through 53 are arranged.

The interconnect layer 47 includes a first end provided on an upper end of the via 42-1, and a second end provided on a lower end of the pad 44-1. The interconnect layer 47 is coupled to the internal circuit, for example.

The interconnect layers 48 and 49 couple the via 42-2, the logic element layer 45, and the pad 44-2 with each other in accordance with an interconnect pattern different from that of the interconnect layers 28 and 29 shown in FIG. 5. Specifically, the interconnect layer 48 includes a first end provided on an upper end of the via 42-2, and a second end provided on an upper end of the logic element layer 45. The interconnect layer 48 is coupled to the internal circuit, for example. The interconnect layer 49 includes a first end provided on a lower end of the logic element layer 45, and a second end provided on a lower end of the pad 44-2. The logic element layer 45 includes the lower end having a function as an input terminal, and the upper end having a function as an output terminal. In other words, the logic element layer 45 functions as the logic circuit LGA that outputs signals input from the pad 44-2 to the bump 43-2.

The interconnect layers 50 and 51 couple the via 42-3, the logic element layer 46, and the pad 44-3 with each other in accordance with an interconnect pattern different from that of the interconnect layers 30 and 31 shown in FIG. 5. Specifically, the interconnect layer 50 includes a first end provided on an upper end of the via 42-3, and a second end provided on an upper end of the logic element layer 46. The interconnect layer 50 is coupled to the internal circuit, for example. The interconnect layer 51 includes a first end provided on a lower end of the logic element layer 46, and a second end provided on a lower end of the pad 44-3. The logic element layer 46 has the lower end having a function as an output terminal, and the upper end having a function as an input terminal. In other words, the logic element layer 46 functions as the logic circuit LGB that outputs signals input from the bump 43-3 to the pad 44-3.

The interconnect layer 52 includes a first end provided on an upper end of the via 42-4, and is coupled to the internal circuit, for example. The interconnect layer 53 includes a first end provided on a lower end of the pad 44-4, and is coupled to the internal circuit, for example.

As aforementioned, the layout patterns of core chips CC1 and CC3, and CC0 and CC2, are mirror-symmetric with respect to the y-z plane. For this reason, in the example shown in FIG. 7, the bump 43-1 and the pad 44-1 are respectively arranged at the positions located at distance d1 and d5 from the end in the negative x-axis direction (left end) of the semiconductor substrate 40. The bump 43-2 and the pad 44-2 are respectively arranged at the positions located at distance d2 and d6 from the left end of the semiconductor substrate 40. The bump 43-3 and the pad 44-3 are respectively arranged at the positions located at distance d3 and d7 from the left end of the semiconductor substrate 40. The bump 43-4 and the pad 44-4 are respectively arranged at the positions located at distance d4 and d8 from the left end of the semiconductor substrate 40.

With the above-described configuration, the chip design of core chips CC1 and CC3 includes a mirror-symmetric layout pattern of the layout pattern of core chips CC0 and CC2, and an interconnect pattern different from that of core chips CC0 and CC2.

1.1.4.3 Multi-Layered Structure of Core Chip Group

Figure 8:
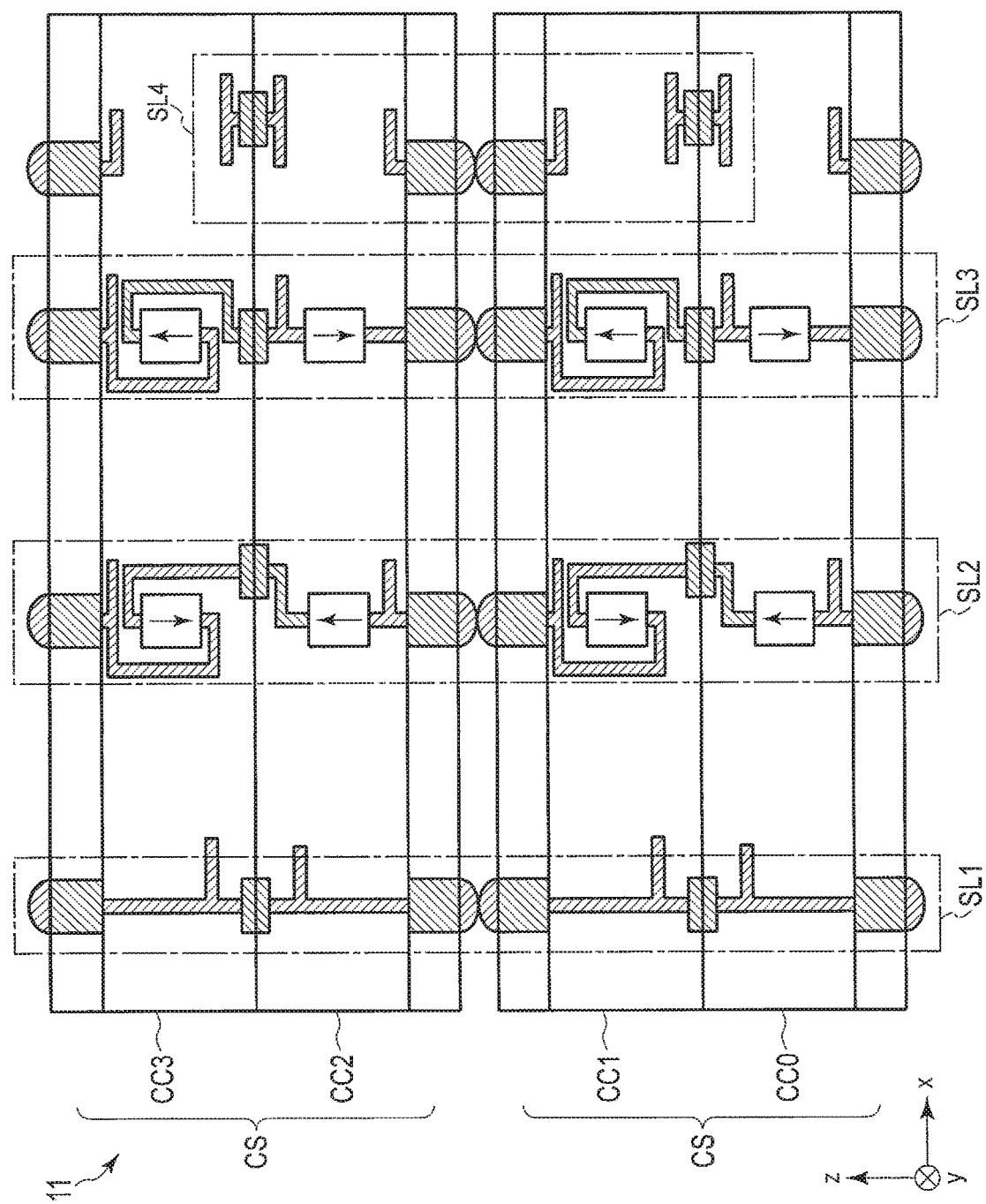
FIG. 8 is a cross-sectional view illustrating a core chip group of the semiconductor memory device according to the first embodiment.

Next, the multi-layered structure of the core chip group of the semiconductor memory device according to the first embodiment is described with reference to FIG. 8. FIG. 8 is a cross-sectional view explaining the multi-layered structure of the core chip group of the semiconductor memory device according to the first embodiment. FIG. 8 shows a structure in which core chips CC0 through CC3, shown in FIGS. 5 and 7, are stacked in this order.

As shown in FIG. 8, the upper surface of core chip CC0 is bonded to the upper surface of core chip CC1. As described above, the layout patterns of core chip CC0 and core chip CC1 are designed to be mirror-symmetric with respect to a plane where the upper surfaces are opposed to each other. For this reason, the positions of the pads 24-1 through 24-4 of core chip CC0 match the positions of the pads 44-1 through 44-4 of core chip CC1, respectively.

The lower surface of core chip CC1 is bonded to the lower surface of core chip CC2. As described above, the layout patterns of core chip CC1 and core chip CC2 are designed to be mirror-symmetric with respect to a plane where the upper surfaces are opposed to each other. For this reason, the positions of the pads 43-1 through 43-4 of core chip CC0 match the positions of the bumps 23-1 through 23-4 of core chip CC2, respectively.

The upper surface of core chip CC2 is bonded to the upper surface of core chip CC3. As described above, the layout patterns of core chip CC2 and core chip CC3 are designed to be mirror-symmetric with respect to a plane where the upper surfaces are opposed to each other. For this reason, the positions of the pads 24-1 through 24-4 of core chip CC2 match the positions of the pads 44-1 through 44-4 of core chip CC3, respectively.

With the above-described configuration, signal paths SL1 through SL4, capable of communicating with the elements of the internal circuit, can be formed in core chips CC0 through CC3. As described above, the interconnect pattern of core chips CC0 and CC2 differs from the interconnect pattern of core chips CC1 and CC3. For this reason, in signal path SL2, the input-output relationship corresponds between the logic element layer 25 and the logic element layer 45. In signal path SL3, the input-output relationship corresponds between the logic element layer 26 and the logic element layer 46.

In the descriptions hereinafter, like a pair of core chips CC0 and CC1 and a pair of core chips CC2 and CC3, a structure that includes two semiconductor substrates and in which the upper surfaces of the element layers are bonded to each other will be referred to as a "chip set CS". In the first embodiment, the chip set CS consisting of core chips CC0 and CC1 and the chip set CS consisting of core chips CC2 and CC3 have the same configuration.

1.2 Manufacturing Method

Next, a manufacturing method for the semiconductor memory device according to the first embodiment will be described.

1.2.1 Summary of Manufacturing Method

Figure 9:
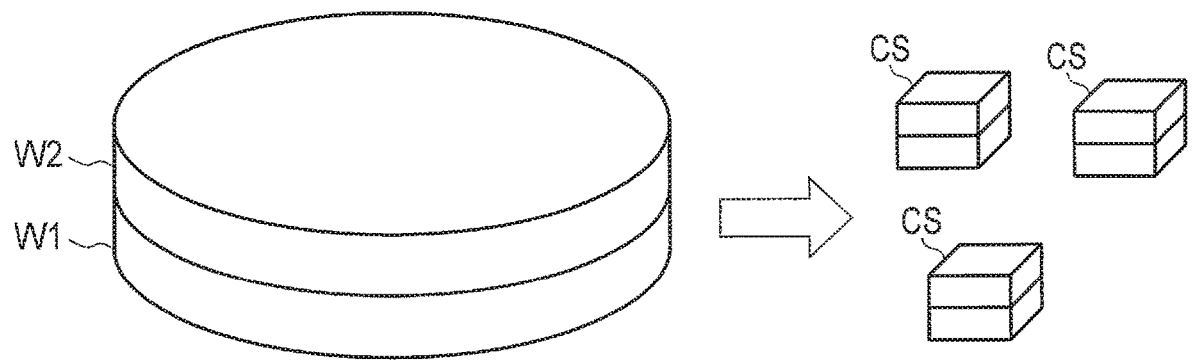
FIG. 9 is a schematic diagram illustrating a manufacturing method for the semiconductor memory device according to the first embodiment.
Figure 10:
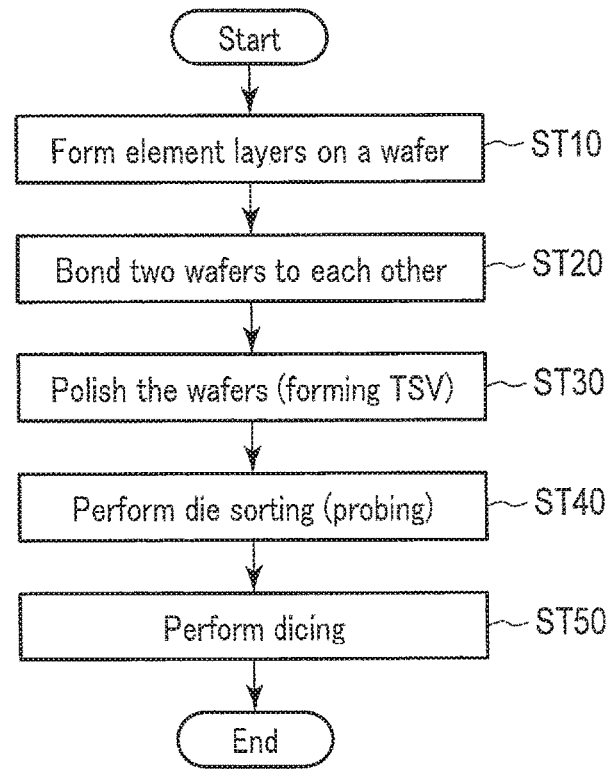
FIG. 10 is a flow chart illustrating the manufacturing method for the semiconductor memory device according to the first embodiment.

First, a summary of a manufacturing method for the semiconductor memory device according to the first embodiment is described. FIG. 9 is a schematic diagram explaining a summary of a manufacturing method for the semiconductor memory device according to the first embodiment. FIG. 10 is a flow chart explaining a manufacturing method for the semiconductor memory device according to the first embodiment.

As shown in FIG. 9, a plurality of chip sets CS are cut out from two wafers W1 and W2, which are bonded to each other. A summary of the cut-out process will be described below with reference to FIG. 10.

As shown in FIG. 10, in step ST10, the element layers 21 and 41 are transferred, through the technique of photolithography, on the upper surfaces of the wafers W1 and W2 with the use of a single mask set designed in advance. In other words, said single mask set may define a chip design (layout pattern and interconnect pattern) of core chips CC0 through CC3. In the descriptions hereinafter, in the two wafers W1 and W2, a portion corresponding to a single chip set CS will be referred to as a "chip set CS" even before being cut out from the wafers W1 and W2.

In step ST20, the wafers W1 and W2 in which element layers are formed are bonded to each other. Specifically, the wafers W1 and W2 are bonded to each other in such a manner that the element layers provided thereon are opposed to each other.

In step ST30, the lower surfaces of the bonded wafers W1 and W2 are polished. Specifically, one of the bonded wafers W1 or W2 (for example, the wafer W2) is caused to function as a supporting base, and the other (for example, the wafer W1) is polished. To polish the wafer W2, the wafer W2 may be fixed by a dummy semiconductor substrate that functions as a supporting base on the wafer W1 side. The dummy semiconductor substrate is removed after the polishing is finished or after the die sorting process (which will be described later), for example. As a result of the polishing, the lower ends of vias 22 and 42 are exposed on the polished surface of the wafers W1 and W2, respectively. The bumps 23 and 43 are provided at the portions where the vias 22 and 42 are exposed.

In step ST40, a defective core chip region is detected by the die sorting process. Specifically, a probe terminal of a die sorter is put (i.e., probing) on the bumps 23 or 43, which were provided in step ST20. It is then tested whether or not a desired communication can be performed. As a result of the probing, a chip set CS with which a desired communication is performed at all the probing positions is determined as a non-defective chip set from which no failures are detected. In contrast, a chip set CS that includes a portion in which a desired communication cannot be performed is determined to be a defective chip set from which a failure is detected.

In step ST50, the wafers W1 and W2 are divided into units of chip set CS by the die sorting process.

Thereafter, the chip sets CS determined to be non-defective in step ST40 are distinguished, and stacked. The core chip group 11 is thus provided. Manufacturing of the semiconductor memory device 3 is finished after the device is combined with an interface chip 10 that is separately manufactured.

1.2.2 Forming of Wafers

Figure 11:
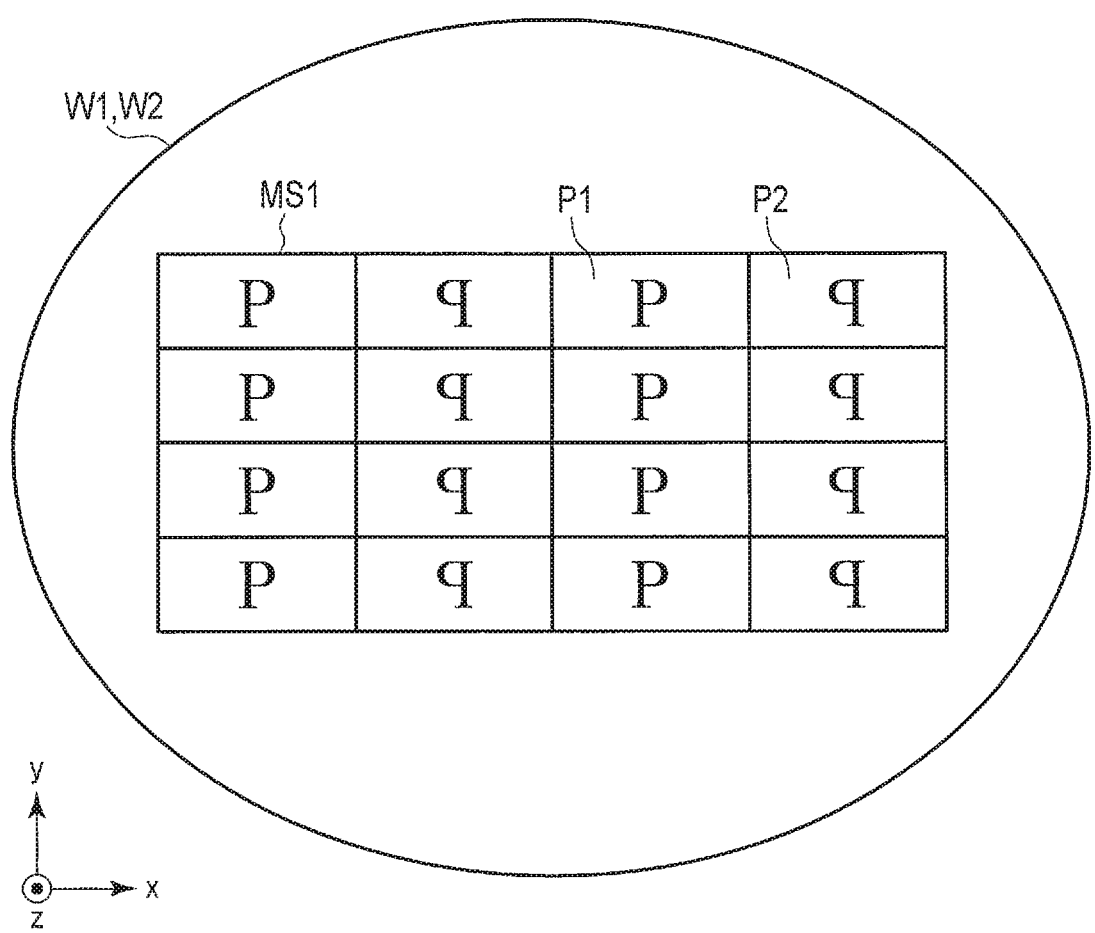
FIG. 11 is a schematic diagram illustrating the manufacturing method for the semiconductor memory device according to the first embodiment.

Next, of the manufacturing method for the semiconductor memory device according to the first embodiment, a method of forming an element layer on a wafer, and a method of bonding two wafers will be described. FIG. 11 is a schematic diagram explaining a method of forming an element layer on a wafer of the semiconductor memory device according to the first embodiment. FIG. 12 is a schematic diagram explaining a method of bonding two wafers of the semiconductor memory device according to the first embodiment. In other words, FIGS. 11 and 12 correspond to step ST10 and ST20 in FIG. 10, respectively.

FIGS. 11 and 12 schematically show a layout pattern, which is to be transferred to the wafers W1 and W2 with the use of the mask set MS1. Specifically, in FIGS. 11 and 12, the above-described layout pattern with reference to FIGS. 4 and 5 is indicated as symbol P1, and the above-described layout pattern with reference to FIGS. 6 and 7 is indicated as symbol P2. In the descriptions hereinafter, the layout pattern described with reference to FIGS. 4 and 5 will be referred to as "layout pattern P1", and the layout pattern described with reference to FIGS. 6 and 7 will be referred to as "layout pattern P2".

As shown in FIG. 11, the layout patterns P1 and P2 are alternately aligned along the x-axis direction in the mask set MS1. Furthermore, in the mask set MS1, the layout patterns are arranged in such a manner that different layout patterns are placed on the ends in the x-axis direction.

As shown in FIG. 12, the wafers W1 and W2, which are placed side by side along the x-axis direction on the x-y plane, are bonded in such a manner that the x-y plane is folded with respect to the yz-plane. Thus, as shown in FIG. 12, the area AreaA on the top-left corner of the wafer W1 on which the layout pattern P1 is transferred is bonded to the area AreaB on the top-right corner of the wafer W2 on which the layout pattern P2 is transferred. As to the other areas, an area on the wafer W1 to which the layout pattern P1 is transferred is similarly bonded to an area on the wafer W2 to which the layout pattern P2 is transferred, and an area on the wafer W1 to which the layout pattern P2 is transferred is similarly bonded to an area on the wafer W2 to which the layout pattern P1 is transferred.

In the mask set MS1, the layout patterns P1 and P2 are associated with the interconnect patterns shown in FIGS. 5 and 7, respectively. Through the bonding of the wafers W1 and W2 on which the above-described mask set MS1 is transferred, a plurality of structures that may function as a chip set CS described with reference to FIG. 8 can be obtained.

FIGS. 11 and 12 show an example of using a single mask set MS1; however, the present embodiment is not limited to this example. For example, different mask sets may be used between the wafers W1 and W2. Specifically, only the layout pattern P1 may be transferred to the wafer W1, and only the layout pattern P2 may be transferred to the wafer W2.

1.2.3 Die Sorting

Figure 13:
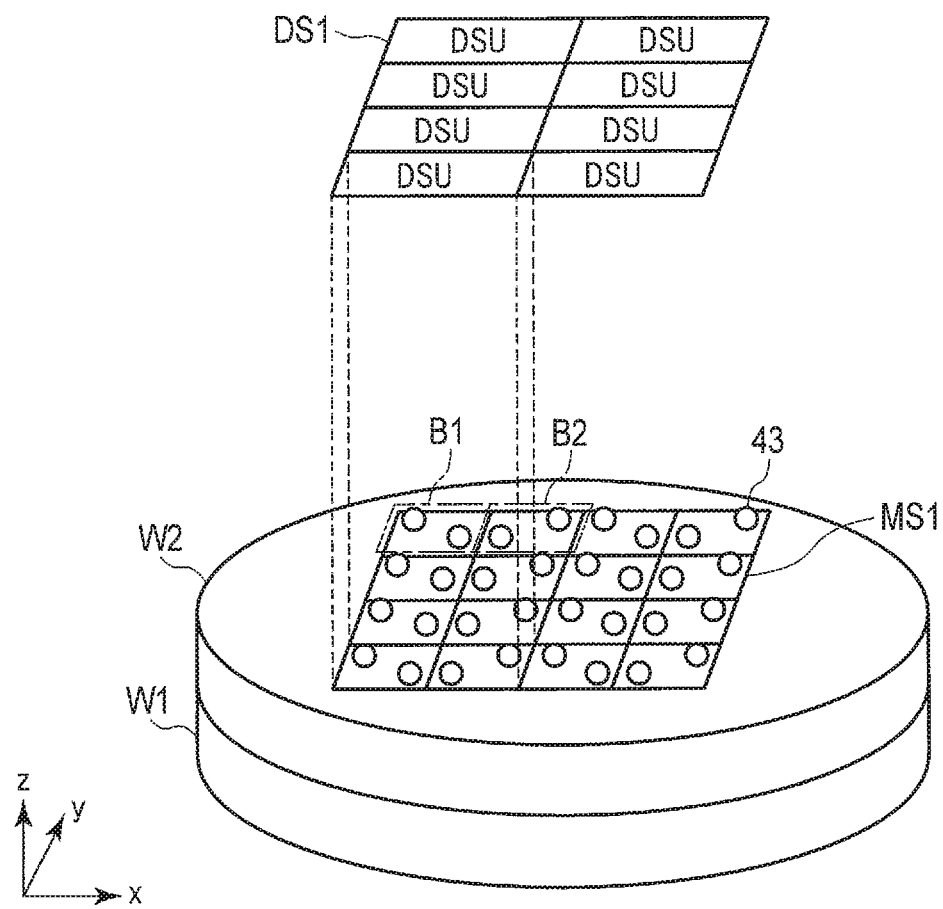
FIG. 13 is a schematic diagram illustrating the manufacturing method for the semiconductor memory device according to the first embodiment.

Next, of the manufacturing method for the semiconductor memory device according to the first embodiment, a method of die sorting is described. FIG. 13 is a schematic diagram explaining the probing process in the die sorting for the semiconductor memory device according to the first embodiment. In other words, FIG. 13 corresponds to step ST40 in FIG. 10.

As shown in FIG. 13, the die sorting of the wafer W2 is performed through, for example, bringing the probing terminal of the die sorter (not shown) into a contact with the bump 43 arranged on the lower surface of the wafer W2. As aforementioned, in the mask set MS1, the layout patterns P1 and P2 are alternately arranged in the x-axis direction. For this reason, on the lower surface of the wafer W2, the bumps 43, which are arranged in mutually-different arrangement patterns B1 and B2, are alternately arranged along the x-axis direction, in accordance with the mask set MS1. Specifically, the arrangement patterns B1 and B2 are mirror-symmetric with respect to the y-z plane. For this reason, a probing position applicable to the arrangement pattern B1 cannot be applied to the arrangement pattern B2. In the first embodiment, a repetition unit of the probing position DS1 of the die sorter (shown as "DSU" in FIG. 13) is defined as a pair of different layout patterns that are adjacent to each other with respect to the x-axis direction. In other words, the repetition unit DSU of the probing position DS1 of the die sorter corresponds to a pair of the arrangement patterns B1 and B2.

By the definition of the probing position DS1 of the die sorter as described above, the die sorting can be performed to the wafer W2 on which different layout patterns P1 and P2 are aligned along the x-axis direction, with the use of the repetition unit DSU of the probing position of a single die sorter.

Only the layout pattern P1 is transferred to the wafer W1, only the layout pattern P2 is transferred to the wafer W2, and the arrangement patterns of the bumps 43 arranged on the same wafer are the same throughout a chip set CS. For this reason, the size of the repetition unit DSU of the probing position of the die sorter to be applied to the same wafer can be half the size in the case of FIG. 13.

1.3 Advantageous Effects of First Embodiment

According to the first embodiment, it is possible to reduce the costs of manufacturing core chip groups. This advantageous effect will be described below.

As a structure of improving characteristics of a memory product, a structure including a core chip group in which core chips having TSV are stacked is known. Generally, a core chip group is formed by stacking core chips each obtained by dicing a single wafer, in such a manner that the upper surface of one core chip and the lower surface of another core chip are in contact with each other.

In the first embodiment, the upper surfaces of two wafers W1 and W2 are bonded in advance of dicing. A chip set CS can be obtained by dicing the bonded wafers W1 and W2 at the same time. A core chip group 11 is provided through stacking such chip sets CS. A portion corresponding to the wafer W1 and a portion corresponding to the wafer W2 in the chip set CS respectively function as a single core chip CC. It is thereby possible to layer four core chips CC every time two chip sets CS are stacked. Thus, steps required for the stacking process can be greatly reduced, compared to the case where the wafers W1 and W2 are diced one by one and core chips CC are then stacked. Manufacturing cost can be thus reduced.

Furthermore, two chip sets CS are coupled by the bumps. For this reason, two bumps can be treated as a single bump during the manufacturing process. It is thereby possible to control the size of the bumps required for coupling chip sets CS so that they are substantially under the size of a single bump. It is thus possible to reduce the height of a chip set group in a stacking direction, and reduce manufacturing cost.

In each of the wafers W1 and W2, an element layer is formed by the same mask set MS1. This mask set MS1 includes two different layout patterns P1 and P2. The layout patterns P1 and P2 are alternately arranged. For this reason, when the wafer W1 is bonded to the wafer W2, it is possible to bond the element layer on which the layout pattern P1 is transferred to the element layer on which the layout pattern P2 is transferred.

The cost required for designing a mask set MS1 is equivalent to the cost for designing the layout patterns P1 and P2. However, the layout patterns P1 and P2 are mirror-symmetric. For this reason, the cost for designing the layout pattern P1 is substantially included in the cost for designing the layout pattern P2. Thus, the design cost for the mask set MS1 can be suppressed to the level of the design cost for a single core chip CC.

As described above, the layout patterns P1 and P2 have a mirror-symmetric relationship. For this reason, when the wafer W1 is bonded to the wafer W2, the positions and purposes match between terminals T1b through T4b (provided on the wafer W1) and terminals T1a through T4a (provided on the wafer W2). It is thus possible to match the couplings between the wafers W1 and W2. When the wafer W1 is bonded to the wafer W2, the functions of the internal circuit of the core chip CC provided on the wafer W1, and the functions of the internal circuit of the core chip CC provided on the wafer W2 are positioned at the same location in the stacking direction. For this reason, the signals required in a core chip CC in the wafer W1 and those in the wafer W2 can be communicated on a single signal path. It is thereby possible to reduce the number of signal paths necessary to be provided.

In the portion on a wafer on which the layout pattern P1 is transferred and the portion on which the layout pattern P2 is transferred, the terminal positions are different therebetween. In the first embodiment, different positions for the probing terminal used for the die sorting process are applied to adjacent, mutually-different layout patterns P1 and P2. The arrangement of the terminals including these two different arrangements is defined as a repetition unit DSU. For this reason, even when the mutually-different layout patterns P1 and P2 are transferred to the same wafer, the die sorting process can be performed without trouble.

As aforementioned, since the layout patterns P1 and P2 are mirror-symmetric, the directions of the input and output terminals of the logic circuit become opposite when the wafers W1 and W2 are bonded. In the first embodiment, the layout patterns P1 and P2 are respectively associated with different interconnect patterns. Specifically, if an input terminal and an output terminal of a logic circuit are respectively coupled to a pad and a bump in one of the interconnect patterns, an input terminal and an output terminal of the logic circuit are respectively coupled to a bump and a pad in the other interconnect pattern. For this reason, it is possible to match the input-output relationship between a logic circuit provided within the wafer W1 and a logic circuit provided within the wafer W2 when said wafer W1 is bonded to said wafer W2.

1.4 Modifications of First Embodiment

The semiconductor memory device according to the first embodiment is not limited to the above-described example, and various modifications of the semiconductor memory device are possible.

For example, in the first embodiment, two layout patterns are described as mirror-symmetric patterns with respect to the y-z plane; however, the patterns may be mirror-symmetric with respect to the x-z plane.

FIG. 14 is a top view for explaining the layout pattern of the core chips of the semiconductor memory device according to a modification of the first embodiment. FIG. 14 shows a configuration common to core chips CC1 and CC3. Since the configuration of core chips CC0 and CC2 is the same as that in the first embodiment, descriptions are omitted.

As shown in FIG. 14, the layout pattern of core chips CC1 and CC3 is provided in the same rectangular region as in core chips CC0 and CC2. Furthermore, the layout pattern of core chips CC1 and CC3 and that of core chips CC0 and CC2 are mirror-symmetric with respect to the x-z plane. More specifically, planes 0 through 3 are arranged in four corners of the rectangular region: bottom-left corner, top-left corner, bottom-right corner, and top-right corner in FIG. 14, respectively. The other various circuits are arranged in a manner similar to the arrangement of the circuits in core chips CC0 and CC2.

The layout pattern of core chips CC1 and CC3 arranged as described above is associated with symbol P3, which is obtained by converting symbol P1 shown in FIG. 4 in a mirror-symmetric manner with respect to the x-z plane, as shown in FIG. 14, for example. In other words, the layout pattern of core chips CC1 and CC3 matches that of core chips CC0 and CC2 by the performance of the same conversion as the conversion from symbol P3 to symbol P1.

Next, of the manufacturing method for the semiconductor memory device according to the modification of the first embodiment, a method of forming an element layer on a wafer, and a method of bonding two wafers will be described.

Figure 15:
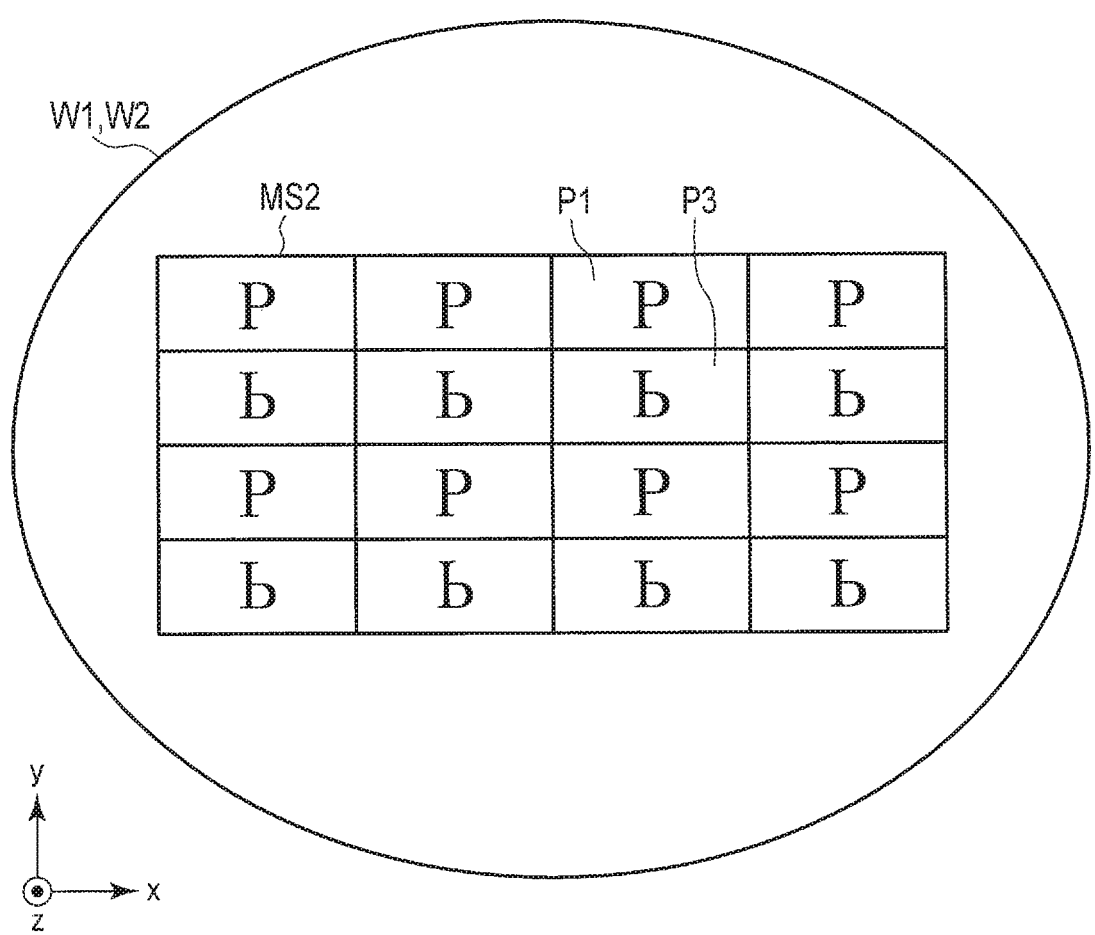
FIG. 15 is a schematic diagram illustrating the manufacturing method for the semiconductor memory device according to the modification of the first embodiment.
Figure 16:
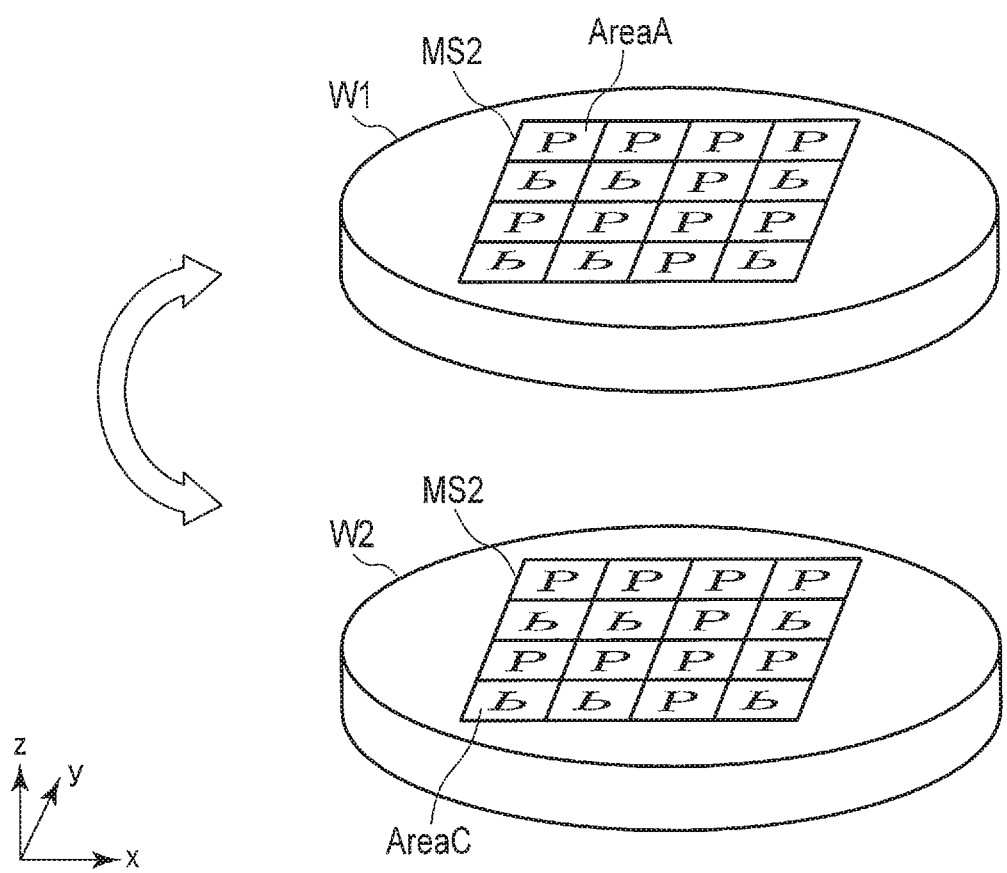
FIG. 16 is a schematic diagram illustrating a manufacturing method for the semiconductor memory device according to the modification of the first embodiment.

FIG. 15 is a schematic diagram explaining a method of forming an element layer on a wafer of the semiconductor memory device according to the modification of the first embodiment. FIG. 16 is a schematic diagram explaining a method of bonding two wafers of the semiconductor memory device according to the modification of the first embodiment. In other words, FIGS. 15 and 16 correspond to step ST10 and ST20 in FIG. 10.

FIGS. 15 and 16 schematically show a layout pattern to be transferred to the wafers W1 and W2 with the use of the mask set MS2. Specifically, in FIGS. 15 and 16, the above-described layout pattern with reference to FIG. 4 is indicated as symbol P1, and the above-described layout pattern with reference to FIG. 14 is indicated as symbol P3. In the descriptions hereinafter, the layout pattern described with reference to FIGS. 14 and 7 will be referred to as "layout pattern P3".

As shown in FIG. 15, the layout patterns P1 and P3 are alternately aligned along the y-axis direction in the mask set MS2. Furthermore, in the mask set MS2, the layout patterns are arranged in such a manner that different layout patterns are placed on the ends in the y-axis direction.

As shown in FIG. 16, the wafers W1 and W2, which are placed side by side along the y-axis direction on the x-y plane, are bonded in such a manner that the x-y plane is folded with respect to the x-z plane. Thus, as shown in FIG. 16, the area AreaA on the top-left corner of the wafer W1, on which the layout pattern P1 is transferred, is bonded to the area AreaC on the bottom-left corner of the wafer W2 on which the layout pattern P3 is transferred. As to the other areas, an area on the wafer W1 to which the layout pattern P1 is transferred is similarly bonded to an area on the wafer W2 to which the layout pattern P3 is transferred, and an area on the wafer W1 to which the layout pattern P3 is transferred is similarly bonded to an area on the wafer W2 to which the layout pattern P1 is transferred.

In the mask set MS2, the layout patterns P1 and P3 are associated with the interconnect patterns shown in FIGS. 5 and 7, respectively. Through the bonding of the wafers W1 and W2 on which the above-described mask set MS2 is transferred, a plurality of structures that may function as a chip set CS described with reference to FIG. 8 can be obtained.

Next, of the manufacturing method for the semiconductor memory device according to the modification of the first embodiment, a method of die sorting is described. FIG. 17 is a schematic diagram explaining the probing process in the die sorting for the semiconductor memory device according to the modification of the first embodiment. In other words, FIG. 17 corresponds to step ST40 in FIG. 10.

As aforementioned, in the mask set MS2, the layout patterns P1 and P3 are alternately arranged in the y-axis direction. For this reason, as shown in FIG. 17, on the lower surface of the wafer W2, the bumps 43, which are arranged in mutually-different arrangement patterns B1 and B3, are alternately arranged along the y-axis direction, in accordance with the mask set MS2. Since the arrangement patterns B1 and B3 are mirror-symmetric with respect to the x-z plane, the probing position applicable to the arrangement pattern B1 cannot be applied to the arrangement pattern B3. Thus, in the modification of the first embodiment, a repetition unit DSU of the probing position DS2 of the die sorter is defined as a pair of different layout patterns that are adjacent to each other with respect to the y-axis direction. In other words, the repetition unit DSU of the probing position DS2 of the die sorter corresponds to a pair of the arrangement patterns B1 and B3.

By the definition of the probing position DS2 of the die sorter as described above, the die sorting can be performed to the wafer W2 in which the layout patterns P1 and P3 are aligned in the y-axis direction, with the use of the repetition unit DSU of the probing position of the die sorter.

2. Second Embodiment

Next, a semiconductor memory device according to a second embodiment is described. The semiconductor memory device according to the first embodiment is designed in such a manner that the layout patterns of two core chips constituting a chip set are mirror-symmetric with respect to a plane where the upper surfaces of the core chips face each other. The semiconductor memory device according to the second embodiment is designed in such a manner that the layout patterns of two core chips constituting a chip set are the same. Hereinafter, the same constituent elements as those in the first embodiment will be referred to by the same reference symbols as those used in the first embodiment and the descriptions of those elements will be omitted, and differences between the first and second embodiments will be described.

2.1 Configuration

The configuration of the semiconductor memory device according to the second embodiment is described.

2.1.1 Coupling Between Core Chips

A coupling between the core chips of the semiconductor memory device according to the second embodiment is described with reference to FIG. 18. FIG. 18 is a circuit diagram explaining an example of a coupling between the core chips of the semiconductor memory device according to the second embodiment.

As shown in FIG. 18, each of core chips CC0 through CC3 includes terminals T1a, T4a, T5a, T6a, T7a, and T8a, and terminals T1b, T4b, T5b, T6b, T7b, and T8b. Each of core chips CC0 through CC3 further includes logic circuits LGA1, LGA2, LGB1, and LGB2. Since the couplings between terminals T1a and T1b and between terminals T4a and T4b are the same as those in the first embodiment, descriptions thereof are omitted.

Terminals T5a through T8a of core chip CC0 are coupled to the interface chip 10 or the controller 2, which are externally provided. Terminals T5b through T8b of core chip CC0 are coupled to terminals T5a through T8a of core chip CC1, respectively. Terminals T5b through T8b of core chip CC1 are coupled to terminals T5a through T5a of core chip CC2, respectively. Terminals T5b through T8b of core chip CC2 are coupled to terminals T5a through T8a of core chip CC3, respectively.

In each core chip CC, terminals T5a, T6a, T7a, and T8a are coupled to terminals T5b, T6b, T7b, and T8b respectively, via interconnects provided inside of the core chip CC. In core chips CC0 and CC2, the logic circuit LGA1 is provided on the interconnect between terminals T7a and T7b, and the logic circuit LGB1 is provided on the interconnect between terminals T8a and T8b. The logic circuit LGA1 includes an input terminal coupled to terminal T7a, and an output terminal coupled to terminal T7b. The logic circuit LGB1 includes an input terminal coupled to terminal T8b, and an output terminal coupled to terminal T8a. In core chips CC1 and CC3, the logic circuit LGA2 is provided on the interconnect between terminals T7a and T7b, and the logic circuit LGB2 is provided on the interconnect between terminals T8a and T8b. The logic circuit LGA2 includes an input terminal coupled to terminal T7a, and an output terminal coupled to terminal T7b. The logic circuit LGB2 includes an input terminal coupled to terminal T8b, and an output terminal coupled to terminal T8a.

With the above-described configuration, terminals T5a of core chip CC0 through T5b of core chip CC3, and terminals T6a of core chip CC0 through T6b of core chip CC3 respectively function as signal paths SL5 and SL6 capable of sending and receiving signals to and from core chips CC0 through CC3.

The signal path SL5 is coupled to the internal circuits in core chips CC0 and CC2, but cut off from the internal circuits in core chips CC1 and CC3 (goes through core chips CC1 and CC3). The signal path SL6 is coupled to the internal circuits in core chips CC1 and CC3, but goes through core chips CC0 and CC2. The internal circuits of the core chips CC thereby communicate signals with the controller 2 and the interface chip 10 via the signal path SL5 or SL6. The signal path SL1 in the second embodiment may be a power supply common to the core chips CC.

Terminal T7a of core chip CC0 through terminal T7b of core chip CC3 function as a signal path SL7 capable of sending, to core chip CC(n+1), signals which are subjected to computation by the logic circuit LGA1 or LGA2 of core chip CCn (n is 0≤n≤2). Terminal T8a of core chip CC0 through terminal T8b of core chip CC3 function as a signal path SL8 capable of sending, to core chip CCn, signals which are subjected to computation by the logic circuit LGB1 or LGB2 of core chip CC(n+1). Terminals T5a through T8a of core chip CC0 can send and receive various signals to and from the interface chip 10 or the controller 2.

The logic circuits LGA1 and LGA2 may differ from each other, or have the same configuration, and one of them need not substantially perform logic operations. Similarly, the logic circuits LGB1 and LGB2 may differ from each other, or have the same configuration, and one of them need not substantially perform logic operations. In other words, the signal path SL7 includes the signal path SL2, and the signal path SL8 includes the signal path SL3. The logic circuits LGA1, LGA2, LGB1, and LGB2 may be coupled to the internal circuits, but not necessarily.

2.1.2 Configuration of Core Chips

Next, the configuration of the core chips of the semiconductor memory device according to the second embodiment is described.

The top views of core chips CC0 through CC3 in the second embodiment are the same as those of core chips CC0 and CC2 shown in FIG. 4 in the first embodiment. It should be noted, however, that the arrangement of the terminals and logic circuits not shown in FIG. 4 is different between the layout pattern of the core chips CC in the second embodiment and the layout patterns of the core chips CC in the first embodiment.

Figure 19:
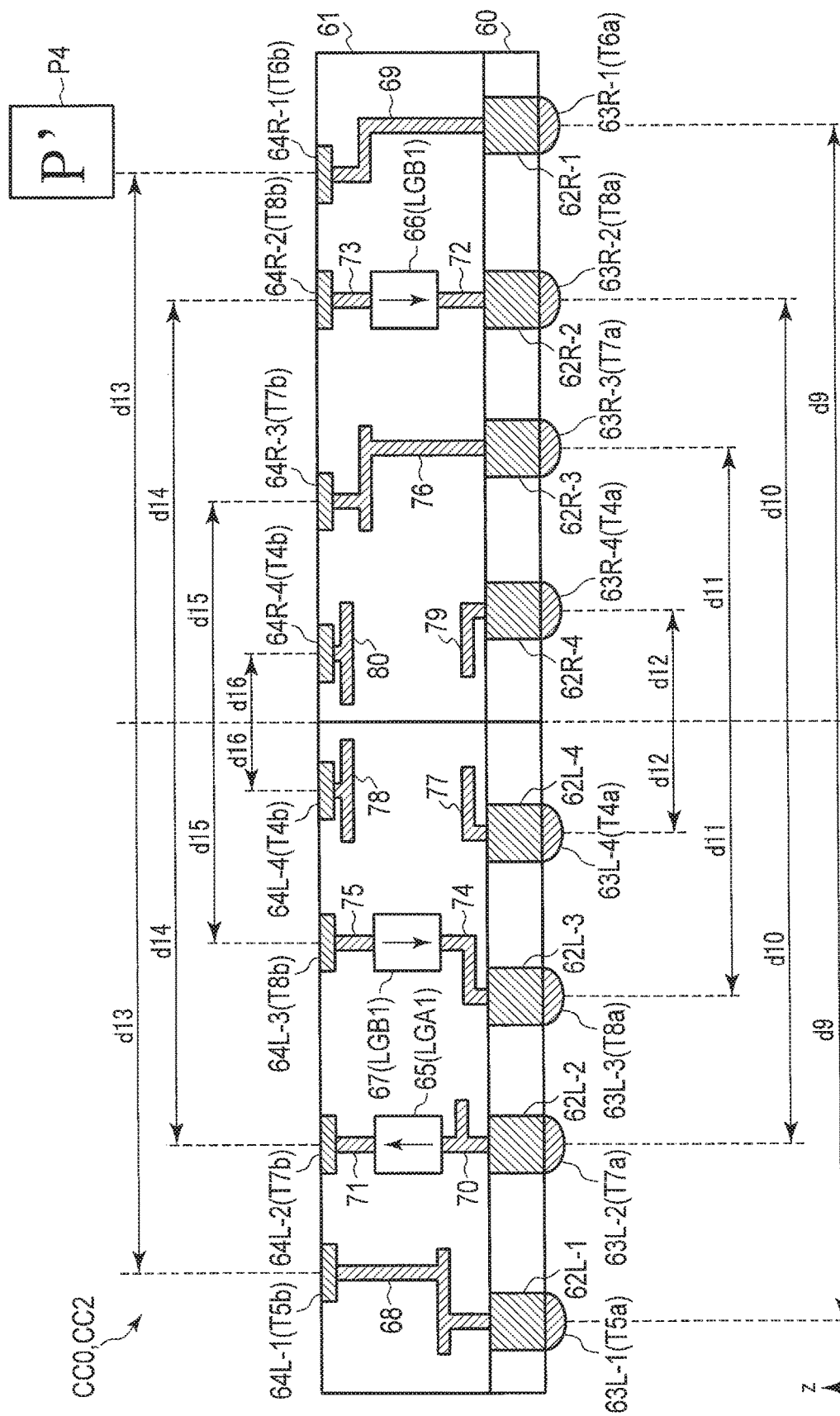
FIG. 19 is a cross-sectional view illustrating a configuration of a core chip of the semiconductor memory device according to the second embodiment.
Figure 20:
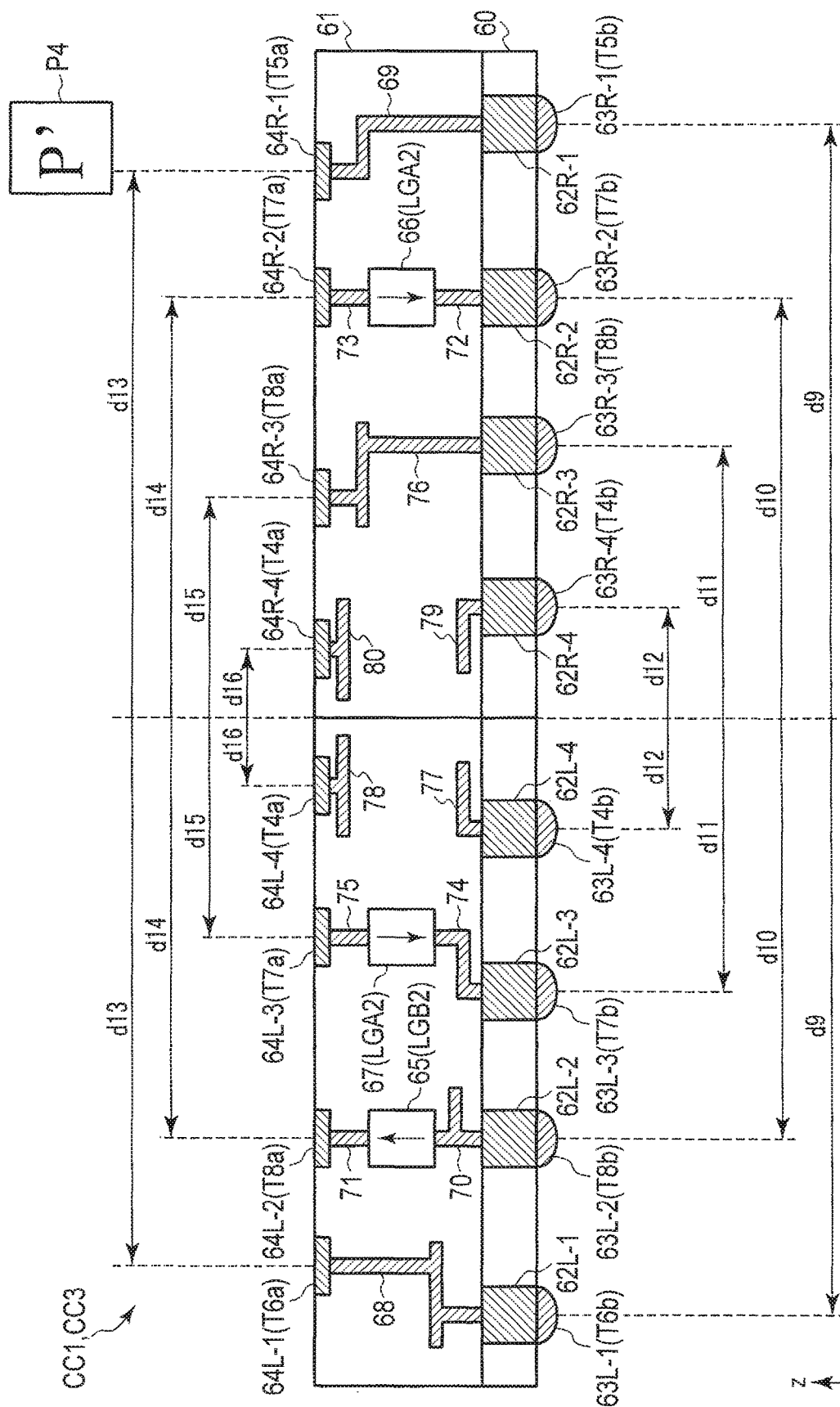
FIG. 20 is a cross-sectional view illustrating a configuration of a core chip of the semiconductor memory device according to the second embodiment.

FIGS. 19 and 20 are cross-sectional views for explaining the layout pattern and the interconnect pattern of the core chips of the semiconductor memory device according to the second embodiment. FIGS. 19 and 20 are the cross-sectional views taken in line V-V shown in FIG. 4. FIG. 19 shows the configuration common in core chips CC0 and CC2, and FIG. 20 shows the configuration common in core chips CC1 and CC3.

First, the configuration of core chips CC0 and CC2 is described.

The layout pattern shown in FIG. 19 is associated with symbol P4 differing from symbol. P1 shown in FIG. 4. As shown in FIG. 19, the element layer 61 is provided on the upper surface of the semiconductor substrate 60 in accordance with the layout pattern associated with symbol P4, and the interconnect pattern associated with said layout pattern. In FIG. 19, the elements of the internal circuit, except for terminals T5a through T8a and terminals T5b through T8b, and logic circuits LGA1 and LGB1, are omitted for the purpose of brevity.

On the semiconductor substrate 60, a plurality of vias 62L (62L-1, 62L-2, 62L-3, and 62L-4), and vias 62R (62R-1, 62R-2, 62R-3, and 62R-4) functioning as TSVs are provided.

In core chips CC0 and CC2, bumps 63L-1, 63L-2, 63L-3, and 63L-4 respectively functioning as terminals T5a, T7a, T8a, and T4a are arranged in the portions where vias 62L-1 through 62L-4 are exposed on the lower surface of the semiconductor substrate 60. Bumps 63R-1, 63R-2, 63R-3, and 63R-4 respectively functioning as terminals T6a, T8a, T7a, and T4a are arranged in the portions where vias 62R-1 through 62R-4 are exposed on the lower surface of the semiconductor substrate 60. On the upper surface of the element layer 61, a plurality of pads 64L (64L-1, 64L-2, 64L-3, 64L-4) functioning as terminals T5b, T7b, T8b, and T4b are arranged. On the upper surface of the element layer 61, a plurality of pads 64R (64R-1, 64R-2, 64R-3, 64R-4) functioning as terminals T6b, T8b, T7b, and T4b are arranged. The upper surface of the pad 64 is exposed on the upper surface of the element layer 61. Within each element layer 61, the logic element layers 65 through 67 respectively functioning as the logic circuits LGB1, LGA1, LGB1, and the interconnect layers 68 through 80 are arranged.

The interconnect layer 68 includes a first end provided on an upper end of the via 62L-1, and a second end provided on a lower end of the pad 64L-1. The interconnect layer 68 is coupled to the internal circuit, for example.

The interconnect layer 69 includes a first end provided on an upper end of the via 62R-1, and a second end provided on a lower end of the pad 64R-1. The interconnect layer 69 is not coupled to the internal circuits, and passes through the element layer 61, for example.

The interconnect layer 70 includes a first end provided on an upper end of the via 62L-2, and a second end provided on a lower end of the logic element layer 65. The interconnect layer 70 is coupled to the internal circuit, for example. The interconnect layer 71 includes a first end provided on an upper end of the logic element layer 65, and a second end provided on a lower end of the pad 64L-2. The logic element layer 65 includes the lower end having a function as an input terminal, and the upper end having a function as an output terminal. In other words, the logic element layer 65 functions as the logic circuit LGA1 that outputs signals input from the bump 63L-2 to the pad 64L-2.

The interconnect layer 72 includes a first end provided on an upper end of the via 62R-2, and a second end provided on a lower end of the logic element layer 66. The interconnect layer 73 includes a first end provided on an upper end of the logic element layer 66, and a second end provided on a lower end of the pad 64R-2. The interconnect layers 72 and 73 are not coupled to the internal circuits, and pass through the element layer 61, for example. The logic element layer 66 has the lower end having a function as an output terminal, and the upper end having a function as an input terminal. In other words, the logic element layer 66 functions as the logic circuit LGB1 that outputs signals input from the pad 64R-2 to the bump 63R-2.

The interconnect layer 74 includes a first end provided on an upper end of the via 62L-3, and a second end provided on a lower end of the logic element layer 67. The interconnect layer 75 includes a first end provided on an upper end of the logic element layer 67, and a second end provided on a lower end of the pad 64L-3. The interconnect layers 74 and 75 are not coupled to the internal circuits, and pass through the element layer 61, for example. The logic element layer 67 has the lower end having a function as an output terminal, and the upper end having a function as an input terminal. In other words, the logic element layer 67 functions as the logic circuit LGB1 that outputs signals input from the pad 64L-3 to the bump 63L-3.

The interconnect layer 76 includes a first end provided on an upper end of the via 62R-3, and a second end provided on a lower end of the pad 64R-3. The interconnect layer 76 is coupled to the internal circuit, for example.

The interconnect layer 77 includes a first end provided on an upper end of the via 62L-4, and is coupled to the internal circuit, for example. The interconnect layer 78 includes a first end provided on a lower end of the pad 64L-4, and is coupled to the internal circuit, for example.

The interconnect layer 79 includes a first end provided on an upper end of the via 62R-4, and is coupled to the internal circuit, for example. The interconnect layer 80 includes a first end provided on a lower end of the pad 64R-4, and is coupled to the internal circuit, for example.

In the example shown in FIG. 19, the bumps 63L and 63R are symmetrically arranged with respect to the center of the width in the x-axis direction of the semiconductor substrate 60 (hereinafter, simply expressed "the center of the semiconductor substrate 60"). Specifically, the bumps 63L-1 and 63R-1 are arranged at the positions located at a distance d9 from the center of the semiconductor substrate 60. The bumps 63L-2 and 63R-2 are arranged at the positions located at a distance d10 from the center of the semiconductor substrate 60. The bumps 63L-3 and 63R-3 are arranged at the positions located at a distance d11 from the center of the semiconductor substrate 60. The bumps 63L-4 and 63R-4 are arranged at the positions located at a distance d12 from the center of the semiconductor substrate 60.

The pads 64L and 64R are symmetrically arranged with respect to the center of the semiconductor substrate 60. Specifically, the pads 64L-1 and 64R-1 are arranged at the positions located at a distance d13 from the center of the semiconductor substrate 60. The pads 64L-2 and 64R-2 are arranged at the positions located at a distance d14 from the center of the semiconductor substrate 60. The pads 64L-3 and the pad 64R-3 are arranged at the positions located at a distance d15 from the center of the semiconductor substrate 60. The pads 64L-4 and the pad 64R-4 are arranged at the positions which are located at a distance d16 from the center of the semiconductor substrate 60.

The distances for each ensuing bracketed pair, (d9, d13), (d10, d14), (d11, d15), and (d12, d16) may be either the same or different.

Next, the configuration of core chips CC1 and CC3 is described.

As shown in FIG. 20, the layout pattern of core chips CC1 and CC3 matches the layout pattern of core chips CC0 and CC2. In other words, the layout pattern of core chips CC1 and CC3 is associated with symbol P4.

For this reason, in core chips CC1 and CC3, the bumps 63L and 63R are symmetric with respect to the center of the semiconductor substrate 60, and are provided at the same positions as those of the bumps 63L and 63R of core chips CC0 and CC2. In core chips CC1 and CC3, the pads 64L and 64R are symmetric with respect to the center of the semiconductor substrate 60, and are provided at the same positions as those of the pads 64L and 64R of core chips CC0 and CC2.

In core chips CC1 and CC3, the functions of the bump 63, the pad 64, and the logic element layers 65 through 67 are different from the functions of those in core chips CC0 and CC2.

Specifically, in core chips CC1 and CC3, the bumps 63L-1 through 63L-4 function as terminals T6b, T8b, T7b, and T4b, respectively. The bumps 63R-1 through 63R-4 function as terminals T5b, T7b, T8b, and T4b, respectively. The pads 64L-1 through 64L-4 function as terminals T6a, T8a, T7a, and T4a, respectively. The pads 64R-1 through 64R-4 function as terminals T5a, T7a, T8a, and T4a, respectively. The logic element layers 65 through 67 function as the logic circuits LGB2, LGA2, and LGA2, respectively.

With the above-described configuration, the chip design of core chips CC1 and CC3 includes the same layout pattern and interconnect pattern as those of core chips CC0 and CC2. In other words, core chips CC0 through CC3 include the same chip design.

2.1.3 Multi-Layered Structure of Core Chip Group

Figure 21:
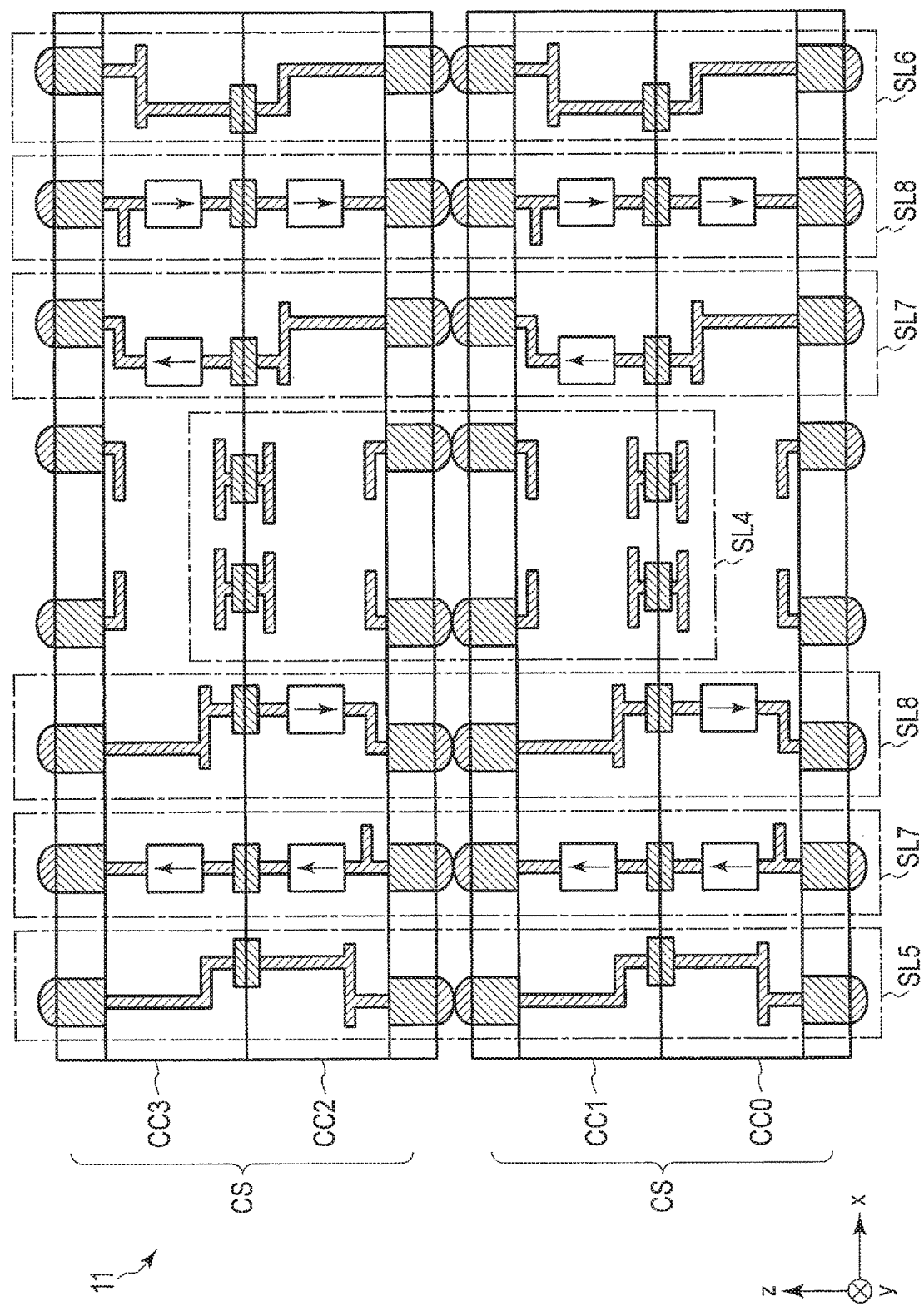
FIG. 21 is a cross-sectional view illustrating a core chip group of the semiconductor memory device according to the second embodiment.

Next, the multi-layered structure of the core chip group of the semiconductor memory device according to the second embodiment is described with reference to FIG. 21. FIG. 21 is a cross-sectional view explaining the multi-layered structure of the core chip group of the semiconductor memory device according to the second embodiment. FIG. 21 shows a structure in which core chips CC0 through CC3, which are shown in FIGS. 19 and 20, are stacked in this order.

As shown in FIG. 21, the upper surfaces of core chips CC0 and CC2 are bonded to the upper surfaces of core chips CC1 and CC3, respectively. The lower surface of core chip CC1 is bonded to the lower surface of core chip CC2.

As described above, in core chips CC0 through CC4, the bumps 63L and 63R are symmetrically arranged with respect to the center of the semiconductor substrate 60. The pads 64L and 64R are symmetrically arranged with respect to the center of the semiconductor substrate 60. For this reason, the positions of the pads 64L-1 through 64L-4 and 64R-1 through 64R-4 of core chips CC0 and CC2 match the positions of the pads 64L-1 through 64L-4 and 64R-1 through 64R-4 of core chips CC1 and CC3. The positions of the bumps 63L-1 through 63L-4 and 63R-1 through 63R-4 of core chip CC1 match the positions of the bumps 63L-1 through 63L-4 and 63R-1 through 63R-4 of core chip CC2.

With the above-described configuration, the signal paths SL4 through SL8, capable of communicating with each other, can be formed in core chips CC0 through CC3.

2.2 Manufacturing Method

Next, a manufacturing method for the semiconductor memory device according to the second embodiment will be described.

2.2.1 Forming of Wafers

Of the manufacturing method for the semiconductor memory device according to the second embodiment, a forming method for an element layer on a wafer, and a method of bonding two wafers will be described.

FIG. 22 is a schematic diagram explaining a method of forming an element layer on a wafer of the semiconductor memory device according to the second embodiment. FIG. 22 corresponds to step ST10 in FIG. 10.

FIG. 22 schematically shows a layout pattern, which is to be transferred to the wafers W1 and W2 with the use of the mask set MS3.

In the second embodiment, as described above, core chips CC0 through CC3 are formed in accordance with the same chip design. For this reason, as shown in FIG. 22, the layout pattern P4 is uniformly aligned in the mask set MS3. The wafers W1 and W2, which are arranged side by side along the x-axis direction on the x-y plane, may be bonded in such a manner that the x-y plane is folded with respect to the y-z plane, similarly to the manner shown in FIG. 12 illustrating the first embodiment; or, if the wafers W1 and W2 are arranged side by side along the y-axis direction on the x-y plane, the may be bonded in such a manner that the x-y plane is folded with respect to the x-z plane, similarly to the manner shown in FIG. 16 illustrating the modification of the first embodiment.

Through the bonding of the wafers W1 and W2 on which the mask set MS3 is transferred as described above, a plurality of structures that may function as a chip set CS described with reference to FIG. 21 can be obtained.

2.2.2 Die Sorting

Next, of the manufacturing method for the semiconductor memory device according to the second embodiment, a method of die sorting is described. FIG. 23 is a schematic diagram explaining the probing process in the die sorting for the semiconductor memory device according to the second embodiment. In other words, FIG. 23 corresponds to step ST40 in FIG. 10.

As shown in FIG. 23, the die sorting of the wafer W2 is performed through, for example, bringing the probing terminal of the die sorter (not shown) into a contact with the bump 63 arranged on the lower surface of the wafer W2. As described above, the same layout pattern P4 is uniformly arranged in the mask set MS3. For this reason, on the lower surface of the wafer W2, the bumps 63, which are arranged in an arrangement pattern B4 corresponding to the layout pattern P4, are uniformly arranged in accordance with the mask set MS3. Thus, in the second embodiment, a repetition unit DSU of the probing position DS3 of the die sorter is defined as a single layout pattern. In other words, the repetition unit DSU of the probing position DS3 of the die sorter corresponds to the arrangement pattern B4.

By the definition of the probing position DS3 of the die sorter as described above, the die sorting can be performed to the wafer W2 in which the same chip design is aligned, with the use of the repetition unit DSU of the probing position of the die sorter.

2.3 Advantageous Effects of Second Embodiment

In the second embodiment, an element layer is formed in each of the wafers W1 and W2 by the same mask set MS3. In this mask set MS3, the same chip design is uniformly aligned. Thus, the mask set MS3 can be designed only by designing a layout pattern and an interconnect pattern of a single core chip CC. Manufacturing cost can be thus reduced.

According to the layout pattern in the second embodiment, the bumps 63 and the pads 64 are symmetrically arranged with respect to the center of the semiconductor substrate 60. For this reason, the positions of the terminals match when the wafers W1 and W2 are bonded. It is thus possible to match the couplings between the wafers W1 and W2.

In the second embodiment, when the wafer W1 is bonded to the wafer W2, the functions of the internal circuit of the core chip CC0 provided on the wafer W1 and the functions of the internal circuit of the core chip CC provided on the wafer W2 are positioned at different locations in the stacking direction. For this reason, there is a possibility that the signals required in a core chip CC in the wafer W1 and those in the wafer W2 are not communicated on a single signal path. For this reason, in the second embodiment, the signal path SL5 coupled to the internal circuits of core chips CC0 and CC2 and the signal path SL6 coupled to the internal circuits of core chips CC1 and CC3 are provided. In other words, in the signal path SL5, signals are sent and received to and from core chips CC0 and CC2, and the signals pass through core chips CC1 and CC3. In the signal path SL6, signals are sent and received to and from core chips CC1 and CC3, and the signals pass through core chips CC0 and CC2. Although the number of signals paths provided on the wafers W1 and W2 may be increased, it is thus possible to send or receive desired signals to or from each core chip CC with the use of the same chip design.

2.4 First Modification of Second Embodiment

The semiconductor memory device according to the second embodiment is not limited to the above-described example, and various modifications of the semiconductor memory device are possible.

In the second embodiment, the example in which the same core chip design is applied to core chips CC0 and CC1; however, the present embodiment is not limited to this example. For example, the same layout pattern may be applied but different interconnect patterns may be applied to core chips CC0 and CC1. Such a case may be adopted when the logic circuits that are symmetrically arranged within a single core chip CC may input/output signals in the same direction.

Figure 24:
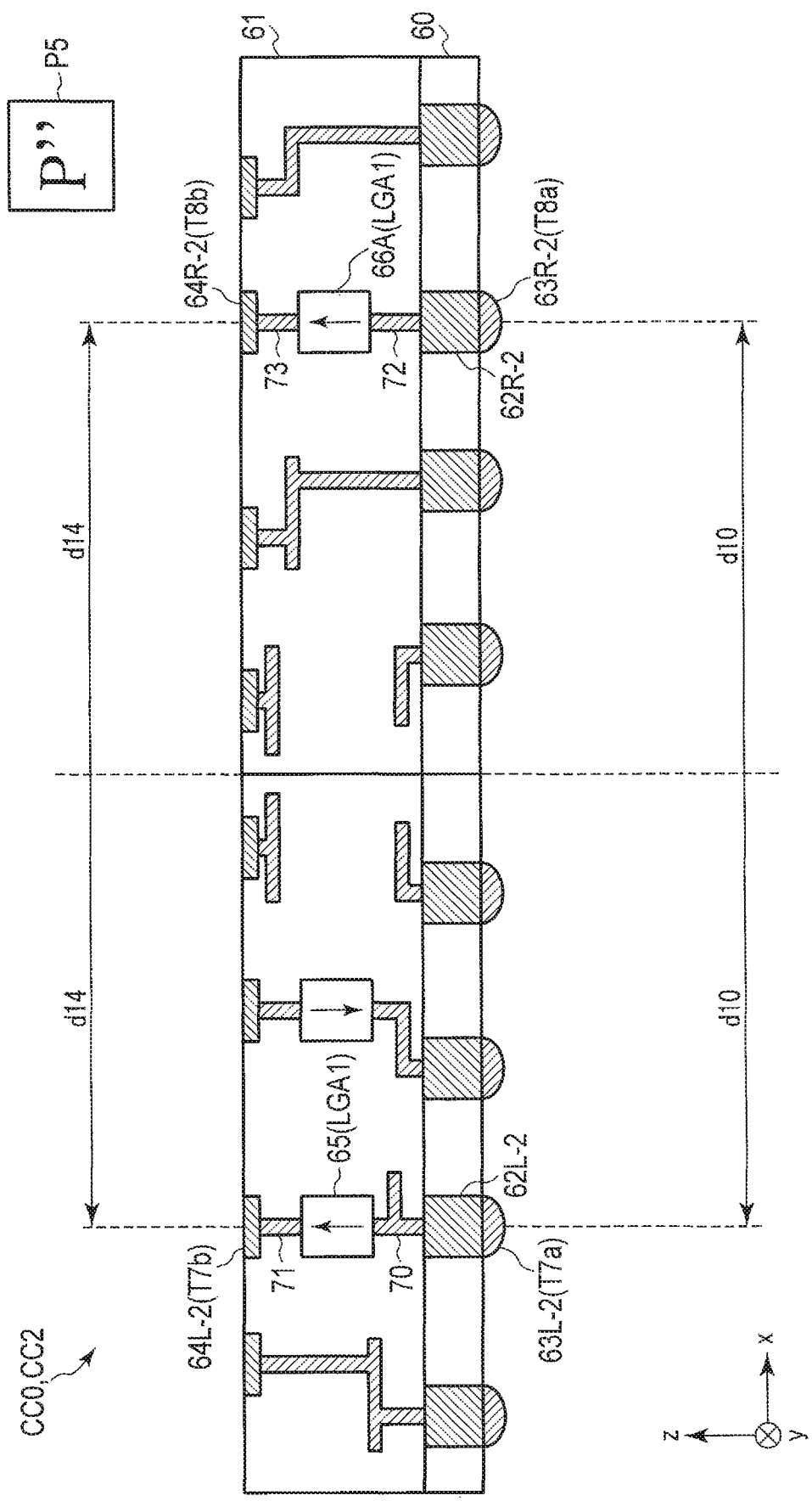
FIG. 24 is a cross-sectional view illustrating a configuration of a core chip of a semiconductor memory device according to a first modification of the second embodiment.

FIGS. 24 and 25 are cross-sectional views for explaining the layout pattern and the interconnect pattern of the core chips of the semiconductor memory device according to the first modification of the second embodiment. FIG. 24 shows the configuration common in core chips CC0 and CC2, and FIG. 25 shows the configuration common in core chips CC1 and CC3.

The layout pattern shown in FIG. 24 is associated with symbol P5 differing from symbol P4 shown in FIG. 19. As shown in FIG. 24, in the first modification of the second embodiment, core chips CC0 and CC2 include a logic element layer 66A, instead of the logic element layer 66. In other words, the interconnect layer 72 includes a first end provided on the upper end of the via 62R-2, and a second end provided on a lower end of the logic element layer 66A. The interconnect layer 73 includes a first end provided on an upper end of the logic element layer 66A, and a second end provided on the lower end of the pad 64R-2. The logic element layer 66A includes the lower end having a function as an input terminal, and the upper end having a function as an output terminal. In other words, the logic element layer 66A functions as the logic circuit LGA1 that outputs signals input from the bump 63R-2 to the pad 64R-2.

As shown in FIG. 25, the layout pattern of core chips CC1 and CC3 is associated with symbol P5, similar to core chips CC0 and CC2. However, core chips CC1 and CC3 include different layout patterns from those for core chips CC0 and CC2. Specifically, core chips CC1 and CC3 include interconnect layers 70A through 73A, instead of the interconnect layers 70 through 73.

The interconnect layer 70A includes a first end provided on the upper end of the via 62L-2, and a second end provided on the upper end of the logic element layer 65. The interconnect layer 71A includes a first end provided on the lower end of the logic element layer 65, and a second end provided on the lower end of the pad 64L-2. In other words, the logic element layer 65 functions as the logic circuit LGA2 that outputs signals input from the pad 64L-2 to the bump 63L-2.

The interconnect layer 72A includes a first end provided on the upper end of the via 62R-2, and a second end provided on the upper end of the logic element layer 66A. The interconnect layer 73A includes a first end provided on the lower end of the logic element layer 66A, and a second end provided on the lower end of the pad 64R-2. In other words, the logic element layer 66A functions as the logic circuit LGA2 that outputs signals input from the pad 64R-2 to the bump 63R-2.

Figure 26:
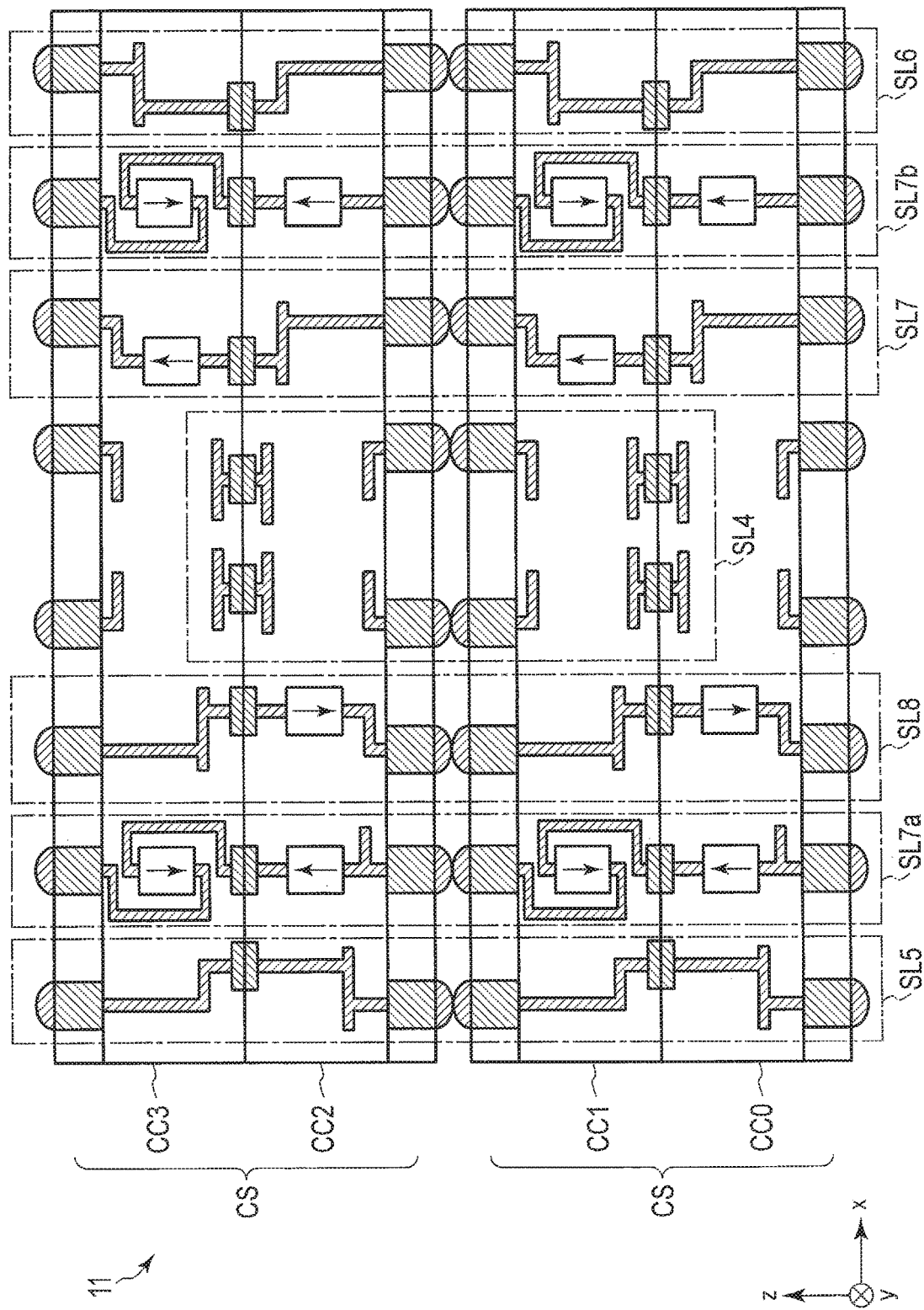
FIG. 26 is a cross-sectional view illustrating a core chip group of the semiconductor memory device according to the first modification of the second embodiment.

FIG. 26 is a cross-sectional view explaining the multi-layered structure of the core chip group of the semiconductor memory device according to the first modification of the second embodiment. As shown in FIG. 26, in the signal paths SL7a and SL7b, the positions of the input and output terminals of the logic element layers are inverted between core chips CC0 and CC2 and core chips CC1 and CC3. To match the input-output relationship between the logic element layers, in the signal paths SL7a and SL7b, core chips CC1 and CC3 have a different interconnect pattern from that for core chips CC0 and CC2. Specifically, in core chips CC0 and CC2, the input and output terminals of the logic element layer 65 are respectively coupled to the bump 63L-2 and the pad 64L-2; on the other hand, in core chips CC1 and CC3, the input and output terminals of the logic element layer 66A are respectively coupled to the pad 64R-2 and the bump 63R-2. In core chips CC0 and CC2, the input and output terminals of the logic element layer 66A are respectively coupled to the bump 63R-2 and the pad 64R-2; on the other hand, in core chips CC1 and CC3, the input and output terminals of the logic element layer 65 are respectively coupled to the pad 64L-2 and the bump 63L-2.

With the above-described configuration, the input-output relationships between the signal paths can match even when the same logic circuits are symmetrically arranged within a core chip CC.

Figure 27:
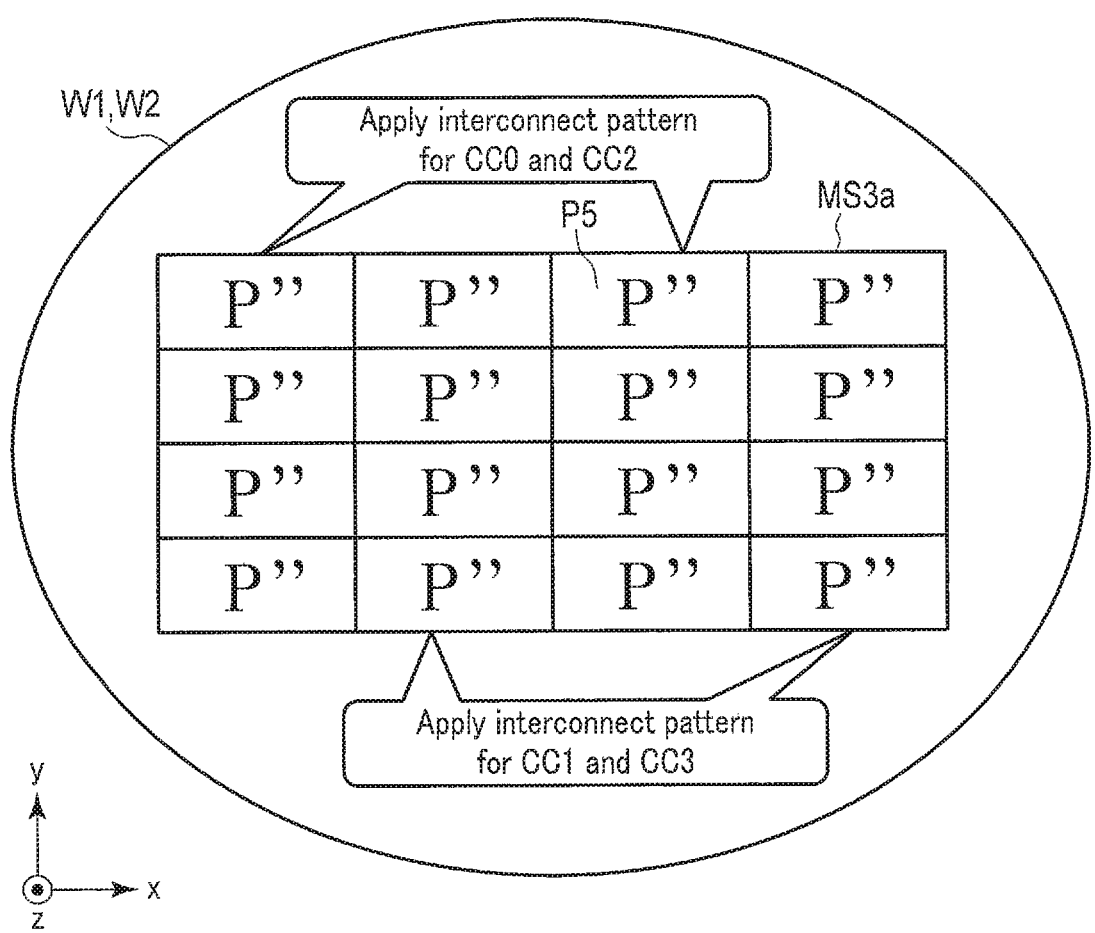
FIG. 27 is a schematic diagram illustrating a manufacturing method for the semiconductor memory device according to the first modification of the second embodiment.

Next, of the manufacturing method for the semiconductor memory device according to the first modification of the second embodiment, a forming method for an element layer on a wafer will be described. FIG. 27 is a schematic diagram explaining a forming method for an element layer on a wafer of the semiconductor memory device according to the first modification of the second embodiment. In the descriptions hereinafter, the layout patterns of core chips CC0 through CC3, described with reference to FIGS. 24 and 25, will be referred to as "layout pattern P5".

As shown in FIG. 27, the layout pattern P5 is alternately aligned in the mask set MS3a. In the example shown in FIG. 27, in the mask set MS3a, the layout pattern P5 corresponding to the interconnect pattern for core chips CC0 and CC2 and the layout pattern P5 corresponding to the interconnect pattern for core chips CC1 and CC3 are alternately aligned with respect to the x-direction. Furthermore, in the mask set MS3a, the lay out patterns are arranged in such a manner that different interconnect patterns are placed on the ends in the x-axis direction. Similar to FIG. 12 in the first embodiment, the wafers W1 and W2, which are placed side by side along the x-axis direction on the x-y plane, are bonded in such a manner that the x-y plane is folded with respect to the y-z plane.

Through the bonding of the wafers W1 and W2 on which the above-described mask set MS3 is transferred, a plurality of structures that may function as a chip set CS described with reference to FIG. 26 can be obtained.

The manufacturing method according to the first modification of the second embodiment is not limited to the example where a single mask set which includes mutually-different interconnect patterns; rather, it may use two mask sets which include different interconnect patterns.

Figure 28:
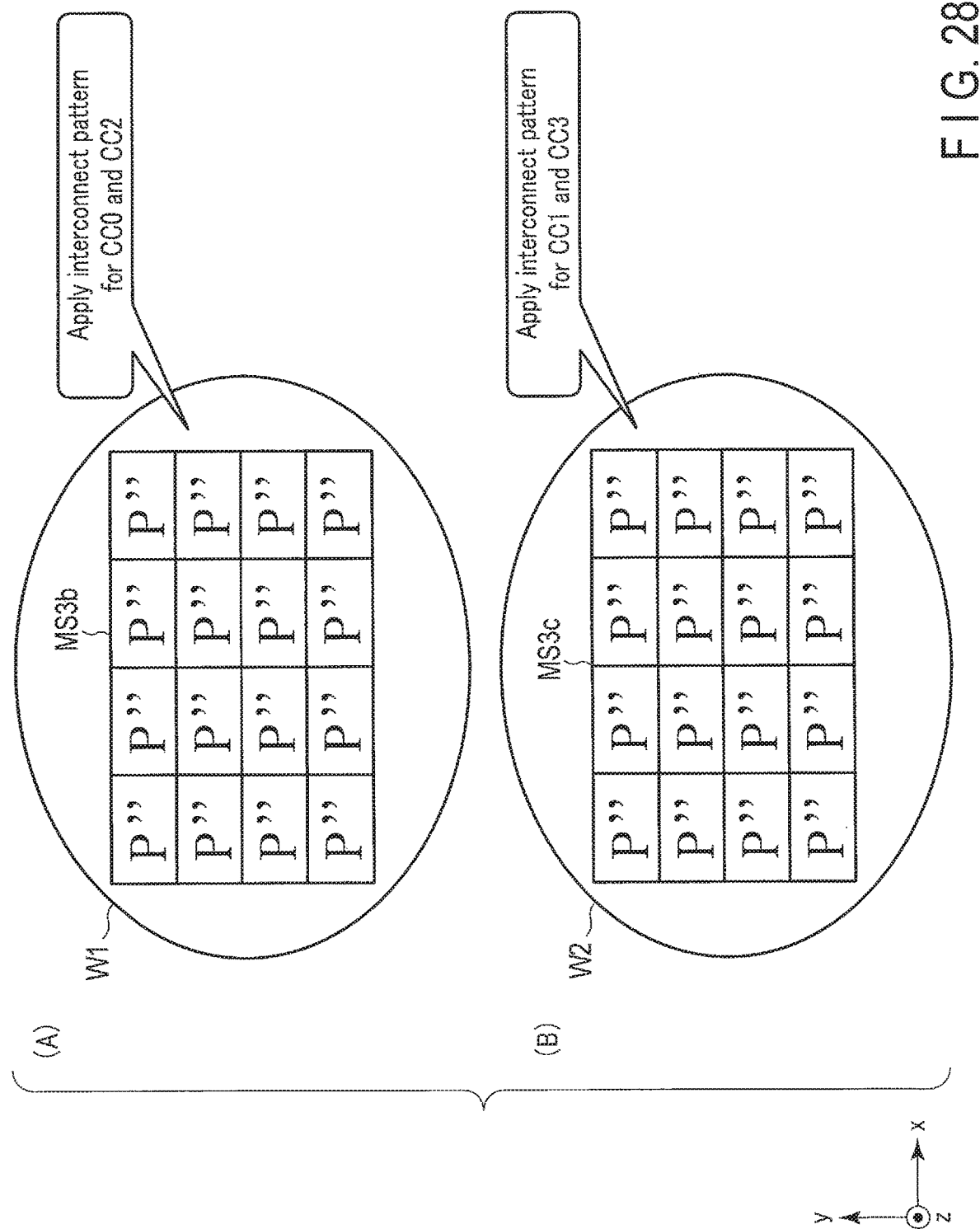
FIG. 28 is a schematic diagram illustrating the manufacturing method for the semiconductor memory device according to the first modification of the second embodiment.

FIG. 28 is a schematic diagram explaining a forming method for an element layer on a wafer of the semiconductor memory device according to the first modification of the second embodiment. As shown in FIG. 28, the mask sets MS3b and MS3c may be applied to the wafers W1 and W2, respectively.

Specifically, as shown in FIG. 28(A), the layout pattern P5 corresponding to the interconnect pattern for core chips CC0 and CC2 are uniformly aligned in the mask set MS3b. As shown in FIG. 28(B), the layout pattern P5 corresponding to the interconnect pattern for core chips CC1 and CC3 are uniformly aligned in the mask set MS3c.

Through the bonding of the wafer W1 to the wafer W2, on which the above-described mask set MS3b and mask set MS3c are transferred respectively, a plurality of structures that may function as a chip set CS described with reference to FIG. 26 can be obtained.

3. Third Embodiment

Next, a semiconductor memory device according to a third embodiment is described. In the semiconductor memory device according to the second embodiment, the bumps are symmetrically arranged in the core chip CC. The semiconductor memory device according to the third embodiment differs from that of the second embodiment in that the bumps are not symmetrically arranged in the core chip CC. The semiconductor memory device of the second embodiment is designed so as to have the same layout pattern between the chip sets; in contrast, the semiconductor memory device of the third embodiment uses different layout patterns between two chip sets. Specifically, two mutually-different layout patterns are designed to be mirror-symmetric. Hereinafter, the same constituent elements as those in the second embodiment will be referred to by the same reference symbols as those used in the second embodiment and the descriptions of those elements will be omitted. Differences between the second and third embodiments will be described.

3.1 Configuration

The configuration of the semiconductor memory device according to the third embodiment is described.
3.1.1 Configuration of Core Chips Next, the configuration of the core chips of the semiconductor memory device according to the third embodiment is described.

FIGS. 29 through 32 are cross-sectional views for explaining the layout pattern and the interconnect pattern of the core chips of the semiconductor memory device according to the third embodiment. FIGS. 29 through 32 show the configurations of core chips CC0 through CC3, respectively. As described above, in the third embodiment, the layout pattern of core chips CC0 and CC1 differs from the interconnect pattern of core chips CC2 and CC3.

First, core chip CC0 is explained.

Figure 29:
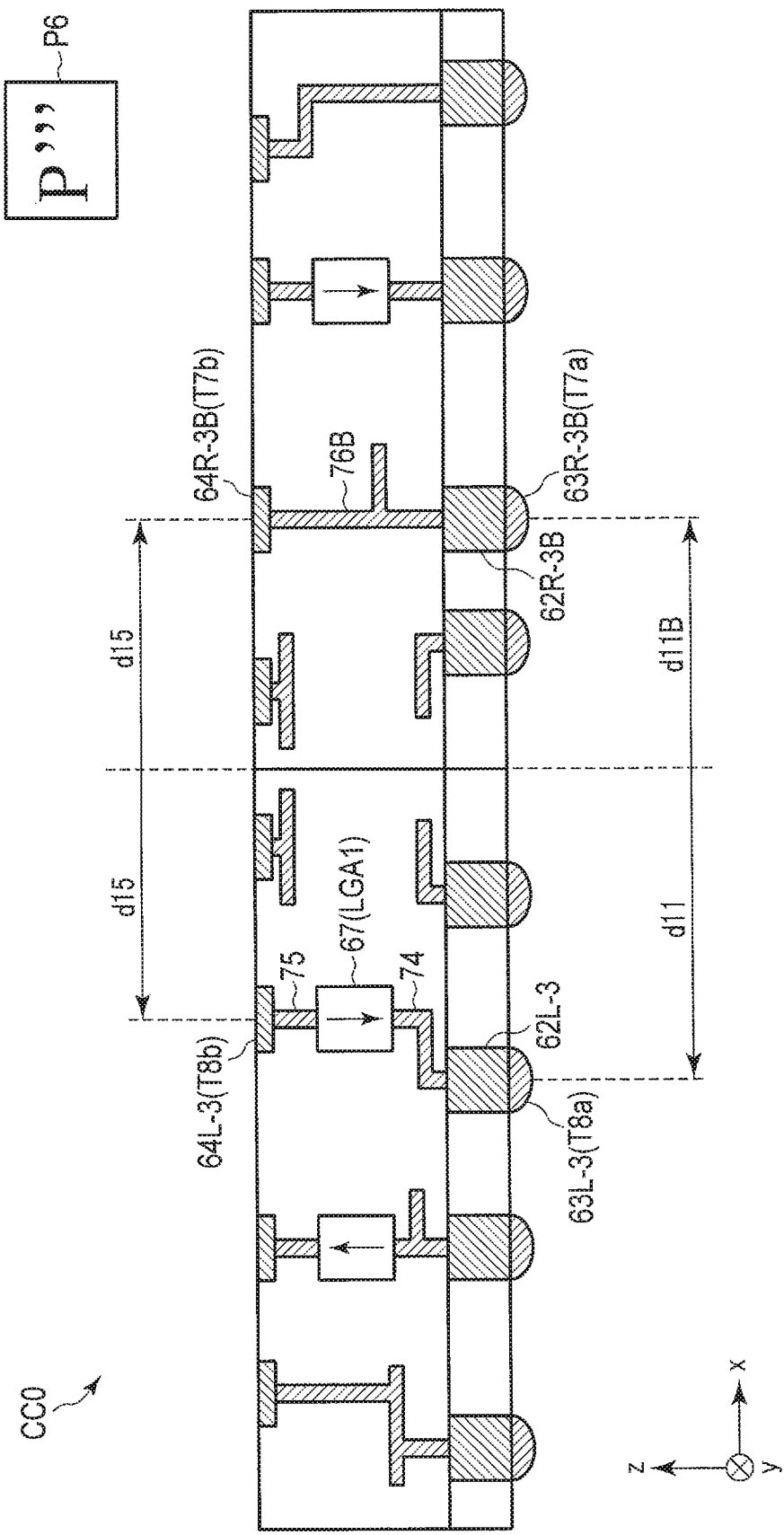
FIG. 29 is a cross-sectional view illustrating a configuration of a core chip of a semiconductor memory device according to a third embodiment.

The layout pattern shown in FIG. 29 is associated with symbol P6 differing from symbols P4 shown in FIG. 19 and P5 shown in FIG. 24. As shown in FIG. 29, core chip CC0 has the same configuration as that shown in FIG. 19, except for some parts. Specifically, core chip CC0 includes a via 62R-3B, a bump 63R-3B, an interconnect layer 76B, and a pad 64R-3B, instead of the via 62R-3, the bump 63R-3, the interconnect layer 76, and the pad 64R-3 shown in FIG. 19.

The coupling relationship between the bump 63R-3B, the via 62R-3B, the interconnect layer 76B, the pad 64R-3B is the same as the relationship between the bump 63R-3, the via 62R-3, the interconnect layer 76, and the pad 64R-3. However, the bumps 63L-3 and 63R-3B are asymmetrically arranged with respect to the center of the semiconductor substrate 60. Specifically, the bump 63L-3 is arranged at a position located at a distance d11 from the center of the semiconductor substrate 60, whereas the bump 63R-3B is arranged at a position located at a distance d11B from the center of the semiconductor substrate 60.

The pads 64L-3 and 64R-3 are symmetrically arranged with respect to the center of the semiconductor substrate 60. Specifically, the pads 64L-3 and 64R-3 are arranged at the positions which are located at a distance d15 from the center of the semiconductor substrate 60.

Next, core chip CC1 is explained.

Figure 30:
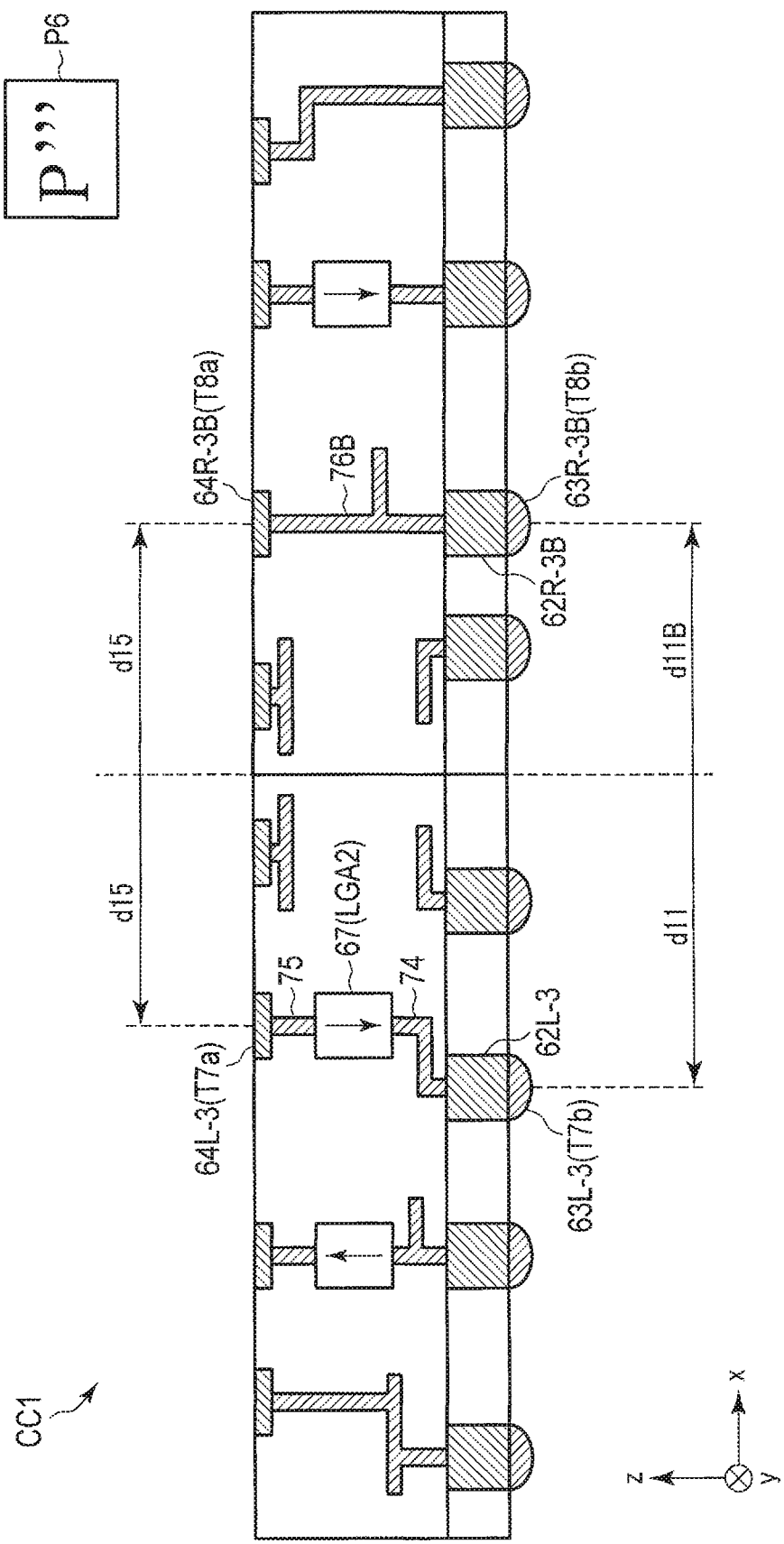
FIG. 30 is a cross-sectional view illustrating a configuration of a core chip of the semiconductor memory device according to the third embodiment.

As shown in FIG. 30, the layout pattern of core chip CC1 matches the layout pattern of core chip CC0. For this reason, in the example shown in FIG. 30, the pads 64L-3 and 64R-3 are symmetric with respect to the center of the semiconductor substrate 60, and are arranged at the same positions as those of the pads 64L-3 and 64R-3 in FIG. 29. The bumps 63L-3 and 63R-3 are asymmetric with respect to the center of the semiconductor substrate 60, and are arranged at the same positions as those of the bumps 63L-3 and 63R-3 in FIG. 29.

Next, core chip CC2 is explained.

Figure 31:
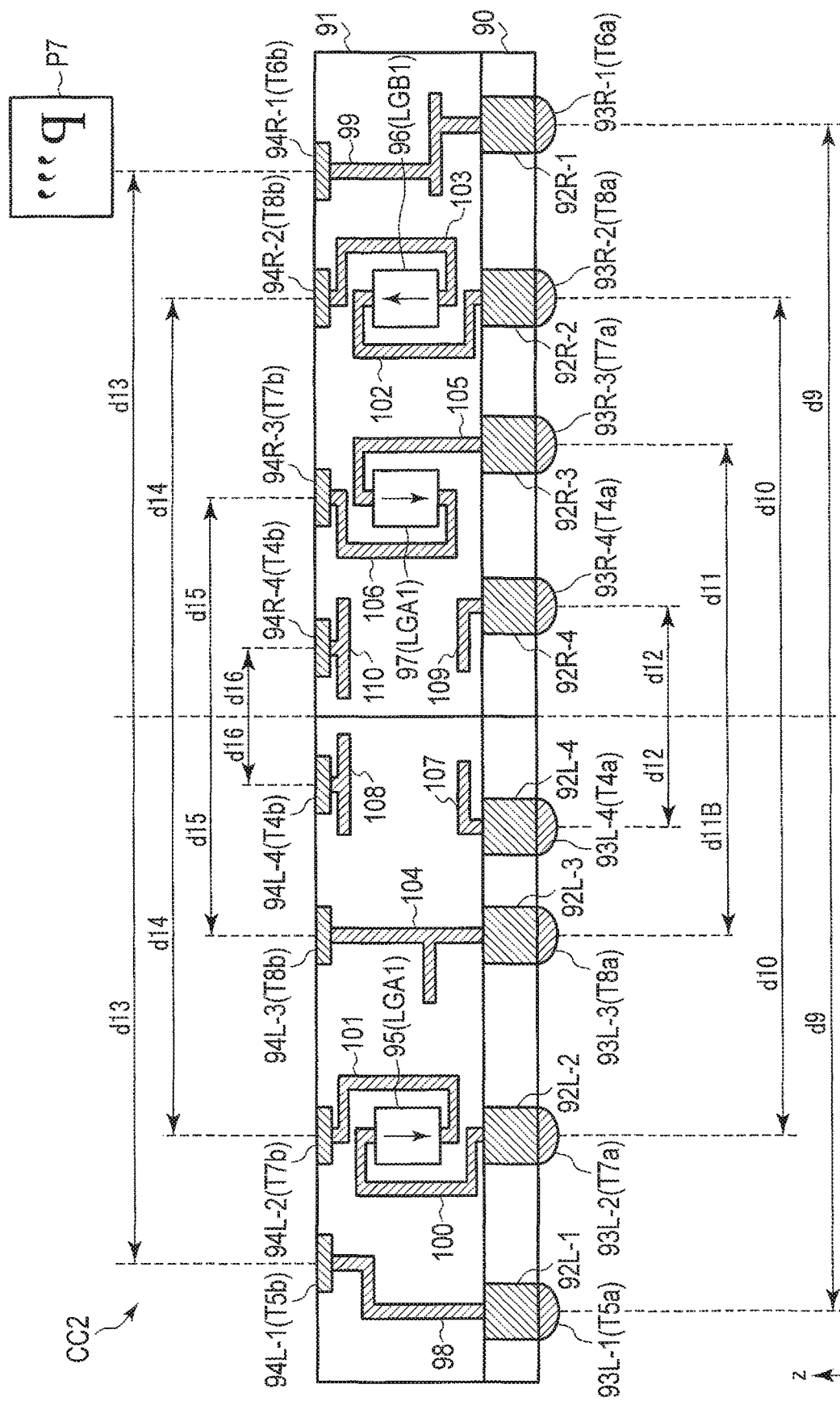
FIG. 31 is a cross-sectional view illustrating a configuration of a core chip of the semiconductor memory device according to the third embodiment.

The layout pattern shown in FIG. 31 is associated with symbol P7 differing from symbol P6 shown in FIGS. 29 and 30. As shown in FIG. 31, the layout pattern of core chip CC2 and that of core chips CC0 and CC1, for example, are mirror-symmetric with respect to the y-z plane.

Specifically, an element layer 91 is provided on the semiconductor substrate 90. On the semiconductor substrate 90, a plurality of vias 92L (92L-1, 92L-2, 92L-3, and 92L-4), and vias 92R (92R-1, 92R-2, 92R-3, and 92R-4) functioning as TSVs are provided.

Bumps 93L-1, 93L-2, 93L-3, and 93L-4 respectively functioning as terminals T5a, T7a, T8a, and T4a are arranged in the portions where vias 92L-1 through 92L-4 are exposed on the lower surface of the semiconductor substrate 90. Bumps 93R-1, 93R-2, 93R-3, and 93R-4 respectively functioning as terminals T6a, T8a, T7a, and T4a are arranged in the portions where vias 92R-1 through 92R-4 are exposed on the lower surface of the semiconductor substrate 90. On the upper surface of the element layer 91, a plurality of pads 94L (94L-1, 94L-2, 94L-3, 94L-4) functioning as terminals T5b, T7b, T8b, and T4b are arranged. On the upper surface of the element layer 91, a plurality of pads 94R (94R-1, 94R-2, 94R-3, 94R-4) functioning as terminals T6b, T8b, T7b, and T4b are arranged. The upper surface of the pad 94 is exposed on the upper surface of the element layer 91. Within each element layer 91, the logic element layers 95 through 97, respectively functioning as the logic circuits LGA1, LGB1, and LGA1, and the interconnect layers 98 through 110, are arranged.

The interconnect layer 98 includes a first end provided on an upper end of the via 92L-1, and a second end provided on a lower end of the pad 94L-1. The interconnect layer 98 is not coupled to the internal circuits, and passes through the element layer 91, for example, The interconnect layer 99 includes a first end provided on an upper end of the via 92R-1, and a second end provided on a lower end of the pad 94R-1. The interconnect layer 99 is coupled to the internal circuit, for example.

The interconnect layer 100 includes a first end provided on an upper end of the via 92L-2, and a second end provided on an upper end of the logic element layer 95. The interconnect layer 100 is coupled to the internal circuit, for example. The interconnect layer 101 includes a first end provided on a lower end of the logic element layer 95, and a second end provided on a lower end of the pad 94L-2. The logic element layer 95 has the lower end having a function as an output terminal, and the upper end having a function as an input terminal. In other words, the logic element layer 95 functions as the logic circuit LGA1 that outputs signals input from the bump 93L-2 to the pad 94L-2.

The interconnect layer 102 includes a first end provided on an upper end of the via 92R-2, and a second end provided on an upper end of the logic element layer 96. The interconnect layer 103 includes a first end provided on a lower end of the logic element layer 96, and a second end provided on a lower end of the pad 94R-2. The interconnect layers 102 and 103 are not coupled to the internal circuits, and pass through the element layer 91, for example. The logic element layer 96 includes the lower end having a function as an input terminal, and the upper end having a function as an output terminal. In other words, the logic element layer 96 functions as the logic circuit LGB1 that outputs signals input from the pad 94R-2 to the bump 93R-2.

The interconnect layer 104 includes a first end provided on an upper end of the via 92L-3, and a second end provided on a lower end of the pad 94L-3. The interconnect layer 104 is coupled to the internal circuit, for example.

The interconnect layer 105 includes a first end provided on an upper end of the via 92R-3, and a second end provided on an upper end of the logic element layer 97. The interconnect layer 106 includes a first end provided on a lower end of the logic element layer 97, and a second end provided on a lower end of the pad 94R-3. The interconnect layers 105 and 106 are not coupled to the internal circuits, and pass through the element layer 91, for example. The logic element layer 97 includes the upper end having a function as an input terminal, and the lower end having a function as an output terminal. In other words, the logic element layer 97 functions as the logic circuit LGA1 that outputs signals input from the bump 93R-3 to the pad 94R-3.

The interconnect layer 107 includes a first end provided on an upper end of the via 92L-4, and is coupled to the internal circuit, for example. The interconnect layer 108 includes a first end provided on a lower end of the pad 94L-4, and is coupled to the internal circuit, for example.

The interconnect layer 109 includes a first end provided on an upper end of the via 92R-4, and is coupled to the internal circuit, for example. The interconnect layer 110 includes a first end provided on a lower end of the pad 94R-4, and is coupled to the internal circuit, for example.

In the example shown in FIG. 31, the pads 94L and 94R are symmetrically arranged with respect to the center of the semiconductor substrate 90. Specifically, the pads 94L-1 and 94R-1 are arranged at the positions which are located at a distance d13 from the center of the semiconductor substrate 90. The pads 94L-2 and 94R-2 are arranged at the positions which are located at a distance d14 from the center of the semiconductor substrate 90. The pads 94L-3 and the pad 94R-3 are arranged at the positions which are located at a distance d15 from the center of the semiconductor substrate 90. The pads 94L-4 and the pad 94R-4 are arranged at the positions which are located at a distance d16 from the center of the semiconductor substrate 90.

However, the bumps 93L and 93R, except for the bumps 93L-3 and 93R-3, are symmetrically arranged with respect to the center of the semiconductor substrate 90. Specifically, the bumps 93L-1 and 93R-1 are arranged at the positions which are located at a distance d9 from the center of the semiconductor substrate 90. The bumps 93L-2 and 93R-2 are arranged at the positions which are located at a distance d10 from the center of the semiconductor substrate 90. The bumps 93L-4 and 93R-4 are arranged at the positions which are located at a distance d12 from the center of the semiconductor substrate 90.

The bumps 93L-3 and 94R-3 are asymmetrically arranged with respect to the center of the semiconductor substrate 90. Specifically, the bump 93L-3 is arranged at a position located at a distance d11B from the center of the semiconductor substrate 90, whereas the bump 93R-3 is arranged at a position located at a distance d11 from the center of the semiconductor substrate 90.

Next, core chip CC3 is explained.

As shown in FIG. 32, the layout pattern of core chip CC3 matches the layout pattern of core chip CC2. For this reason, in the example shown in FIG. 32, the pads 94L-3 and 94R-3 are symmetric with respect to the center of the semiconductor substrate 90, and are arranged at the same positions as those of the pads 94L-3 and 94R-3 in FIG. 31. The bumps 93L-3 and 93R-3 are asymmetric with respect to the center of the semiconductor substrate 90, and are arranged at the same positions as those of the bumps 93L-3 and 93R-3 in FIG. 31.

3.1.2 Multi-Layered Structure of Core Chip Group

Next, the multi-layered structure of the core chip group of the semiconductor memory device according to the third embodiment is described with reference to FIG. 33. FIG. 33 is a cross-sectional view explaining the multi-layered structure of the core chip group of the semiconductor memory device according to the third embodiment. As shown in FIG. 33, in the third embodiment, the chip set CSa, which includes core chips CC0 and CC1, and the chip set CSb, which includes core chips CC2 and CC3, are mutually different.

Specifically, core chips CC2 and CC3 and core chips CC0 and CC1 have mirror-symmetric layout patterns. For this reason, in the signal paths SL7 and SL8, the positions of the input and output terminals of the logic element layers are inverted between core chips CC0 and CC1 and core chips CC2 and CC3.

To match the input-output relationship between the logic element layers, in the signal paths SL7 and SL8, core chips CC2 and CC3 have a different interconnect pattern from that for core chips CC0 and CC1. Specifically, in the signal path SL7 for example, in core chip CC0, the lower and upper ends of the logic element layer 65 are respectively coupled to the interconnect layers 70 and 71, whereas in core chip CC2 the lower and upper ends of the logic element layer 95 are respectively coupled to the interconnect layers 101 and 100. In the core chip CC1, the upper and lower ends of the logic element layer 66 are respectively coupled to the interconnect layers 73 and 72, whereas in core chip CC3 the upper and lower of the logic element layer 96 are respectively coupled to the interconnect layers 102 and 103.

With the above-described configuration, the input-output relationships between the signal paths can be matched even when the bumps are asymmetrically arranged within a core chip CC.

3.2 Manufacturing Method

Next, a manufacturing method for the semiconductor memory device according to the third embodiment will be described.

3.2.1 Forming of Wafers

Of the manufacturing method for the semiconductor memory device according to the third embodiment, a method of forming an element layer on a wafer will be described. FIG. 34 is a schematic diagram explaining a method of forming an element layer on a wafer of the semiconductor memory device according to the third embodiment. In the descriptions hereinafter, the layout patterns of core chips CC0 and CC1 described with reference to FIGS. 30 and 31 will be referred to as "layout pattern P6".

The layout patterns of core chips CC2 and CC3 described with reference to FIGS. 32 and 33 will be referred to as "layout pattern P7".

As shown in FIG. 34, the layout pattern P6 is uniformly aligned along the x-axis direction in the mask set MS3d. In the mask set MS3d, the layout pattern P7 is uniformly aligned in the x-axis direction in a row different from that of the layout pattern P6. Similar to FIG. 12 in the first embodiment, the wafers W1 and W2, which are placed side by side along the x-axis direction on the x-y plane, are bonded in such a manner that the x-y plane is folded with respect to the y-z plane.

Through the bonding of the wafers W1 and W2 on which the above-described mask set MS3d is transferred, a plurality of structures that may function as a chip set CSa, and a plurality of structures that may function as a chip set CSb (described with reference to FIG. 34), can be obtained.

In the third embodiment, the method is not limited to the above-described method, and two mask sets may be used. Specifically, for example, a mask set in which only the layout pattern P6 is uniformly aligned may be used as a first mask set. Then, chip sets CSa may be provided by bonding two wafers on which an element layer is formed with the use of the first mask set. As a second mask set, a mask set in which only the layout pattern P7 is uniformly aligned may be used. Then, chip sets CSb may be provided through the bonding of two wafers in which an element layer is formed with the use of the second mask set.

3.2.2 Die Sorting

For the die sorting process in the manufacturing method for the semiconductor memory device according to the third embodiment, a method similar to the method in the first modification of the first embodiment may be adopted. In other words, a set of the mask of the layout pattern P6 and the mask of the layout pattern P7 may be defined as a repetition unit DSU for a probing position of the die sorter. It is thereby possible to perform die sorting on a wafer in which the same chip design is aligned, with the use of the repetition unit DSU for a probing position of a single die sorter.

If element layers are formed with the use of two mask sets, the die sorting for a wafer on which the layout pattern P6 is transferred, and the die sorting for a wafer on which the layout pattern P7 is transferred, are respectively performed. Furthermore, for each of the die sorting processes, different repetition units DSU for probing positions are defined.

3.3 Advantageous Effects of Third Embodiment

According to the third embodiment, the layout pattern P7 of core chip CC2 and the layout pattern P6 of core chip CC1 are mirror-symmetric. For this reason, the bumps of core chip CC2 and the bumps of core chip CC1 are symmetrically arranged with respect to the surface in which core chips CC1 and CC2 are bonded. The positions of the bumps thereby match between core chips CC1 and CC2.

The layout pattern P7 of core chip CC3 and the layout pattern P6 of core chips CC0 and CC1 are in a mirror-symmetric relationship. For this reason, the bumps of core chip CC3 and the bumps of core chip CC0 are symmetrically arranged with respect to the surface in which core chips CC1 and CC2 are bonded. The positions of the bumps thereby match between core chips CC3 and CC0. Therefore, it is possible to further stack core chip CC0 on core chip CC3.

As aforementioned, since the layout patterns P6 and P7 are mirror-symmetric, the directions of the input and output terminals of the logic circuit become opposite when the chip sets CSa and CSb are bonded. In the third embodiment, different interconnect patterns are applied to the layout patterns P6 and P7. Specifically, if an input terminal and an output terminal of a logic circuit are respectively coupled to a pad and a bump in one of the interconnect patterns of the core chips CC in a chip set CS, an input terminal and an output terminal of the logic circuit are respectively coupled to a bump and a pad in the other interconnect pattern of the core chips CC in a chip set CS. For this reason, it is possible to match the input-output relationship between a logic circuit provided within core chip CC1 and a logic circuit provided within core chip CC2 when core chip CC1 is bonded to core chip CC2. For this reason, it is possible to match the input-output relationship between a logic circuit provided within core chip CC3 and a logic circuit provided within core chip CC0 when core chip CC3 is bonded to core chip CC0.

4. Fourth Embodiment

Next, a semiconductor memory device according to a fourth embodiment is described. In the first to third embodiments, a core chip is provided on a single semiconductor substrate. In contrast, in the semiconductor memory device of the fourth embodiment, a core chip is allocated into two or more semiconductor substrates. Hereinafter, the same constituent elements as those in the first to third embodiments will be referred to by the same reference symbols as those used in the first to third embodiments and the descriptions of those elements will be omitted, and differences between the first to third embodiments and the fourth embodiment will be described.

4.1 Configuration

The configuration of the semiconductor memory device according to the fourth embodiment is described.

4.1.1 Configuration of Core Chip Group

Figure 35:
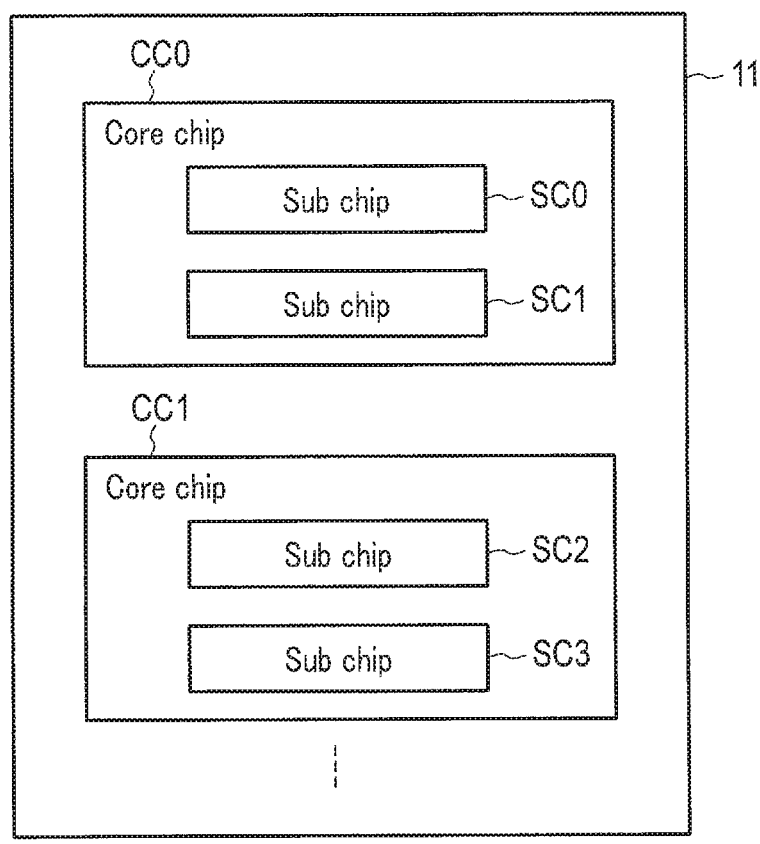
FIG. 35 is a block diagram illustrating a core chip group of a semiconductor memory device according to a fourth embodiment.

A configuration example of the core chip group of the semiconductor memory device according to the fourth embodiment is described with reference to FIG. 35. FIG. 35 is a block diagram showing the configuration example of the core chip group of the semiconductor memory device according to the fourth embodiment.

As shown in FIG. 35, each of core chips CC (CC0, CC1 . . . ) of the core chip group 11 includes a plurality of sub chips SC. Specifically, core chip CC0 includes sub chips SC0 and SC1, and core chip CC1 includes sub chips SC2 and SC3, for example. The number of core chips CC can be any natural number.

Herein, "sub chip SC" is a semiconductor integrated circuit provided on a single semiconductor substrate, and constitutes a part of the function of a core chip CC.

4.1.2 Coupling between Core Chips

Next, a coupling between the core chips of the semiconductor memory device according to the fourth embodiment is described with reference to FIG. 36. FIG. 36 is a circuit diagram explaining an example of a coupling between the core chips of the semiconductor memory device according to the fourth embodiment. FIG. 36 shows two core chips, CC0 and CC1. FIG. 36 corresponds to FIG. 18 described in the second embodiment.

As shown in FIG. 36, the couplings between sub chips SC0, SC1, SC2, and SC3 are the same as the couplings between core chips CC0, CC1, CC2, and CC3 shown in FIG. 18. In other words, core chips CC0 and CC1 are coupled by a coupling between sub chips SC1 and SC2.

With the above-described configuration, terminals T1a of sub chip SC0 through T1b of sub chip SC3, terminals T5a of sub chip SC0 through T5b of sub chip SC3, and terminals T6a of sub chip SC0 through T6b of sub chip SC3 respectively function as signal paths SL1, SL5, and SL6 capable of sending and receiving signals to and from each of core chips CC0 and CC1.

Terminals T7a of sub chip SC0 through T7b of sub chip SC3 function as a signal path SL7 capable of sending, to sub chip SC(n+1), signals which are subjected to computation by the logic circuit LGA1 or LGA2 of sub chip SCn (n is 0≤n≤2). Terminals T8a of sub chip SC0 through T8b of sub chip SC3 function as a signal path SL8 capable of sending, to sub chip SCn, signals which are subjected to computation by the logic circuit LGB1 or LGB2 of sub chip SC(n+1).

Terminals T4b of sub chip SCn through T4a of sub chip SC(n+1) function as a signal path SL4 capable of sending/receiving signals between sub chips SCn and SC(n+1). Terminals T1a and T4a through T8a of sub chip SC0 can send and receive various signals to and from the interface chip 10 or the controller 2.

4.1.3 Configuration of Sub Chips

Next, the configuration of the sub chips of the semiconductor memory device according to the fourth embodiment is described.

Figure 37:
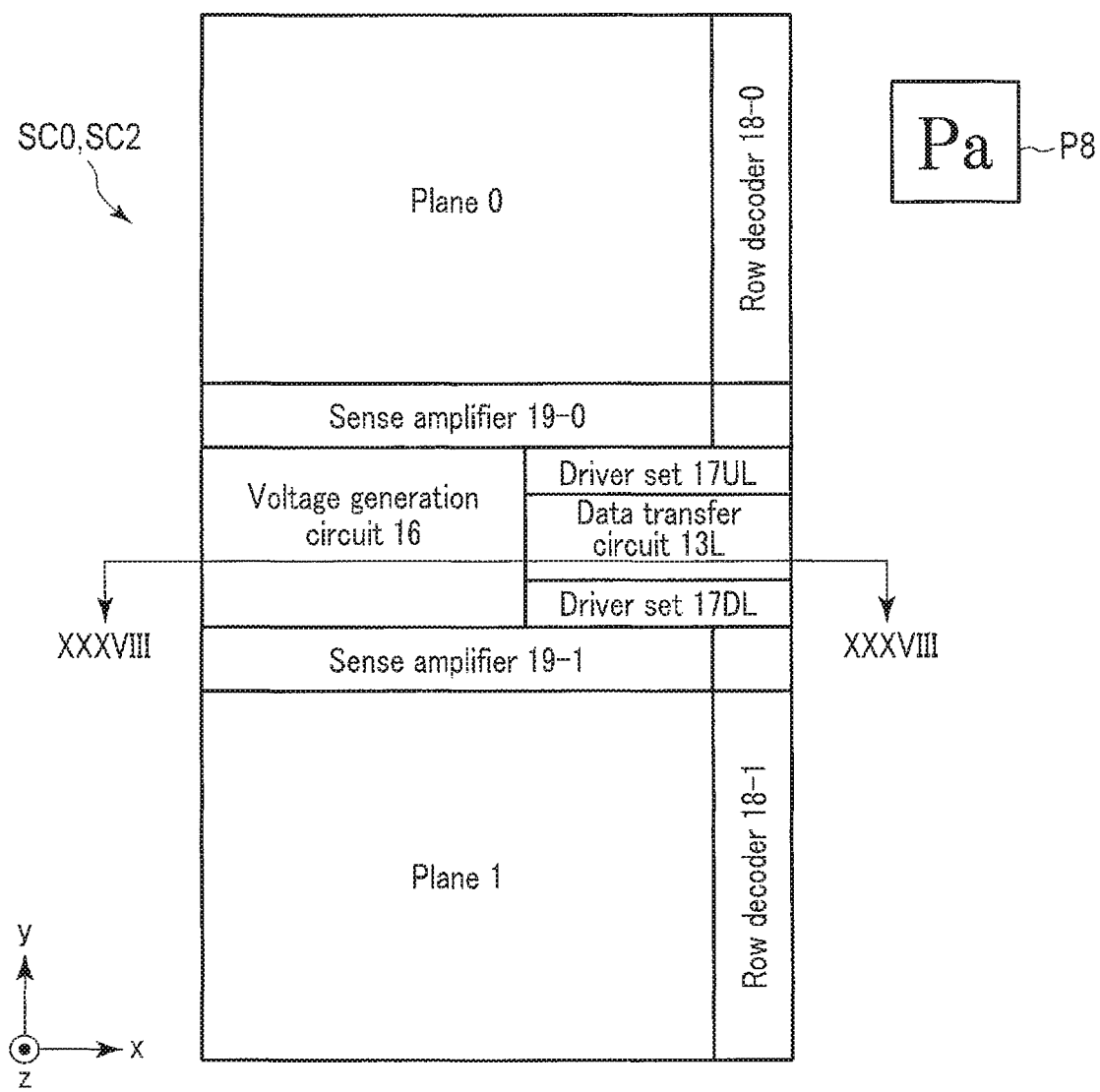
FIG. 37 is a top view illustrating a configuration of a core chip of the semiconductor memory device according to the fourth embodiment.
Figure 38:
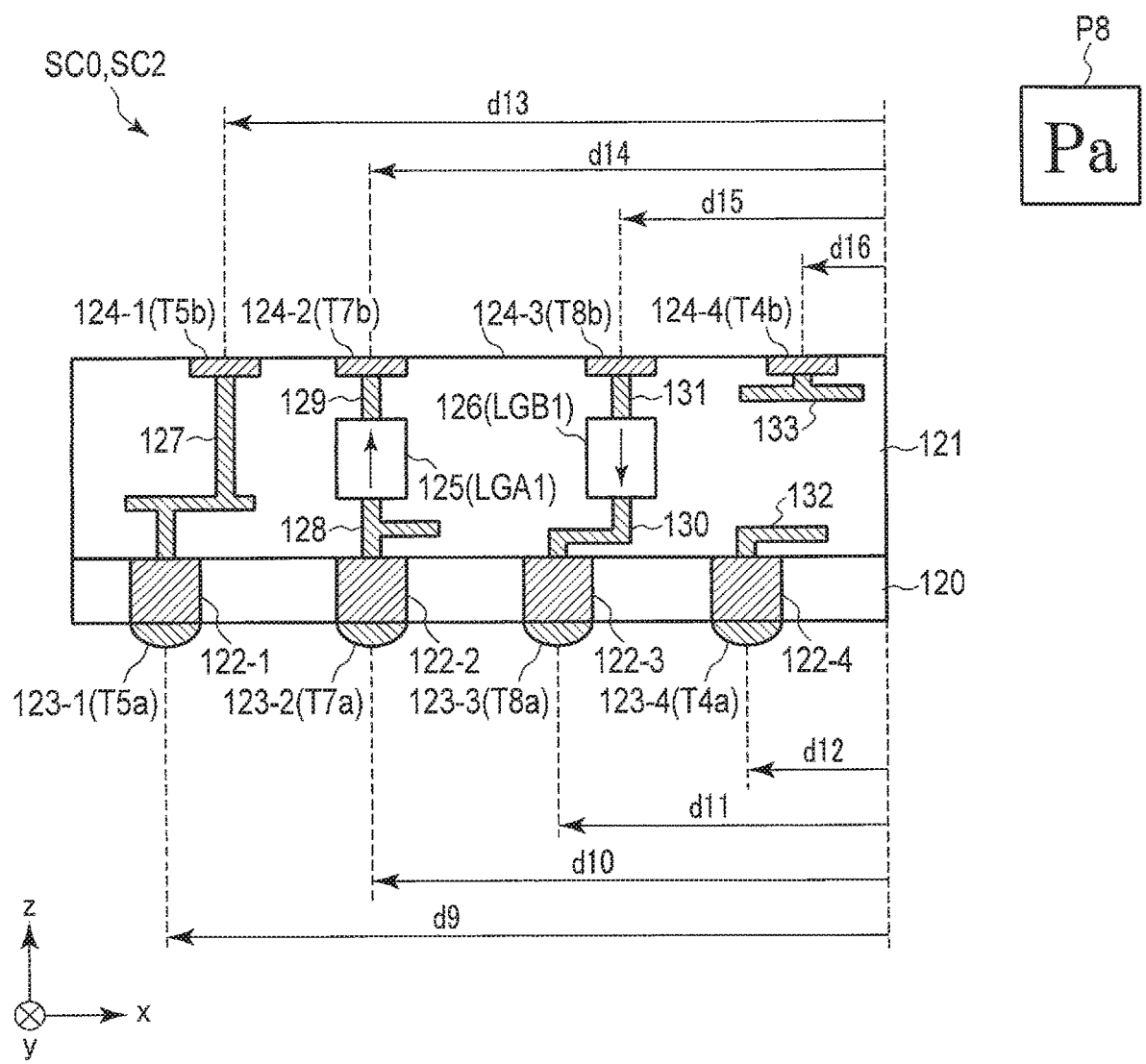
FIG. 38 is a cross-sectional view illustrating a configuration of a core chip of the semiconductor memory device according to the fourth embodiment.
Figure 39:
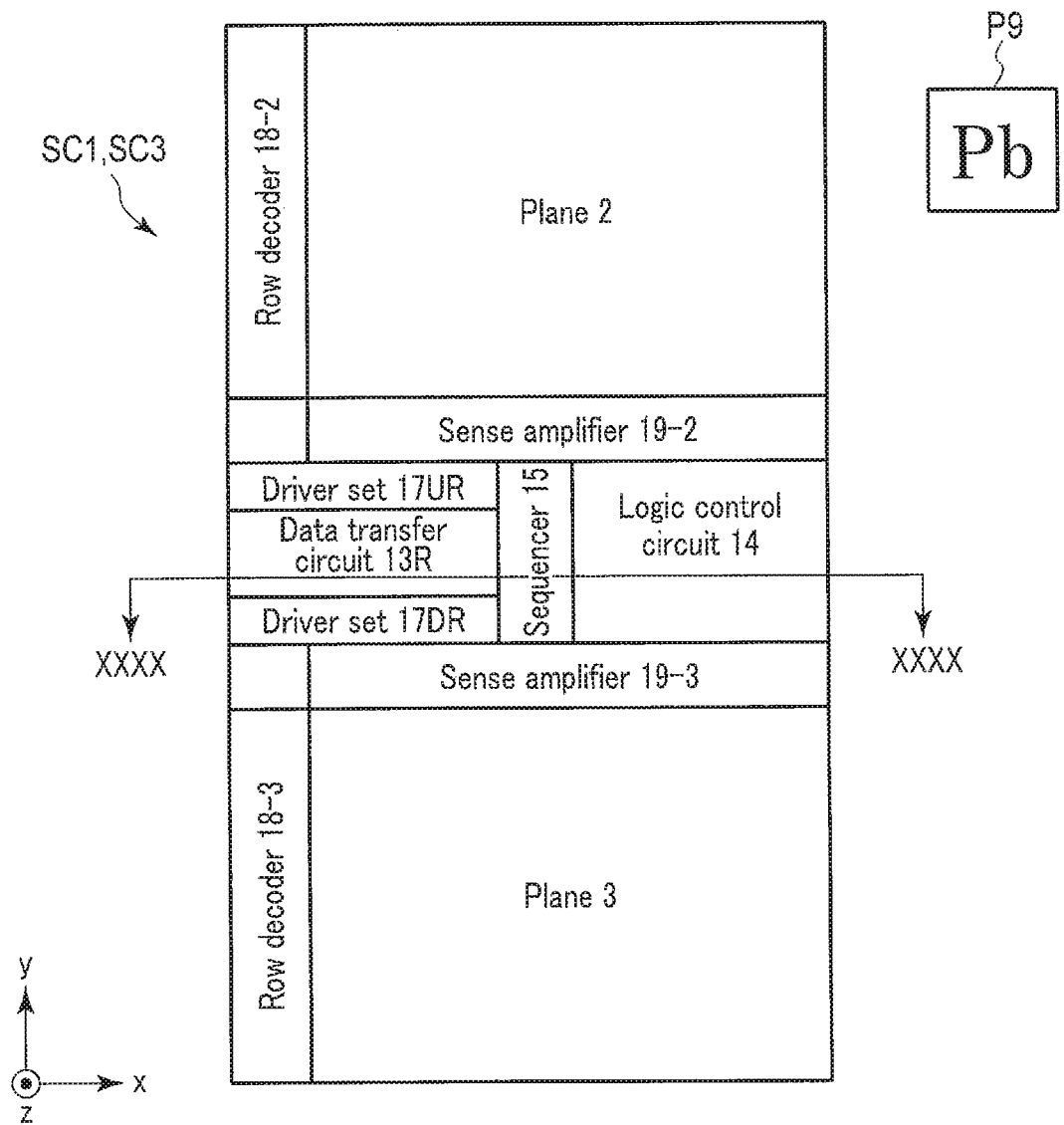
FIG. 39 is a top view illustrating a configuration of a core chip of the semiconductor memory device according to the fourth embodiment.
Figure 40:
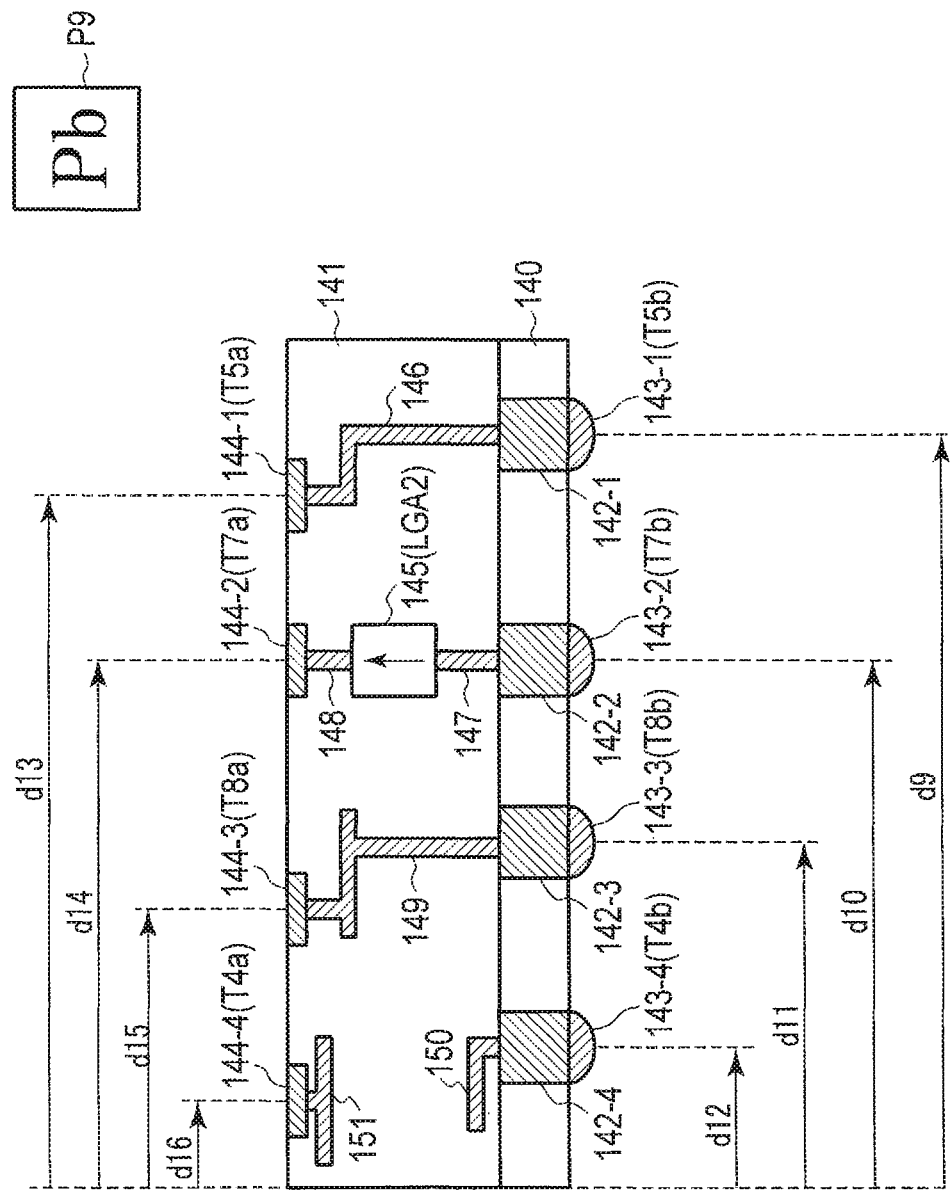
FIG. 40 is a cross-sectional view illustrating a configuration of a core chip of the semiconductor memory device according to the fourth embodiment.

FIGS. 37 and 39 are top views for explaining the layout pattern of the sub chips of the semiconductor memory device according to the fourth embodiment. FIGS. 38 and 40 are cross-sectional views for explaining the layout pattern and the interconnect pattern of the sub chips of the semiconductor memory device according to the fourth embodiment. FIGS. 38 and 40 show cross-sectional views taken in line XXXVIII-XXXVIII shown in FIG. 37 and line XXXX-XXXX shown in FIG. 39, respectively. FIG. 37 and FIG. 38 show the configuration common in sub chips SC0 and SC2, and FIG. 39 and FIG. 40 show the configuration common in sub chips SC1 and SC3.

First, the configuration of sub chips SC0 and SC2 is described.

As shown in FIG. 37, the layout pattern of sub chips SC0 and SC2 is a part of the layout pattern of core chips CC0 and CC1, respectively, and is arranged in a rectangular region having two sides in the x-axis direction and two sides in the y-axis direction in the x-y plane. Specifically, each of sub chips SC0 and SC2 includes planes 0 and 1, the data transfer circuit 13L, the voltage generation circuit 16, the driver sets 17UL and 17DL, the row decoders 18-0 and 18-1, and the sense amplifiers 19-0 and 19-1. The layout pattern of sub chips SC0 and SC2 shown in FIG. 37 corresponds to, for example the left half of FIG. 4, and is associated with symbol P8.

As shown in FIG. 38, the element layer 121 is provided on the upper surface of the semiconductor substrate 120 in accordance with the layout pattern associated with symbol P8, and the interconnect pattern associated with said layout pattern. In FIG. 38, the elements of the internal circuit, except for terminals T4a, T5a, T7a, T8a, T4b, T5b, T7b, and T8b, and the logic circuits LGA1 and LGB1, are omitted for the purpose of brevity.

In the semiconductor substrate 120 and the element layer 121, a plurality of vias 122 (122-1, 122-2, 122-3, and 122-4), a plurality of bumps 123 (123-1, 123-2, 123-3, and 123-4), a plurality of pads 124 (124-1, 124-2, 124-3, and 124-4), and the logic element layers 125 and 126, and the interconnect layers 127 through 133 are arranged, for example. The via 122, the bump 123, the pad 124, and the logic element layers 125 and 126, and the interconnect layers 127 through 133 are arranged in a manner similar to the arrangement of the via 62L, the bump 63L, the pad 64L, the logic element layers 65 and 67, and the interconnect layers 68, 70, 71, 74, 75, 77, and 78, shown in FIG. 19.

In the example shown in FIG. 38, the bump 123-1 and the pad 124-1 are respectively arranged at the positions located at distances d9 and d13 from the right end of the semiconductor substrate 120. The bump 123-2 and the pad 124-2 are respectively arranged at the positions located at distances d10 and d14 from the right end of the semiconductor substrate 120. The bump 123-3 and the pad 124-3 are respectively arranged at the positions located at distances d11 and d15 from the right end of the semiconductor substrate 120. The bump 123-4 and the pad 124-4 are respectively arranged at the positions located at distances d12 and d16 from the right end of the semiconductor substrate 120.

Next, the configuration of sub chips SC1 and SC3 is described.

As shown in FIG. 39, the layout pattern of sub chips SC1 SC3 is a part of the layout pattern of core chips CC0 and CC1, respectively, and arranged in a rectangular area similar to that of sub chips SC0 and SC2 on the x-y plane. Specifically, each of sub chips SC1 and SC3 includes planes 2 and 3, the data transfer circuit 13R, the logic control circuit 14, the voltage generation circuit 15, the driver sets 17UR and 17DR, the row decoders 18-2 and 18-3, and the sense amplifiers 19-2 and 19-3. The layout pattern of sub chips SC0 and SC2 corresponds to the right half of FIG. 4 for example, and is associated with symbol P9.

As shown in FIG. 40, the element layer 141 is provided on the upper surface of the semiconductor substrate 140 in accordance with the layout pattern associated with symbol P9, and the interconnect pattern associated with said layout pattern. In FIG. 40, the elements of the internal circuit, except for terminals T4a, T5a, T7a, T8a, T4b, T5b, T7b, and T8b, and the logic circuit LGA2, are omitted for the purpose of brevity.

In the semiconductor substrate 140 and the element layer 141, a plurality of vias 142 (142-1, 142-2, 142-3, and 142-4), a plurality of bumps 143 (143-1, 143-2, 143-3, and 143-4), a plurality of pads 144 (144-1, 144-2, 144-3, and 144-4), and the logic element layer 145, and the interconnect layers 146 through 151 are arranged, for example. The via 142, the bump 143, the pad 144, and the logic element layer 145, and the interconnect layers 146 through 151 are arranged in a manner similar to, for example, the arrangement of the via 62R, the bump 63R, the pad 64R, the logic element layer 66, and the interconnect layers 69, 72, 73, 76, 79, and 80, shown in FIG. 19.

In the example shown in FIG. 40, the bump 143-1 and the pad 144-1 are respectively arranged at the positions located at distances d9 and d13 from the right end of the semiconductor substrate 140. The bump 143-2 and the pad 144-2 are respectively arranged at the positions located at distances d10 and d14 from the right end of the semiconductor substrate 140. The bump 143-3 and the pad 144-3 are respectively arranged at the positions located at distances d11 and d15 from the right end of the semiconductor substrate 140. The bump 143-4 and the pad 144-4 are respectively arranged at the positions located at distances d12 and d16 from the right end of the semiconductor substrate 140.

With the above-described configuration, the layout pattern of sub chips SC1 and SC3 differs from the layout pattern of sub chips SC0 and SC2. Specifically, the terminals of sub chips SC1 and SC3 are respectively provided at the positions that are mirror-symmetric positions of the terminals of sub chips SC0 and SC2; however, the arrangements within the internal circuit, including the directions of the input and output of the logic circuits differ between sub chips SC1 and SC3 and sub chips SC0 and SC2.

4.1.4 Multi-Layered Structure of Core Chip Group

Figure 41:
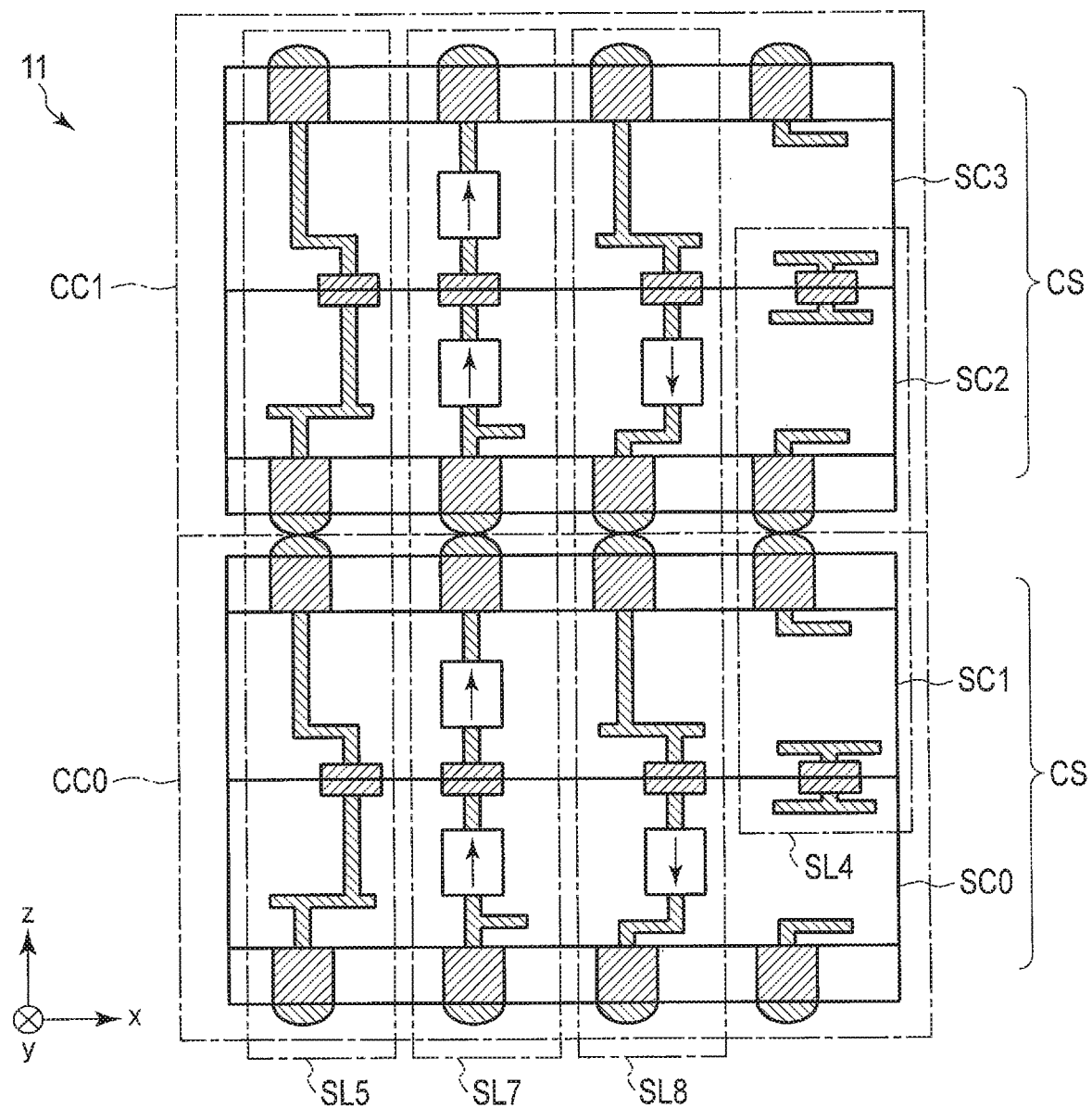
FIG. 41 is a cross-sectional view illustrating a core chip group of the semiconductor memory device according to the fourth embodiment.

Next, the multi-layered structure of the core chip group of the semiconductor memory device according to the fourth embodiment is described with reference to FIG. 41. FIG. 41 is a cross-sectional view explaining the multi-layered structure of the core chip group of the semiconductor memory device according to the fourth embodiment. FIG. 41 shows a structure in which sub chips SC0 through SC3, which are shown in FIGS. 38 and 40, are stacked in this order.

As shown in FIG. 41, the upper surfaces of sub chips SC0 and SC2 are bonded to the upper surfaces of sub chips SC1 and SC3, respectively. As described above, the positions of the pads 124 in sub chip SC0 and SC2 and the positions of the pads 144 in sub chip SC1 and SC3 are designed to be mirror-symmetric with respect to a plane where the upper surfaces are opposed to each other. For this reason, the positions of the pads 124-1 through 124-4 of sub chip SC0 match the positions of the pads 144-1 through 144-4 of sub chip SC1, respectively.

The lower surface of sub chip SC1 is bonded to the lower surface of sub chip SC2. As described above, the positions of the bumps 143 in sub chip SC1 and the positions of the bumps 123 in sub chip SC2 are designed to be mirror-symmetric with respect to a plane where the upper surfaces are opposed to each other. For this reason, the positions of the bumps 143-1 through 143-4 of sub chip SC1 match the positions of the bumps 123-1 through 123-4 of sub chip SC2, respectively.

With the above-described configuration, the signal paths SL4, SL5, SL7, and SL8, capable of communicating with the elements of the internal circuit, can be formed in sub chips SC0 through SC3. As described above, the logic circuits are provided in accordance with different layout patterns between sub chips (SC0, SC2), and sub chips (SC1, SC3). For this reason, in the signal path SL7 for example, the logic element layer 145 having the input-output direction from the element layer 141 toward the semiconductor substrate 140 can correspond to the logic element layer 125 having the input and output direction from the semiconductor substrate 120 toward the element layer 121. Accordingly, the input-output relationships correspond between the logic element layer 125, that includes the lower end coupled to the via 122-2 and the upper end coupled to the pad 124-2, and the logic element layer 145, that includes the lower end coupled to the via 142-2 and the upper end coupled to the pad 144-2.

4.2 Manufacturing Method

Next, a manufacturing method for the semiconductor memory device according to the fourth embodiment will be described.

4.2.1 Forming of Wafers

Figure 42:
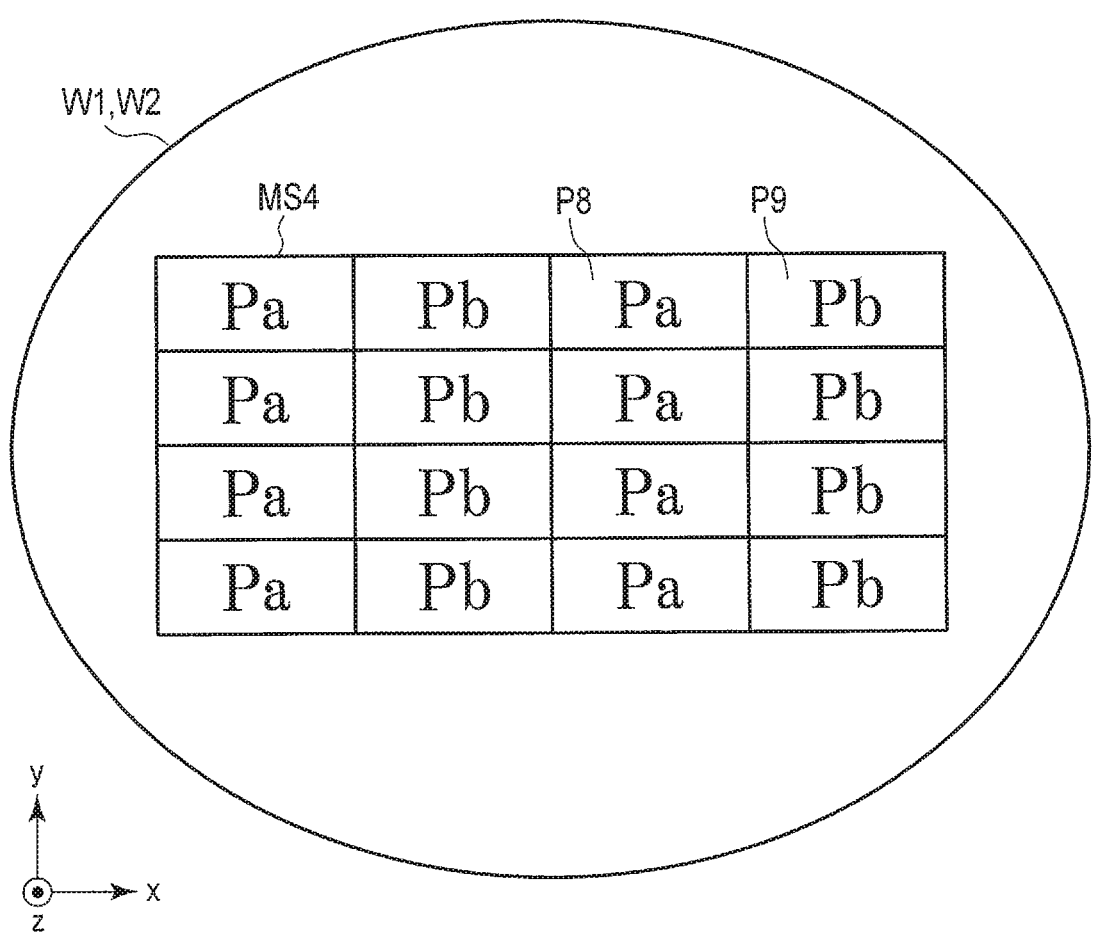
FIG. 42 is a schematic diagram illustrating a manufacturing method for the semiconductor memory device according to the fourth embodiment.

Of the manufacturing method for the semiconductor memory device according to the fourth embodiment, a method of forming an element layer on a wafer will be described. FIG. 42 is a schematic diagram explaining a method of forming an element layer on a wafer of the semiconductor memory device according to the fourth embodiment. In other words, FIG. 42 corresponds to step ST10 in FIG. 10.

FIG. 42 schematically shows a layout pattern, which is to be transferred to the wafers W1 and W2 with the use of the mask set MS4. Specifically, in FIG. 42, the layout pattern described with reference to FIGS. 37 and 38 is indicated as symbol P8, and the layout pattern described with reference to FIGS. 39 and 40 is indicated as symbol P9. In the descriptions hereinafter, the layout pattern described with reference to FIGS. 37 and 38 will be referred to as "layout pattern P8", and the layout pattern described with reference to FIGS. 39 and 40 will be referred to as "layout pattern P9".

As shown in FIG. 42, the layout patterns P8 and P9 are alternately aligned along the x-axis direction in the mask set MS4. Furthermore, in the mask set MS4, the layout patterns are arranged in such a manner that different layout patterns are placed on the ends in the x-axis direction. Similar to FIG. 12 in the first embodiment, the wafers W1 and W2, which are placed side by side along the x-axis direction on the x-y plane, are bonded in such a manner that the x-y plane is folded with respect to the y-z plane.

Through the bonding of the wafers W1 and W2, on which the above-described mask set MS4 is transferred, a plurality of structures that may function as a chip set CS, described with reference to FIG. 41, can be obtained.

4.2.2 Die Sorting

For the die sorting process in the manufacturing method for the semiconductor memory device according to the fourth embodiment, a method similar to the method in the first embodiment may be adopted. In other words, a set of the mask of the layout pattern P8 and the mask of the layout pattern P9 may be defined as a repetition unit DSU for a probing position of the die sorter. It is thereby possible to perform die sorting on a wafer in which the same chip design is aligned, with the use of the repetition unit DSU for a probing position of a single die sorter.

4.3 Advantageous Effects of Present Embodiment

According to the fourth embodiment, core chip CC0 includes sub chips SC0 and SC1 that are bonded at their upper surfaces. In other words, one chip set CS includes one core chip CC. For this reason, compared to the first through third embodiments where one chip set CS includes two core chips CC, yield per chip set CS obtained by dicing can be reduced to a half of that in the first through third embodiments. Accordingly, efficiency in manufacturing good chips can be improved.

In each of the wafers W1 and W2, an element layer is formed by the same mask set MS4. This mask set MS4 includes two different layout patterns P8 and P9. The layout patterns P8 and P9 are alternately arranged. For this reason, when the wafer W1 is bonded to the wafer W2, it is possible to bond the element layer, on which the layout pattern P8 is transferred, to the element layer, on which the layout pattern P9 is transferred.

A cost required for designing a mask set MS4 is equivalent to a cost for designing the layout patterns P8 and P9. However, a sum of the layout patterns P8 and P9 is equivalent to a single core chip CC. Thus, the design cost for the mask set MS4 can be suppressed to the level of the design cost for a single core chip CC.

Figure 43:
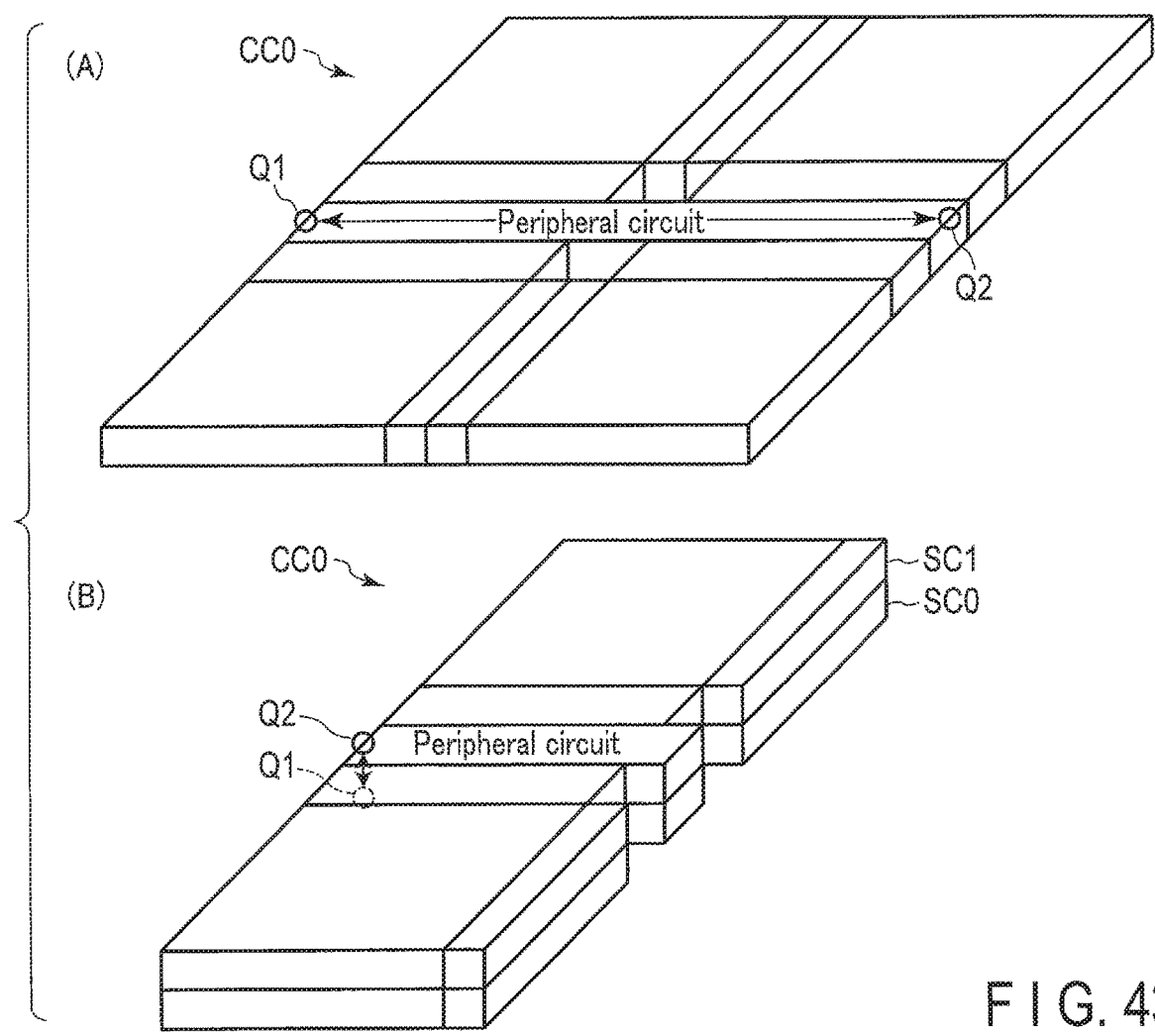
FIG. 43 is a schematic diagram illustrating advantageous effects of the semiconductor memory device according to the fourth embodiment.

Since one core chip CC is configured with one chip set CS as described above, a length of interconnects required for communications within the core chip CC can be reduced. FIGS. 43 and 44 are schematic diagrams for explaining the advantageous effects of the semiconductor memory device according to the fourth embodiment. FIG. 43(A) and FIG. 44(A) show circuit arrangement examples of single core chip CC0 provided on a single semiconductor substrate. FIG. 43(B) and FIG. 44(B) show circuit arrangement examples corresponding to the fourth embodiment, and show circuit arrangement examples of a single core chip CC0 constituted by two sub chips, SC0 and SC1, respectively provided on two semiconductor substrates bonded to each other. FIG. 43 shows a case where one core chip CC0 includes four planes, and FIG. 44 shows a case where one core chip CC0 includes eight planes.

If core chip CC0 is arranged on a single semiconductor substrate as shown in FIG. 43(A), a communication between points Q1 and Q2 in the peripheral circuit requires interconnect having a length that covers the left end through the right end of core chip CC0. The length from the left end to the right end of core chip CC0 is the order of millimeter (mm), for example. On the other hand, as shown in FIG. 43(B), if core chip CC0 is allocated into the two bonded semiconductor substrates, point Q2 is arranged immediately above point Q1 in the stacking direction. For this reason, the length of the interconnect from point Q1 to Q2 is a length of the signal length between sub chips SC0 and SC1 at the longest. The length of the signal path between SC0 and SC1 is the order of micrometers (μm), for example. In other words, with the configuration of FIG. 43 (B), the length of the interconnect from point Q1 to Q2 can be shorter than that in the configuration of FIG. 43(A). Accordingly, according to the fourth embodiment, it is possible to simplify the interconnect pattern in the peripheral circuit, and to reduce the manufacturing cost.

As shown in FIG. 44(A), when core chip CC0 having eight planes is configured on a single semiconductor substrate, the length of interconnect necessary for a communication between points Q3 and Q4 in the peripheral circuit is twice as much as that in the four-plane configuration. For this reason, electrical characteristics may deteriorate along with the increase of the interconnect length, and a design that satisfies constraints such as a delay stemming from communications may become difficult to achieve. On the other hand, as shown in FIG. 44(B), if the eight-plane configuration is allocated into the two bonded semiconductor substrates, the length of the interconnect from point Q3 to Q4 is of a length of the signal path between sub chips SC0 and SC1 at the longest. The maximum length of the interconnect layer in the internal circuit can be restrained to the level in the case of the four-plane configuration shown in FIG. 43(A). For this reason, the problem of the length of interconnects that becomes obvious in the case of FIG. 44(A) can be solved, and a design with the eight-plane configuration becomes easy to achieve. The area size of a semiconductor substrate can be restrained to the level in the case of FIG. 44(A), and it is thereby possible to improve the constraints regarding the area size in a package.

4.4 First Modification of Fourth Embodiment

The semiconductor memory device according to the fourth embodiment is not limited to the above-described example, and various modifications of the semiconductor memory device are possible. For example, the positions of the bumps among the sub chips SC within the same core chip CC may not necessarily be mirror-symmetrically arranged.

FIGS. 45 through 48 are cross-sectional views for explaining the layout patterns and the interconnect patterns of the sub chips of the semiconductor memory device according to a first modification of the fourth embodiment. FIGS. 45 through 48 show the configurations of core chips SC1 through SC3. The configuration of sub chip SC0 is the same as the one shown in FIG. 38 of the fourth embodiment.

First, sub chip SC1 is explained.

The layout pattern of sub chip SC1 according to the first modification of the fourth embodiment differs from the layout pattern of sub chip SC1 according to the fourth embodiment. For this reason, the layout pattern shown in FIG. 45 is associated with symbol P10 differing from symbol P9 shown in FIG. 40.

Figure 45:
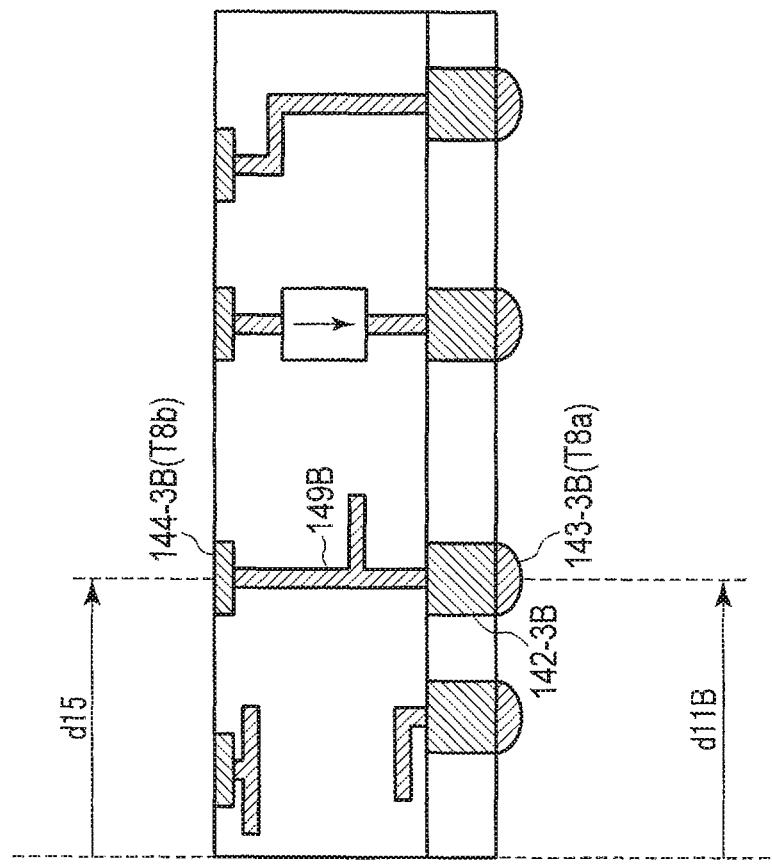
FIG. 45 is a cross-sectional view illustrating a configuration of a core chip of a semiconductor memory device according to a first modification of the fourth embodiment.

As shown in FIG. 45, sub chip SC1 has the same configuration as that shown in FIG. 40, except for some parts. Specifically, sub chip SC1 includes a via 142-3B, a bump 143-3B, an interconnect layer 149B, a pad 144-3B, instead of the via 142-3, the bump 143-3, the interconnect layer 149, and the pad 144-3 shown in FIG. 40.

The coupling relationship between the bump 143-3B, the via 142-3B, the interconnect layer 149B, the pad 144-3B is the same as that between the bump 143-3, the via 142-3, the interconnect layer 149, and the pad 144-3. The bumps 143-3B are positioned differently from the bumps 143-3. In other words, the bump 143-3B and the bump 123-3 shown in FIG. 38 are not mirror-symmetrically positioned. Specifically, the bump 143-3 is arranged at a position located at a distance d11 from the left end of the semiconductor substrate 140, whereas the bump 143-3B is arranged at a position located at a distance d11B from the left end of the semiconductor substrate 140.

The pad 144-3B is positioned the same as the pad 144-3. In other words, the pad 144-3B is arranged at a position that is a mirror-symmetric position of the pad 124-3 shown in FIG. 38. Specifically, the pad 144-3B is arranged at the position located at a distance d15 from the left end of the semiconductor substrate 140.

Next, sub chip SC2 is explained.

Figure 46:
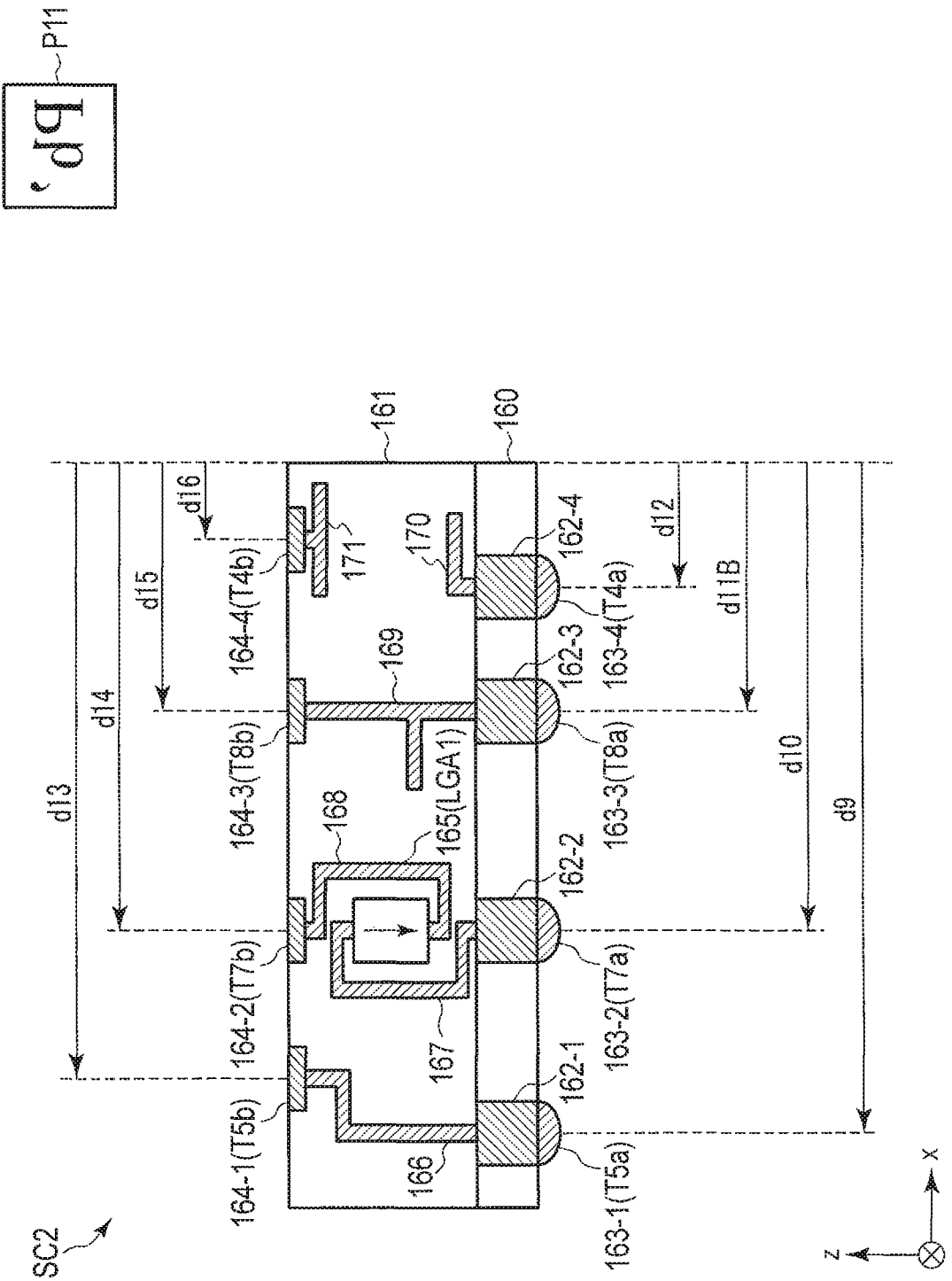
FIG. 46 is a cross-sectional view illustrating a configuration of a core chip of the semiconductor memory device according to the first modification of the fourth embodiment.

As shown in FIG. 46, the layout patterns of sub chip SC2 and sub chip SC1, for example, are mirror-symmetric with respect to the y-z plane. The layout pattern shown in FIG. 46 is associated with symbol P11 differing from symbol P10 shown in FIG. 45.

Specifically, an element layer 161 is provided on the semiconductor substrate 160. In the semiconductor substrate 160, a plurality of vias 162 (162-1, 162-2, 162-3, 162-4) functioning as TSVs are arranged.

Bumps 163-1, 163-2, 163-3, and 163-4 respectively functioning as terminals T5a, T7a, T8a, and T4a are arranged in the portions where the vias 162-1 through 162-4 are exposed on the lower surface of the semiconductor substrate 160. On the upper surface of the element layer 161, a plurality of pads 164 (164-1, 164-2, 164-3, 164-4) functioning as terminals T5b, T7b, T8b, and T4b are arranged. The upper surface of the pad 164 is exposed on the upper surface of the element layer 161. Within the element layer 161, the logic element layer 165 functioning as the logic circuits LGA1, and the interconnect layers 166 through 171 are arranged.

The interconnect layer 166 includes a first end provided on an upper end of the via 162-1, and a second end provided on a lower end of the pad 164-1. The interconnect layer 166 is not coupled to the internal circuits, and passes through the element layer 161, for example.

The interconnect layer 167 includes a first end provided on an upper end of the via 162-2, and a second end provided on an upper end of the logic element layer 165. The interconnect layer 168 includes a first end provided on a lower end of the logic element layer 165, and a second end provided on a lower end of the pad 164-2. The interconnect layers 167 and 168 are not coupled to the internal circuits, and pass through the element layer 161, for example. The logic element layer 165 has the lower end having a function as an output terminal, and the upper end having a function as an input terminal. In other words, the logic element layer 165 functions as the logic circuit LGA1 that outputs signals input from the bump 163-2 to the pad 164-2.

The interconnect layer 170 includes a first end provided on an upper end of the via 162-4, and is coupled to the internal circuit, for example. The interconnect layer 171 includes a first end provided on a lower end of the pad 164-4, and is coupled to the internal circuit, for example.

In the example of FIG. 46, the pad 164-3 is arranged at a position mirror-symmetric to the pad 144-3B shown in FIG. 45. Specifically, the pad 144-3B is arranged at a position located at a distance d15 from the left end of the semiconductor substrate 140, whereas the pad 164-3 is arranged at a position located at a distance d15 from the right end of the semiconductor substrate 160. Similarly, the other pads 164-1, 164-2, and 164-4 are arranged at positions mirror-symmetric to the pads 144-1, 144-2, and 144-4 shown in FIG. 45.

The bump 163-3 is arranged at a position mirror-symmetric to the bump 143-3B shown in FIG. 45. Specifically, the bump 143-3B is arranged at a position located at a distance d11B from the left end of the semiconductor substrate 140, whereas the bump 163-3 is arranged at a position located at a distance d11B from the right end of the semiconductor substrate 160. Similarly, the other bumps 163-1, 163-2, and 163-4 are arranged at positions mirror-symmetric to the bumps 143-1, 143-2, and 143-4 shown in FIG. 45.

Next, sub chip SC3 is explained.

Figure 47:
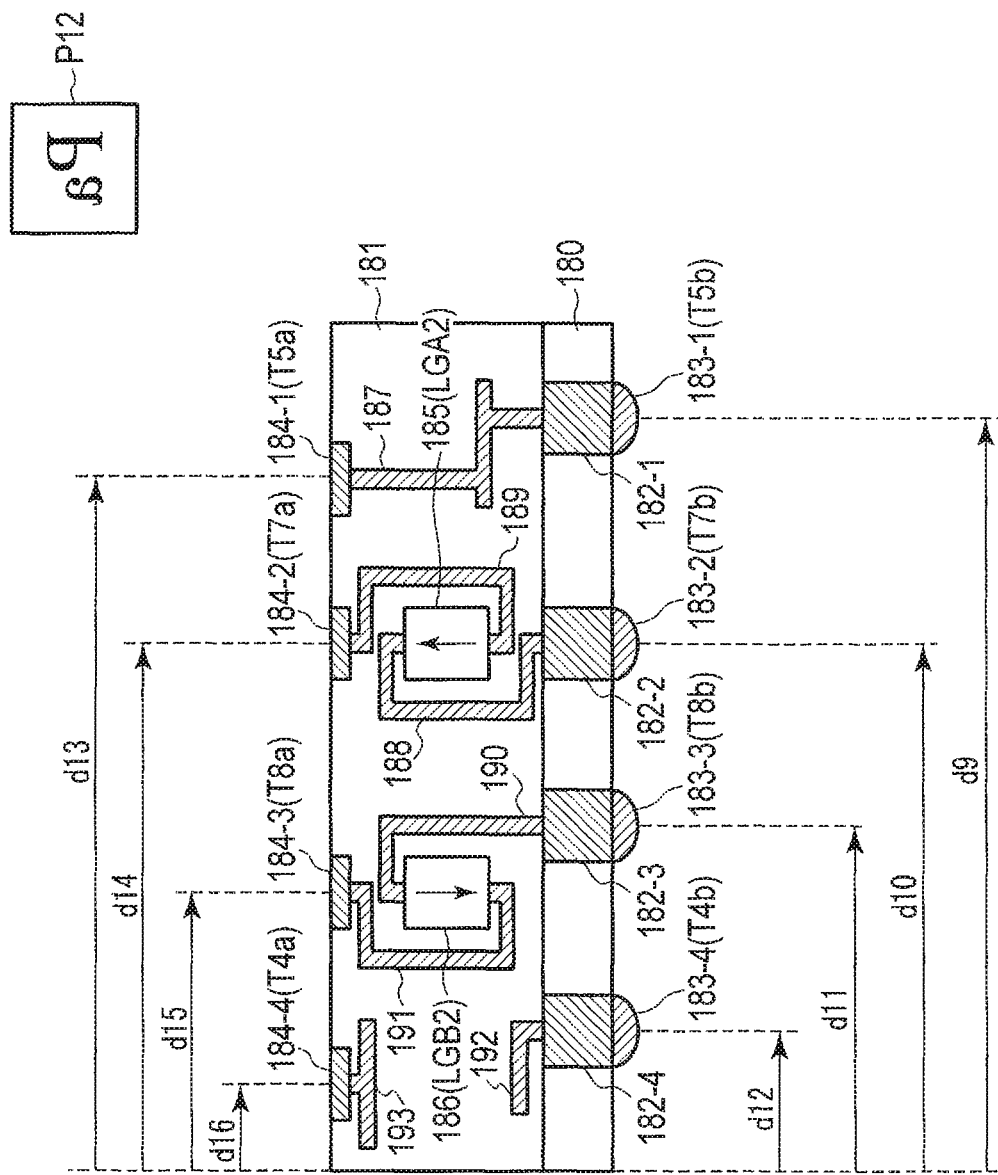
FIG. 47 is a cross-sectional view illustrating a configuration of a core chip of the semiconductor memory device according to the first modification of the fourth embodiment.

As shown in FIG. 47, the layout patterns of sub chips SC2 and SC0, for example, have a mirror-symmetric relationship with respect to the y-z plane. The layout pattern of sub chip SC3 is associated with symbol P12 differing from symbol P8 shown in FIG. 38.

Specifically, an element layer 181 is provided on the semiconductor substrate 180. In the semiconductor substrate 180, a plurality of vias 182 (182-1, 182-2, 182-3, 182-4) functioning as TSVs are arranged.

Bumps 183-1, 183-2, 183-3, and 183-4 respectively functioning as terminals T5$b$, T7$b$, T8$b$, and T4$b$ are arranged in the portions where vias 182-1 through 182-4 are exposed on the lower surface of the semiconductor substrate 180. On the upper surface of the element layer 181, a plurality of pads 184 (184-1, 184-2, 184-3, 184-4) functioning as terminals T5$a$, T7$a$, T8$a$, and T4$a$ are arranged. The upper surface of the pad 184 is exposed on the upper surface of the element layer 181. Within each element layer 181, the logic element layers 185 and 186 respectively functioning as the logic circuits LGA2 and LGB2, and the interconnect layers 187 through 193 are arranged.

The interconnect layer 187 includes a first end provided on an upper end of the via 182-1, and a second end provided on a lower end of the pad 184-1. The interconnect layer 187 is coupled to the internal circuit, for example.

The interconnect layer 188 includes a first end provided on an upper end of the via 182-2, and a second end provided on an upper end of the logic element layer 185. The interconnect layer 188 is coupled to the internal circuit, for example. The interconnect layer 189 includes a first end provided on a lower end of the logic element layer 185, and a second end provided on a lower end of the pad 184-2. The logic element layer 185 includes the lower end having a function as an input terminal, and the upper end having a function as an output terminal. In other words, the logic element layer 185 functions as the logic circuit LGA2 that outputs signals input from the pad 164-2 to the bump 163-2.

The interconnect layer 190 includes a first end provided on an upper end of the via 182-3, and a second end provided on an upper end of the logic element layer 186. The interconnect layer 191 includes a first end provided on a lower end of the logic element layer 186, and a second end provided on a lower end of the pad 184-3. The interconnect layers 190 and 191 are not coupled to the internal circuits, and pass through the element layer 181, for example. The logic element layer 186 has the lower end having a function as an output terminal, and the upper end having a function as an input terminal. In other words, the logic element layer 186 functions as the logic circuit LGB2 that outputs signals input from the bump 163-3 to the pad 164-3.

The interconnect layer 192 includes a first end provided on ab upper end of the via 182-4, and is coupled to the internal circuit, for example. The interconnect layer 193 includes a first end provided on a lower end of the pad 184-4, and is coupled to the internal circuit, for example.

In the example of FIG. 47, the pad 184-3 is arranged at a position mirror-symmetric to the pad 124-3 shown in FIG. 38. Specifically, the pad 124-3 is arranged at a position located at a distance d15 from the right end of the semiconductor substrate 120, whereas the pad 184-3 is arranged at a position located at a distance d15 from the left end of the semiconductor substrate 180. Similarly, the other pads 184-1, 184-2, and 184-4 are arranged at positions mirror-symmetric to the pads 124-1, 124-2, and 124-4 shown in FIG. 38.

The bump 183-3 is arranged at a position mirror-symmetric to the bump 123-3 shown in FIG. 38. Specifically, the bump 123-3 is arranged at a position located at a distance d11 from the right end of the semiconductor substrate 120, whereas the bump 183-3 is arranged at a position located at a distance d11 from the right end of the semiconductor substrate 180. Similarly, the other bumps 183-1, 183-2, and 183-4 are arranged at positions mirror-symmetric to the bumps 123-1, 123-2, and 123-4 shown in FIG. 38.

Figure 48:
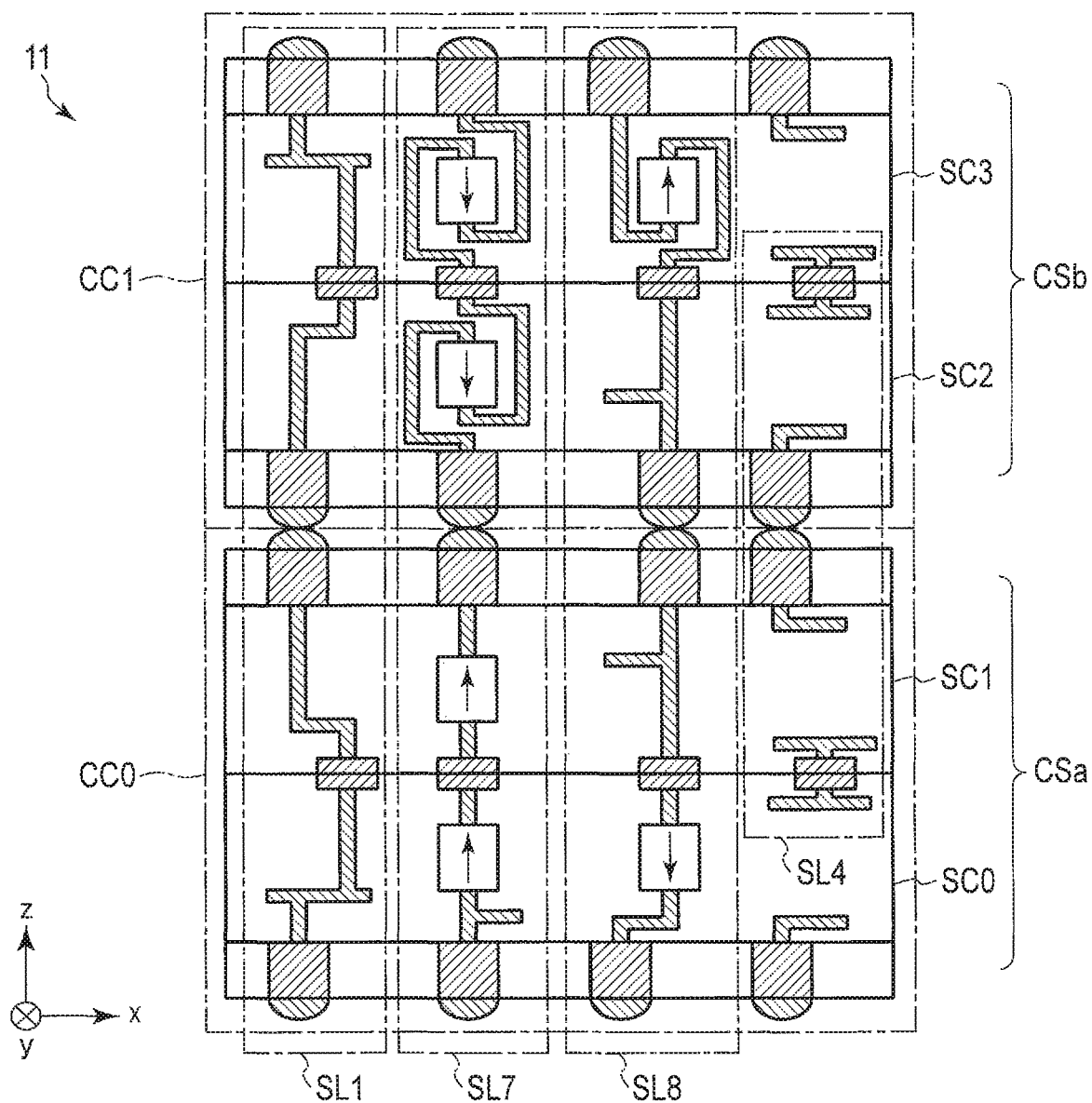
FIG. 48 is a cross-sectional view illustrating a core chip group of the semiconductor memory device according to the first modification of the fourth embodiment.

FIG. 48 is a cross-sectional view explaining the multi-layered structure of the core chip group of the semiconductor memory device according to the first modification of the fourth embodiment. As shown in FIG. 48, in the first modification of the fourth embodiment, chip set CSa, which includes sub chips SC0 and SC1, and chip set CSb, which includes sub chips SC2 and SC3, are mutually different.

Specifically, sub chips SC0 and SC1 have bumps that are not mirror-symmetrically arranged along the signal path SL8. For this reason, the positions of the bumps do not match between the lower surface of sub chip SC1 and the lower surface of sub chip SC0 along the signal path SL8.

Sub chips SC2 and SC1 have a mirror-symmetric layout pattern. For this reason, the positions of the bumps match between the lower surface of sub chip SC1 and the lower surface of sub chip SC2. However, if the same interconnect pattern is applied to sub chips SC1 and SC2, the input-output relationship between the logic element layers does not correspond between sub chips SC1 and SC2. For this reason, an interconnect pattern, in which the input-output relationship in the logic element layer in sub chip SC1 is an inversion of that of SC2, is applied to sub chip SC2. As a result, the input-output relationship of the logic element layers between sub chips SC1 and SC2 corresponds.

Sub chips SC3 and SC0 have a mirror-symmetric layout pattern. For this reason, the positions of the pads match between the upper surface of sub chip SC2 and the upper surface of sub chip SC3. However, if the same interconnect pattern as sub chip SC0 is applied to sub chip SC3, the input-output relationship between the logic element layers does not correspond to that of sub chip SC2. For this reason, an interconnect pattern in which the input-output relationship in the logic element layer in sub chip SC0 is inverted is applied to sub chip SC3. As a result, the input-output relationships of the logic element layers between sub chips SC2 and SC3 correspond.

As described above, sub chips SC3 and SC0 have a mirror-symmetric layout pattern. For this reason, the positions of the bumps match between the lower surface of sub chip SC3 and the lower surface of sub chip SC0. It is thereby possible to further stack chip set CSa on chip set CSb.

In the first modification of the fourth embodiment, it is necessary to design layout patterns for a single core chip (e.g., P8 and P9), and mirror-symmetric layout patterns thereof (e.g., P10 and P11). Furthermore, the layout patterns P10 and P11 include interconnect patterns differing from those of the layout patterns P8 and P9. However, since mirror-symmetric layout patterns do not require designing the arrangement of the peripheral circuit, etc. all over again, the design cost for such mirror-symmetric layout patterns is low. For this reason, it is possible to design an entire chip design only by adding the cost for an interconnect pattern to the design cost for a single chip design. Accordingly, even when the bumps are not symmetrically arranged between sub chips SC within a single core chip CC, a plurality of core chips CC can be stacked at a low manufacturing cost.

4.5 Second Modification of Fourth Embodiment

In the foregoing examples, two sub chips SC are included in a single core chip CC; however, the semiconductor memory device according to the fourth embodiment is not limited thereto. For example, a core chip CC can be configured with two or larger even number (4, 6 . . . ) sub chips SC.

Figure 49:
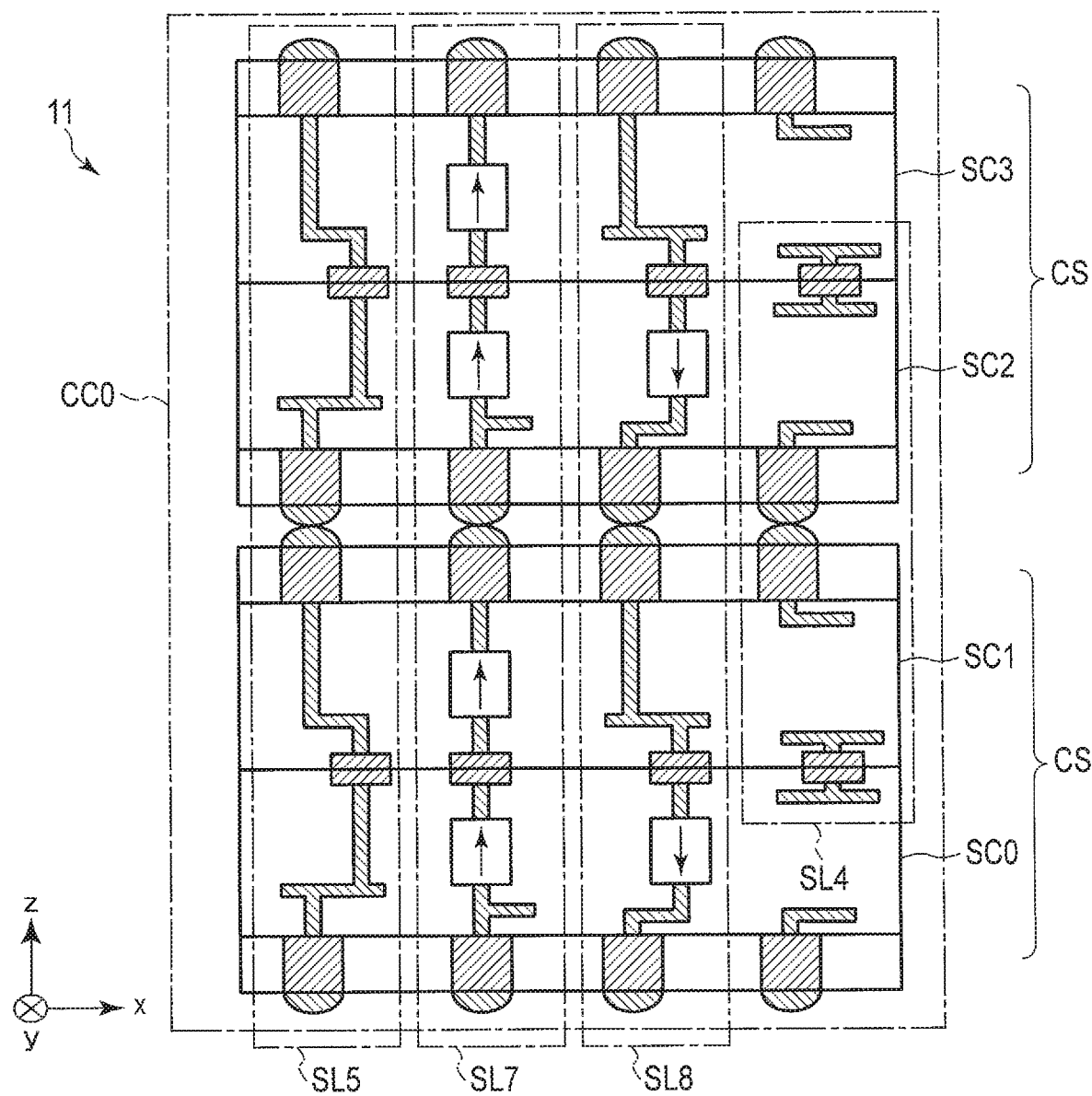
FIG. 49 is a cross-sectional view illustrating a core chip group of a semiconductor memory device according to a second modification of the fourth embodiment.

FIG. 49 is a cross-sectional view explaining the multilayered structure of the core chip group according to the second modification of the fourth embodiment. As shown in FIG. 49, core chips CC0 may include four sub chips SC0 through SC3.

With the above-described configuration, it is possible to further improve efficiency in area size compared to the case where a single core chip CC is configured with two sub chips SC. It is possible to further shorten the length of interconnect for signals that needs to be communicated within a core chip CC.

4.6 Third Modification of Fourth Embodiment

In the foregoing examples of the semiconductor memory device according to the fourth embodiment, there is a circuit that exists only in a peripheral circuit of either sub chip SC0 or SC1. Specifically, for example, the peripheral circuit of sub chip SC0 includes the voltage generation circuit 16 but not the logic control circuit 14 and the sequencer 15. In contrast, the peripheral circuit of sub chip SC1 does not include the voltage generation circuit 16 but includes the logic control circuit 14 and the sequencer 15. However, sub chips SC0 and SC1 are not limited to this example, and may be configured in such a manner that a partial circuit of the same circuit is arranged in any of the peripheral circuits. In such a case, the layout patterns of sub chips SC0 and SC1 may be designed in such a manner that the partial circuit to be provided in sub chip SC0 and the partial circuit to be provided in sub chip SC1 include a circuit region overlapping in the stacking direction.

Figure 51:
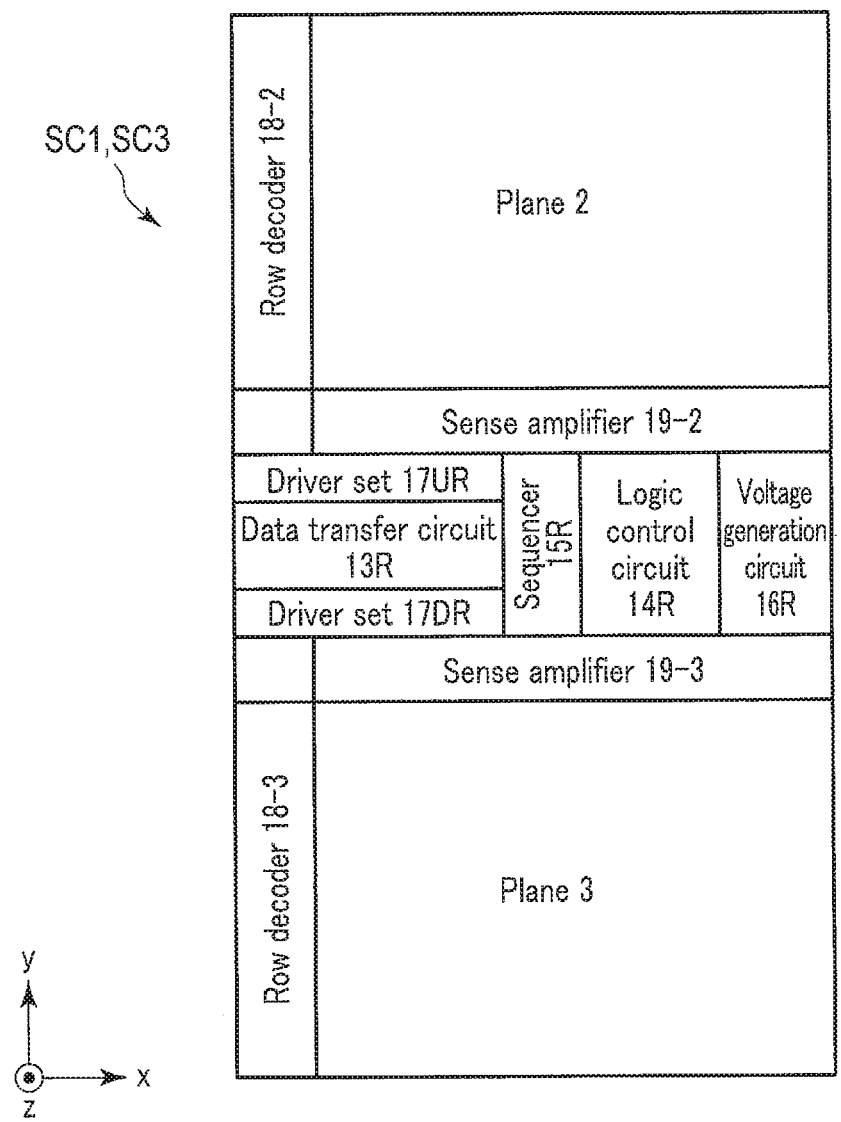
FIG. 51 is a top view illustrating a configuration of a core chip of the semiconductor memory device according to the third modification of the fourth embodiment.

FIGS. 50 and 51 are top views for explaining the layout patterns of the sub chips of the semiconductor memory device according to the third modification of the fourth embodiment. FIGS. 50 and 51 show configurations of sub chips SC0 and SC2, and sub chips SC1 and SC3, respectively.

As shown in FIG. 50, in the layout pattern of sub chips SC0 and SC2, the peripheral circuit includes the data transfer circuit 13L, the logic control circuit 14L, the sequencer 15L, the voltage generation circuit 16L, and the driver sets 17UL and 17DL. As shown in FIG. 51, in the layout pattern of sub chips SC1 and SC3, the peripheral circuit includes the data transfer circuit 13R, the logic control circuit 14R, the sequencer 15R, the voltage generation circuit 16R, and the driver sets 17UR and 17DR. For example, the data transfer circuit 13L, the logic control circuit 14L, the sequencer 15L, the voltage generation circuit 16L, and the driver sets 17UL and 17DL, and the data transfer circuit 13R, the logic control circuit 14R, the sequencer 15R, the voltage generation circuit 16R, and the driver sets 17UR and 17DR are mirror-symmetrically arranged. Regardless of whether the circuits are mirror-symmetrically arranged, circuits having the same function only need to have portions overlapping in the stacking direction when the sub chips SC are bonded with the upper surfaces opposed to each other.

With the above-described configuration, circuits having the same function are arranged in a region overlapping in the z-axis direction, when sub chips SC are bonded. Thus, when a signal is communicated between the voltage generation circuit 16L of sub chip SC0 and the voltage generation circuit 16R of sub chip SC1, it is only necessary to extend interconnect coupling therebetween in the stacking direction. For this reason, it is not necessary to provide excess interconnect within a same sub chip SC, and the design of the interconnect pattern can be thereby simplified.

When the sub chips SC are bonded, if circuits having the same function are arranged at different positions along the z-axis direction, it is necessary to provide different signal paths between sub chips (SC0, SC2) and sub chips (SC1, SC3). In such a case, a signal path for sub chips SC0 and SC2 cannot be used in sub chips SC1 and SC3; consequently, the number of terminals and the length of interconnects will increase. In the third modification of the fourth embodiment, as described above, when the sub chips SC are bonded, circuits having the same function are arranged at the same position along the z-axis direction. For this reason, it is possible to reduce the number of cases in which a signal path necessary for a circuit needs to be differentiated between sub chips (SC0, SC2) and sub chips (SC1, SC3). It is thus possible to achieve a chip design with fewer constraints, and to reduce design cost.

5. Fifth Embodiment

Next, a semiconductor memory device according to a fifth embodiment is described. In the semiconductor memory device of the fourth embodiment, a single sub chip SC is provided on a single semiconductor substrate. In contrast, in the fifth embodiment, two sub chips SC are provided on a single semiconductor substrate. The two sub chips SC partially constitute different core chips CC, respectively. In other words, a single chip set CS is configured with two core chips CC (namely four sub chips SC). Hereinafter, the same constituent elements as those in the fourth embodiment will be referred to by the same reference symbols as those used in the fourth embodiment and the descriptions of those elements will be omitted, and differences between the fourth and fifth embodiments will be described.

5.1 Configuration

The configuration of the semiconductor memory device according to the fifth embodiment is described.

5.1.1 Configuration of Core Chip Group

A configuration example of the core chip group of the semiconductor memory device according to the fifth embodiment is described with reference to FIG. 52. FIG. 52 is a block diagram showing the configuration example of the core chip group of the semiconductor memory device according to the fifth embodiment.

As shown in FIG. 52, the core chip group 11 includes twice as many core chips CC in the core chip group 11 in the fourth embodiment. Specifically, the core chip group 11 includes a plurality of core chips CC (CC0A, CC1A . . . , and CC0B, CC1B . . . ). Each core chip CC includes two sub chips SC. Specifically, core chip CC0A includes sub chips SC0A and SC1A, and sub chip CC1A includes sub chips SC2A and SC3A. Core chip CC0B includes sub chips SC0B and SC1B, and sub chip CC1B includes sub chips SC2B and SC3B. The number of core chips CC can be any natural number.

Sub chips SC0A and SC0B are provided on a semiconductor substrate SS0. Sub chips SC1A and SC1B are provided on a semiconductor substrate SS1. Sub chips SC2A and SC2B are provided on the same semiconductor substrate SS2. Sub chips SC3A and SC3B are provided on the same semiconductor substrate SS3.

5.1.2 Configuration of Sub Chips

Next, the configuration of the sub chips of the semiconductor memory device according to the fifth embodiment is described. FIG. 53 is a top view for explaining the layout pattern of the sub chips of the semiconductor memory device according to the fifth embodiment. FIG. 53 shows a set of two sub chips SC provided on the same semiconductor substrate SS. In other words, FIG. 53 shows a configuration common to a set of sub chips SC0A and SC0B, a set of sub chips SC1B and SC1A, a set of sub chips SC2A and SC2B, or a set of sub chips SC3B and SC3A.

The top view of FIG. 53 corresponds to, for example, what is obtained by combining the right end of the cross-sectional view of FIG. 37 with the left end of the cross-sectional view of FIG. 39, and is associated with symbol P13. As shown in FIG. 53, sub chips SC0A, SC1B, SC2A, and SC3B match the layout pattern P8. Sub chips SC0B, SC1A, SC2B, and SC3A match the layout pattern P9.

The cross-sectional view of the layout and interconnect patterns of the fifth embodiment corresponds to, for example, the result of combining the right end of the cross-sectional view of FIG. 38 with the left end of the cross-sectional view of FIG. 40.

5.1.3 Multi-Layered Structure of Core Chip Group

Next, the multi-layered structure of the core chip group of the semiconductor memory device according to the fifth embodiment is described with reference to FIG. 54. FIG. 54 is a cross-sectional view explaining the multi-layered structure of the core chip group of the semiconductor memory device according to the fifth embodiment.

As shown in FIG. 54, the chip sets CS of the core chip group in the fifth embodiment include the chip set CS shown in the FIG. 41 of the fourth embodiment, and an inversion thereof.

Thus, core chip CC0A that includes sub chips SC0A and SC1A, and core chip CC0B that includes sub chips SC0B and SC1B are provided in a single chip set CS. Furthermore, core chip CC1A that includes sub chips SC2A and SC3A, and core chip CC1B that includes sub chips SC2B and SC3B are provided in a single chip set CS. In the example of FIG. 54, core chips CC0A and CC1A, and core chips CC0B and CC1B share respective independent signal path groups.

5.2 Manufacturing Method

Next, a manufacturing method for the semiconductor memory device according to the fifth embodiment will be described.

5.2.1 Forming of Wafers

Of the manufacturing method for the semiconductor memory device according to the fifth embodiment, a method of forming an element layer on a wafer will be described. FIG. 55 is a schematic diagram explaining a method of forming an element layer on a wafer of the semiconductor memory device according to the fifth embodiment. In other words, FIG. 55 corresponds to step ST10 in FIG. 10.

FIG. 55 schematically shows a layout pattern, which is to be transferred to the wafers W1 and W2 with the use of the mask set MS6. Specifically, the layout pattern explained with reference to FIG. 53 is shown as symbol P13 in FIG. 55.

As described above, the sets of sub chips (SC0A and SC0B), (SC1B, SC1A), (SC2A, SC2B), and (SC3B, SC3A) include the same chip design. For this reason, as shown in FIG. 55, a chip design is uniformly aligned in the mask set MS6. The wafers W1 and W2, which are arranged side by side along the x-axis direction on the x-y plane, may be bonded in such a manner that the x-y plane is folded with respect to the y-z plane, similarly to the manner shown in FIG. 22 illustrating the second embodiment; or, if the wafers W1 and W2 are arranged side by side along the y-axis direction on the x-y plane, they may be bonded in such a manner that the x-y plane is folded with respect to the x-z plane.

Through the bonding of the wafers W1 and W2 on which the above-described mask set MS6 is transferred, a plurality of structures that may function as a chip set CS described with reference to FIG. 54 can be obtained.

5.2.2 Die Sorting

For the die sorting process in the manufacturing method for the semiconductor memory device according to the fifth embodiment, a method similar to the method in the second embodiment may be adopted. In other words, the mask of the layout pattern P13 may be defined as a repetition unit DSU for a probing position of the die sorter. It is thereby possible to perform die sorting on a wafer in which the same chip design is aligned with the use of the repetition unit DSU for a probing position of a single die sorter.

5.3 Advantageous Effects of Fifth Embodiment

According to the fifth embodiment, the element layer provided on semiconductor substrate. SS0 includes the internal circuit of sub chip SC0A and the internal circuit of sub chip SC0B. The element layer provided on semiconductor substrate SS1 includes the internal circuit of sub chip SC1A and the internal circuit of sub chip SC1B. Core chip CC0A includes sub chips SC0A and SC1B, and sub chip CC0B includes sub chips SC0B and SC1A. Sub chips SC0A and SC1B correspond to the left half of the layout pattern of a single core chip CC, and sub chips SC0B and SC1A correspond to the right half of the layout pattern of a single core chip CC. For this reason, it is possible to provide two core chips CC in a single chip set CS. It is thereby possible to double the number of the core chips CC provided in a single chip set CS, compared to the fourth embodiment.

In the fifth embodiment, similarly to the second embodiment, an element layer is formed in each of the wafers W1 and W2 by the same mask set MS6. In this mask set MS6, the same chip design is uniformly aligned. Thus, the mask set MS6 can be designed only by designing a layout pattern and an interconnect pattern of a single core chip CC. Manufacturing cost can thus be reduced.

The layout pattern according to the fifth embodiment corresponds to what is obtained by bonding the right end of the layout pattern P8 according to the fourth embodiment to the left end of the layout pattern P9. In other words, according to the layout pattern in the fifth embodiment, the bumps and the pads are symmetrically arranged with respect to the center of the semiconductor substrate. For this reason, the positions of the terminals match when the wafers W1 and W2 are bonded. It is thus possible to match the couplings between the wafers W1 and W2.

In the fifth embodiment, similarly to the fourth embodiment, logic circuits are provided in sub chips SC0A and SC0B provided on the same semiconductor substrate SS0, in accordance with different layout patterns. For this reason, in the signal path SL7 for example, a logic element layer having the input-output direction from an element layer toward a semiconductor substrate can correspond to a logic element layer having the input and output direction from said semiconductor substrate toward said element layer. Accordingly, the input-output relationships match between the logic element layer in sub chip SC0A and the logic element layer in sub chip SC1B. The input-output relationships match between the logic element layer in sub chip SC0B and the logic element layer in sub chip SC1A.

Similarly to the fourth embodiment, two sub chips SC provided on two semiconductor substrates are stacked so as to form a single core chip. For this reason, it is possible to shorten a length of interconnect required for communications within a core chip CC.

5.4 First Modification of Fifth Embodiment

The semiconductor memory device according to the fifth embodiment is not limited to the above-described example, and various modifications of the semiconductor memory device are possible.

In the fifth embodiment, the example in which the bumps of two sub chips SC provided on the same semiconductor substrate SS are symmetrically arranged is described as a case similar to the fourth embodiment; however, the fifth embodiment is not limited to this example. For example, as a case similar to the first modification of the fourth embodiment, the bumps in two sub chips SC provided on the same semiconductor substrate SS may be asymmetrically arranged.

FIG. 56 is a cross-sectional view explaining the configuration of the core chip group of the semiconductor memory device according to the first modification of the fifth embodiment. As shown in FIG. 56, in the first modification of the fifth embodiment, the chip set CSa which includes sub chips SC0A, SC0B, SC1A, and SC1B, and the chip set CSb which includes sub chips SC2A, SC2B, SC3A, and SC3B are mutually different.

Specifically, the layout pattern of sub chips SC2A and SC2B has a mirror-symmetric relationship with the layout pattern P13. For this reason, the bumps of sub chips SC2A and SC2B and the bumps of sub chips SC1A and SC1B are symmetrically arranged with respect to the surface in which sub chips SC2A and SC2B are bonded to sub chips SC1A and SC1B. The positions of the bumps thereby match between sub chips SC1A and SC1B and sub chips SC2A and SC2B.

The layout pattern of sub chips SC3A and SC3B has a mirror-symmetric relationship with the layout pattern P13. For this reason, the bumps of sub chips SC3A and SC3B and the bumps of sub chips SC0A and SC0B are symmetrically arranged with respect to the surface in which sub chips SC1A and SC1B are bonded to sub chips SC2A and SC2B. The positions of the bumps thereby match between sub chips SC3A and SC3B and sub chips SC0A and SC0B. Therefore, it is possible to further stack sub chips SC0A and SC0B on sub chips SC3A and SC3B.

As aforementioned, since chip sets CSa and CSb are mirror-symmetric, the directions of the input and output terminals of the logic circuit become opposite when the chip sets CSa and CSb are bonded. In the fifth embodiment, different interconnect patterns are applied to the layout patterns P4 and P6. Specifically, if an input terminal and an output terminal of a logic circuit are respectively coupled to a pad and a bump in one of the interconnect patterns of sub chips SC in a chip set CS, an input terminal and an output terminal of the logic circuit are respectively coupled to a bump and a pad in the other interconnect pattern of a sub chip SC in the chip set CS. For this reason, it is possible to match the input-output relationships between a logic circuit provided within sub chip SC1A and a logic circuit provided within sub chip SC2A when sub chip SC1A is bonded to sub chip SC2A. For this reason, it is possible to match the input-output relationships between a logic circuit provided within sub chip SC1B and a logic circuit provided within sub chip SC2B when sub chip SC1B is bonded sub chip SC2B. For this reason, it is possible to match the input-output relationships between a logic circuit provided within sub chip SC3A and a logic circuit provided within sub chip SC0A when sub chip SC3A is bonded sub chip SC0A. Similarly, it is possible to match the input-output relationships between a logic circuit provided within sub chip SC3B and a logic circuit provided within sub chip SC0B when sub chip SC3B is bonded to sub chip SC0B.

5.5 Second Modification of Fifth Embodiment

In the above example, the semiconductor memory device according to the fifth embodiment includes two sub chips SC in a single core chip CC. For example, a core chip CC can be configured with two or larger even number (4, 6 . . . ) sub chips SC.

Figure 57:
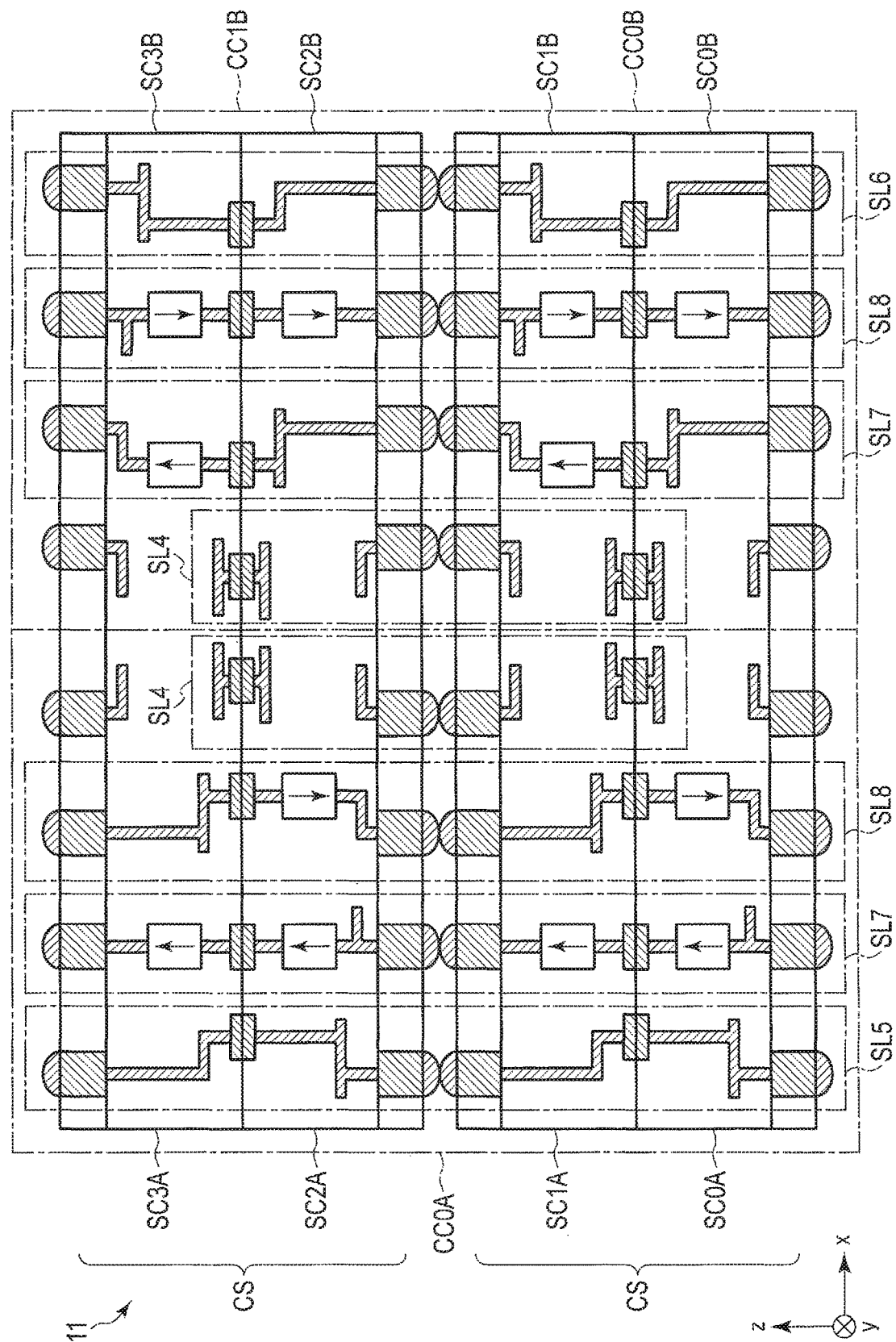
FIG. 57 is a cross-sectional view illustrating a core chip group of a semiconductor memory device according to a second modification of the fifth embodiment.

FIG. 57 is a cross-sectional view explaining the multi-layered structure of the core chip group according to the second modification of the fifth embodiment. As shown in FIG. 57, core chips CC0A and CC0B may include four sub chips SC0A through SC3A, and SC0B through SC3B, respectively.

With the above-described configuration, it is possible to further improve efficiency in area size, compared to the case where a single core chip CC is configured with two sub chips SC. It is possible to further shorten the length of interconnect for signals that need to be communicated within a core chip CC.

5.6 Third Modification of Fifth Embodiment

In the foregoing examples, two sub chips SC included in different core chips CC on a same semiconductor substrate SS are provided in an independent manner; however, the semiconductor memory device according to the fifth embodiment is not limited thereto. For example, two sub chips SC provided on a same semiconductor substrate SS may share a function of a shared circuit provided in adjacent regions.

Figure 58:
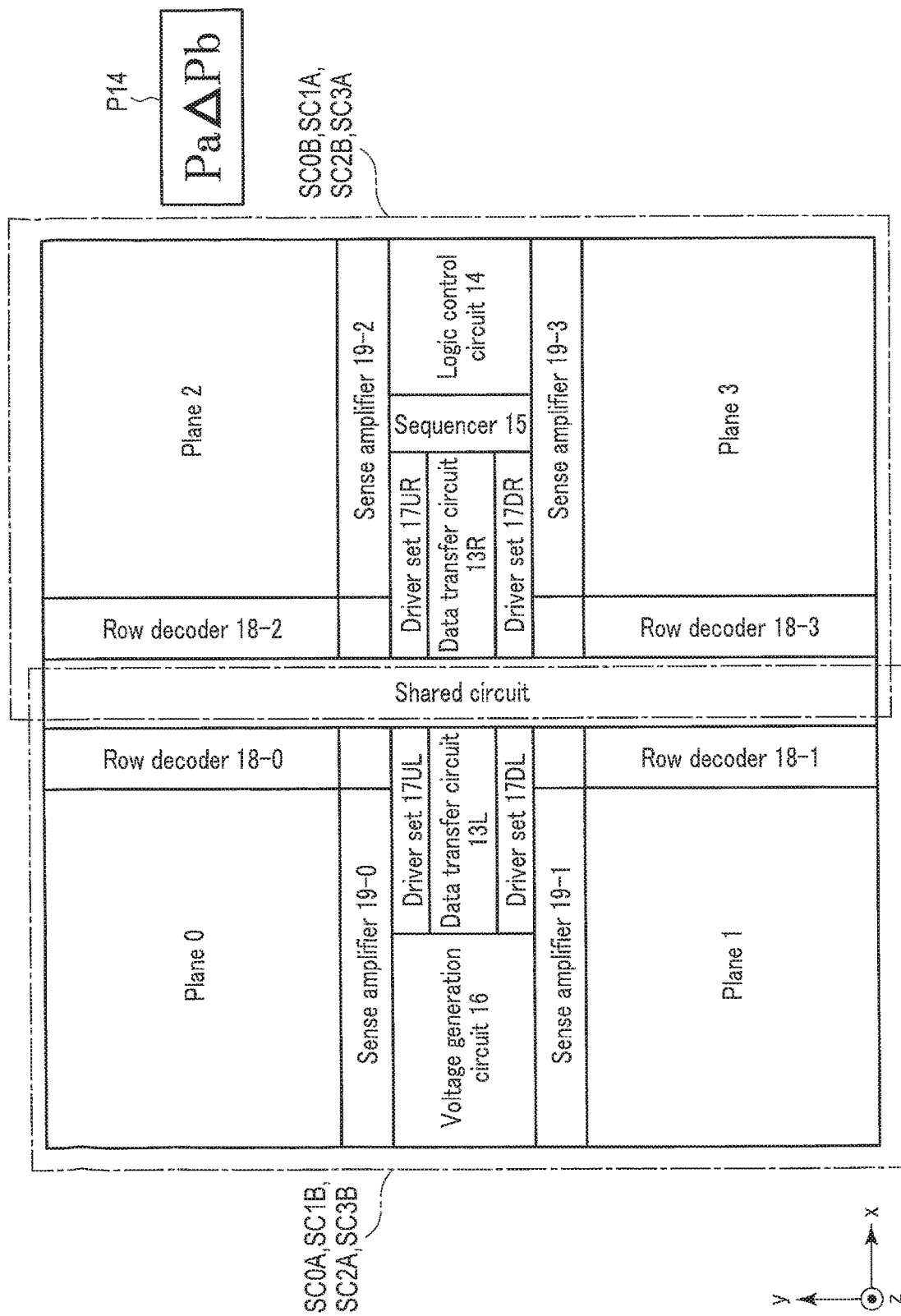
FIG. 58 is a top view illustrating a configuration of a core chip of a semiconductor memory device according to a third modification of the fifth embodiment.

FIG. 58 is a top view for explaining the layout patterns of the sub chips of the semiconductor memory device according to the third modification of the fifth embodiment. As shown in FIG. 58, sub chips SC0A and SC0B, for example, share a shared circuit provided on a counterpart sub chip SC. The shared circuit may be operated as a circuit of either sub chip SC0A or SC0B.

With the above-described configuration, the function can be shared between different core chips CC and it is possible to perform processing in a single shared circuit. It is thereby possible to further reduce the area size of the circuit.

6. Other Notes

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device, comprising:
a first substrate that includes a first via and a second via;
a first element layer provided on an upper surface of the first substrate, and that includes a first pad and a second pad on an upper surface of the first element layer;
a second substrate that includes a third via and a fourth via; and
a second element layer provided on an upper surface of the second substrate, and that includes a third pad and a fourth pad on an upper surface of the second element layer,
wherein:
the upper surface of the second element layer is arranged so as to be opposed to the upper surface of the first element layer,
the first and third pads, and the second and fourth pads are symmetrically arranged with respect to a surface where the first element layer and the second element layer are opposed to each other, and the first and third pads, and the second and fourth pads are electrically coupled,
the first element layer and the second element layer further include:
a first signal line that electrically couples the first via to the third via through the first pad and the third pad;
at least one logic circuit that is provided on a path of the first signal line; and
a second signal line that electrically couples the second via to the fourth via through the second pad and the fourth pad without involving the logic circuit, and
the first element layer includes a first logic circuit that is provided on the path of the first signal line, and includes an input terminal electrically coupled to the first via and an output terminal electrically coupled to the first pad.

2. The semiconductor memory device according to claim 1, wherein the second element layer includes a second logic circuit that is provided on a path of the first signal line, and includes an input terminal electrically coupled to the second pad and an output terminal electrically coupled to the second via.

3. The semiconductor memory device according to claim 2, wherein the first and second logic circuits are symmetrically arranged with respect to the surface where the first element layer and the second element layer are opposed to each other.

4. The semiconductor memory device according to claim 2, wherein the first and second logic circuits are asymmetrically arranged with respect to the surface where the first element layer and the second element layer are opposed to each other.

5. The semiconductor memory device according to claim 4, wherein the first element layer and the second element layer are provided in accordance with a same layout pattern.

6. The semiconductor memory device according to claim 4, wherein the first element layer and the second element layer are provided in accordance with different layout patterns.

7. The semiconductor memory device according to claim 1, wherein each of the first element layer and the second element layer are included in different core chips, respectively.

8. The semiconductor memory device according to claim 1, wherein the first element layer and the second element layer are included in a same core chip.

9. The semiconductor memory device according to claim 5, wherein:
the first element layer further includes a first peripheral circuit electrically coupled to the first signal line, and
the second element layer further includes a second peripheral circuit that corresponds to the first peripheral circuit and is electrically cut off from the second signal line.

10. The semiconductor memory device according to claim 8, wherein:
the first element layer further includes a first portion of a peripheral circuit electrically coupled to the first signal line,
the second element layer further includes a second portion of the peripheral circuit electrically coupled to the second signal line, and
the first portion of the peripheral circuit and the second portion of the peripheral circuit include a regions overlapping in a stacking direction.

11. A semiconductor memory device, comprising:
a first substrate that includes a first via and a second via;
a first element layer provided on an upper surface of the first substrate, and that includes a first pad and a second pad on an upper surface of the first element layer;
a second substrate that includes a third via and a fourth via;
a second element layer provided on an upper surface of the second substrate, and that includes a third pad and a fourth pad on an upper surface of the second element layer;
a third substrate that includes a fifth via and a sixth via; and
a third element layer provided on an upper surface of the third substrate, and that includes a fifth pad and a sixth pad on an upper surface of the third element layer,
wherein:
the upper surface of the second element layer is arranged so as to be opposed to the upper surface of the first element layer, the first and third pads, and the second and fourth pads are symmetrically arranged with respect to a surface where the first element layer and the second element layer are opposed to each other, and the first and third pads, and the second and fourth pads are electrically coupled, the first element layer and the second element layer further include:
- a first signal line that electrically couples the first via to the third via through the first pad and the third pad;
- at least one logic circuit that is provided on a path of the first signal line; and
- a second signal line that electrically couples the second via to the fourth via through the second pad and the fourth pad without involving the logic circuit, a lower surface of the third substrate is arranged so as to be opposed to a lower surface of the second substrate, the third and fifth vias, and the fourth and sixth vias are symmetrically arranged with respect to a surface where the second substrate and the third substrate are opposed to each other, and the third and fifth vias, and the fourth and sixth vias are electrically coupled, and the first signal line electrically couples the first via to the fifth pad further through the third via and the fifth via, and the second signal line electrically couples the second via to the sixth pad further through the fourth via and the sixth via without involving the logic circuit.

12. The semiconductor memory device according to claim 11, wherein the third and fifth pads, and the fourth and sixth pads are symmetrically arranged with respect to the surface where the second substrate and the third substrate are opposed to each other.

13. The semiconductor memory device according to claim 12, further comprising:
- a fourth substrate that includes a seventh via and a eighth via; and
- a fourth element layer provided on an upper surface of the fourth substrate, and that includes a seventh pad and an eighth pad on an upper surface of the fourth element layer, wherein:
the upper surface of the fourth element layer is arranged so as to be opposed to the upper surface of the third element layer, the fifth and seventh pads, and the sixth and eighth pads are symmetrically arranged with respect to a surface where the third element layer and the fourth element layer are opposed to each other, and the fifth and seventh pads, and the sixth and eighth pads are electrically coupled, the first signal line electrically couples the first via to the seventh via further through the fifth pad and the seventh pad, and the second signal line electrically couples the second via to the eighth via further through the sixth pad and the eighth pad without involving the logic circuit.

14. The semiconductor memory device according to claim 13, wherein the first and seventh pads, and the second and eighth pads are symmetrically arranged with respect to the surface where the second substrate and the third substrate are opposed to each other.

15. The semiconductor memory device according to claim 14, wherein the first and third vias, and the second and fourth vias are symmetrically arranged with respect to the surface where the first element layer and the second element layer are opposed to each other.

16. The semiconductor memory device according to claim 14, wherein the first and third vias, and the second and fourth vias are asymmetrically arranged with respect to the surface where the first element layer and the second element layer are opposed to each other.

17. The semiconductor memory device according to claim 11, wherein the first element layer, the second element layer, and the third element layer are included in a same core chip.

18. The semiconductor memory device according to claim 11, wherein the first element layer and the third element layer are provided in accordance with a same layout pattern.

19. The semiconductor memory device according to claim 11, wherein the first element layer and the third element layer are provided in accordance with different layout patterns.

20. A semiconductor memory device, comprising:
- a first substrate that includes a first via and a second via;
- a first element layer provided on an upper surface of the first substrate, and that includes a first pad and a second pad on an upper surface of the first element layer;
- a second substrate that includes a third via and a fourth via; and
- a second element layer provided on an upper surface of the second substrate, and that includes a third pad and a fourth pad on an upper surface of the second element layer, wherein:
the upper surface of the second element layer is arranged so as to be opposed to the upper surface of the first element layer, the first and third pads, and the second and fourth pads are symmetrically arranged with respect to a surface where the first element layer and the second element layer are opposed to each other, and the first and third pads, and the second and fourth pads are electrically coupled, the first substrate further includes a ninth via and a tenth via, the first element layer further includes a ninth pad arranged at a position symmetric to the first pad, and a tenth pad arranged at a position symmetric to the second pad, with respect to a center of the first element layer in the upper surface of the first element layer, the second substrate further includes an eleventh via and a twelfth via, the second element layer further includes an eleventh pad arranged at a position symmetric to the third pad, and a twelfth pad arranged at a position symmetric to the fourth pad, with respect to a center of the second element layer in the upper surface of the second element layer, the ninth and eleventh pads, and the tenth and twelfth pads are symmetrically arranged with respect to the surface where the first element layer and the second element layer are opposed to each other, and the ninth and eleventh pads, and the tenth and twelfth pads are electrically coupled, and the first element layer and the second element layer further include:
- a first signal line that electrically couples the first via to the third via through the first pad and the third pad;
- at least one logic circuit that is provided on a path of the first signal line;
- a second signal line that electrically couples the second via to the fourth via through the second pad and the fourth pad without involving the logic circuit provided on the path of the first signal line;
- a third signal line that electrically couples the ninth via to the eleventh via through the ninth pad and the eleventh pad;

at least one logic circuit that is provided on a path of the third signal line; and a fourth signal line that electrically couples the tenth via to the twelfth via through the tenth pad and the twelfth pad without involving the logic circuit provided on the path of the third signal line.

21. The semiconductor memory device according to claim 20, wherein:

the first via, the second via, the third via, the fourth via, the first pad, the second pad, the third pad, and the fourth pad are included in a first core chip, and the ninth via, the tenth via, the eleventh via, the twelfth via, the ninth pad, the tenth pad, the eleventh pad, and the twelfth pad are included in a second core chip.

22. The semiconductor memory device according to claim 20, wherein:

the first element layer further includes a shared circuit, and the shared circuit is shared between a first portion of the first element layer and a second portion of the first element layer.

* * * * *